(12) United States Patent
Fukushima et al.

(10) Patent No.: US 10,557,893 B2
(45) Date of Patent: Feb. 11, 2020

(54) MANAGEMENT DEVICE FOR SECONDARY BATTERY, AND METHOD OF MANAGING SECONDARY BATTERY

(71) Applicant: GS Yuasa International Ltd., Kyoto-shi (JP)

(72) Inventors: Atsushi Fukushima, Kyoto (JP); Kenichi Sejima, Kyoto (JP); Masashi Nakamura, Kyoto (JP); Takeyuki Shiraishi, Kyoto (JP)

(73) Assignee: GS YUASA INTERNATIONAL LTD., Kyoto-shi, Kyoto (JP)

( * ) Notice: Subject to any disclaimer, the term of this patent is extended or adjusted under 35 U.S.C. 154(b) by 0 days.

(21) Appl. No.: 15/526,982

(22) PCT Filed: Nov. 13, 2015

(86) PCT No.: PCT/JP2015/005673
§ 371 (c)(1),
(2) Date: May 15, 2017

(87) PCT Pub. No.: WO2016/079964
PCT Pub. Date: May 26, 2016

(65) Prior Publication Data
US 2017/0371000 A1   Dec. 28, 2017

(30) Foreign Application Priority Data

Nov. 19, 2014   (JP) .................................. 2014-234181

(51) Int. Cl.
| | | |
|---|---|---|
| *H02J 7/00* | (2006.01) | |
| *G01R 31/392* | (2019.01) | |
| *G01R 31/382* | (2019.01) | |
| *H01M 10/48* | (2006.01) | |

(Continued)

(52) U.S. Cl.
CPC ..... *G01R 31/392* (2019.01); *G01R 19/16542* (2013.01); *G01R 31/382* (2019.01);
(Continued)

(58) Field of Classification Search
CPC ................................................... G01R 31/3679
(Continued)

(56) References Cited

U.S. PATENT DOCUMENTS

| | | |
|---|---|---|
| 6,204,636 B1 | 3/2001 | Kinoshita et al. |
| 2008/0050644 A1* | 2/2008 | Christensen ........ H01M 6/5005 |
| | | 429/50 |

(Continued)

FOREIGN PATENT DOCUMENTS

| | | |
|---|---|---|
| JP | 2001-069608 A | 3/2001 |
| JP | 2003-061257 A | 2/2003 |

(Continued)

OTHER PUBLICATIONS

International Search Report (ISR) (PCT Form PCT/ISA/210), in PCT/JP2015/005673, dated Feb. 16, 2016.

*Primary Examiner* — Suresh Memula
(74) *Attorney, Agent, or Firm* — McGinn I. P. Law Group, PLLC

(57) ABSTRACT

A management device manages a secondary battery which includes a positive electrode having an active material with a characteristic where a potential flat portion exists in a relationship between a capacity and a potential. The management device includes a management unit which detects an occurrence of temporary degradation of the secondary battery when an SOC correlation associated value which is associated with an SOC of the secondary battery is acquired and the SOC which corresponds to the acquired SOC correlation associated value is equal to or less than a preset prescribed SOC or when a state value relating to a voltage of the secondary battery is acquired and a magnitude relationship between the acquired state value relating to the voltage of the secondary battery and a preset threshold value satisfies a predetermined condition.

20 Claims, 30 Drawing Sheets

(51) Int. Cl.
*G01R 19/165* (2006.01)
*H01M 10/42* (2006.01)

(52) U.S. Cl.
CPC ......... *H01M 10/425* (2013.01); *H01M 10/48* (2013.01); *H02J 7/0047* (2013.01); *H01M 2010/4271* (2013.01); *H02J 7/0029* (2013.01); *H02J 2007/004* (2013.01); *H02J 2007/0037* (2013.01)

(58) Field of Classification Search
USPC ........................................................ 320/134
See application file for complete search history.

(56) References Cited

U.S. PATENT DOCUMENTS

| 2010/0052617 | A1 | 3/2010 | Aridome et al. | |
|---|---|---|---|---|
| 2013/0030739 | A1* | 1/2013 | Takahashi | G01R 31/3658 702/63 |
| 2013/0099794 | A1* | 4/2013 | Takahashi | H01M 10/0525 324/427 |
| 2015/0153424 | A1* | 6/2015 | Kanada | G01R 31/3679 324/430 |

FOREIGN PATENT DOCUMENTS

| JP | 2006-304516 A | 11/2006 |
|---|---|---|
| JP | 2007-205883 A | 8/2007 |
| JP | 2008-193797 A | 8/2008 |
| JP | 2009-070800 A | 4/2009 |
| JP | 2010-060408 A | 3/2010 |
| JP | 2011-061955 A | 3/2011 |
| JP | 2011-192425 A | 9/2011 |
| JP | 2012-016109 A | 1/2012 |
| JP | 2013-106481 A | 5/2013 |
| JP | 2013-214372 A | 10/2013 |
| JP | 2013-247054 A | 12/2013 |
| JP | 2014-200124 A | 10/2014 |

* cited by examiner

Fig. 13

| Parameter | Small influence ← → Large influence | | | | |
|---|---|---|---|---|---|
| Discharge depth (SOC lowest value) | 40% | 30% | 20% | 10% | 0% |
| | 1 | 2.5 | 3.5 | | 5 |
| Temperature at deep discharge time | 25°C | 20°C | 15°C | 10°C | 5°C |
| | 1 | 2 | 3 | 4 | 5 |
| Downtime after deep discharge | 0h | | 2h | 16h | |
| | 1 | | 3 | 5 | |
| Degree of degradation with lapse of time | Large degradation with lapse of time | | Middle degradation with lapse of time | Small degradation with lapse of time | |
| | 1 | | 3 | 5 | |
| Degree of deep discharge temporary degradation | 12 | | | | |

| Maximum SOC | Degree of degradation |
|---|---|
| 0-90% | 100% |
| 91% | 90% |
| 92% | 80% |
| 93% | 70% |
| 94% | 60% |
| 95% | 50% |
| 96% | 40% |
| 97% | 30% |
| 98% | 20% |
| 99% | 10% |
| 100% | 0% |

Fig. 37

| Hold time | Lowering amount of degree of degradation |
|---|---|
| 0 minute | 0% |
| 10 minutes | −5% |
| 20 minutes | −10% |
| 30 minutes | −20% |
| 60 minutes | −30% |

MANAGEMENT DEVICE FOR SECONDARY BATTERY, AND METHOD OF MANAGING SECONDARY BATTERY

TECHNICAL FIELD

A technique disclosed in this specification relates to a management device for a secondary battery and a method for managing a secondary battery.

BACKGROUND ART

In recent years, a secondary battery such as a lithium ion battery, for example, has been used in various applications. Performances of a secondary battery are permanently lowered due to degradation of an active material contained in an electrode of the secondary battery, for example. It has been also known that when an operation of discharging a lithium ion battery at a high output value for a predetermined time or an operation of charging a lithium ion battery at a high input value for a predetermined time is repeatedly performed, there arises a phenomenon called high rate degradation where a voltage of a secondary battery is temporarily dropped (an internal resistance is temporarily increased) (see Patent Document 1, for example).

PRIOR ART DOCUMENT

Patent Document

Patent Document 1: JP-A-2010-60408

SUMMARY OF THE INVENTION

Problems to be Solved by the Invention

However, temporary lowering of performances of a secondary battery, which differs from the above-mentioned high rate degradation, has not been known conventionally. Thus, there is a concern that performances of the secondary battery are not accurately grasped.

It is an object of the present invention to provide a technique which can overcome at least some of the above-mentioned drawbacks.

Means for Solving the Problems

To overcome the above-mentioned drawbacks, according to an aspect of the present invention, there is provided a management device for a secondary battery which includes an electrode having an active material with a characteristic where a potential flat portion exists in a relationship between a capacity and a potential, wherein the management device includes a management unit which detects an occurrence of temporary degradation of the secondary battery when an SOC associated value which is associated with an SOC of the secondary battery is acquired and the SOC which corresponds to the acquired SOC associated value is equal to or less than a preset prescribed SOC or when a state value relating to a voltage of the secondary battery is acquired and a magnitude relationship between the acquired state value relating to the voltage of the secondary battery and a preset threshold value satisfies a predetermined condition.

The technique disclosed in this specification can be realized in various modes, for example, a management device or method for a secondary battery, a control device or method for a secondary battery, an energy storage apparatus which includes these devices and a secondary battery, a computer program or an integrated circuit for realizing functions of these devices or methods, a non-temporary recording medium such as a CD-ROM in which the computer program is recorded, a transmission medium such as an internet and the like.

BRIEF DESCRIPTION OF THE DRAWINGS

FIG. 13 is an explanatory view showing one example of a method for determining a degree of the deep discharge temporary degradation.

FIG. 37 is a second table showing a correspondence relationship between a hold time of the secondary battery and a reduction amount of the degree of degradation.

MODE FOR CARRYING OUT THE INVENTION

APPLICATION EXAMPLE 1

Figure 1:
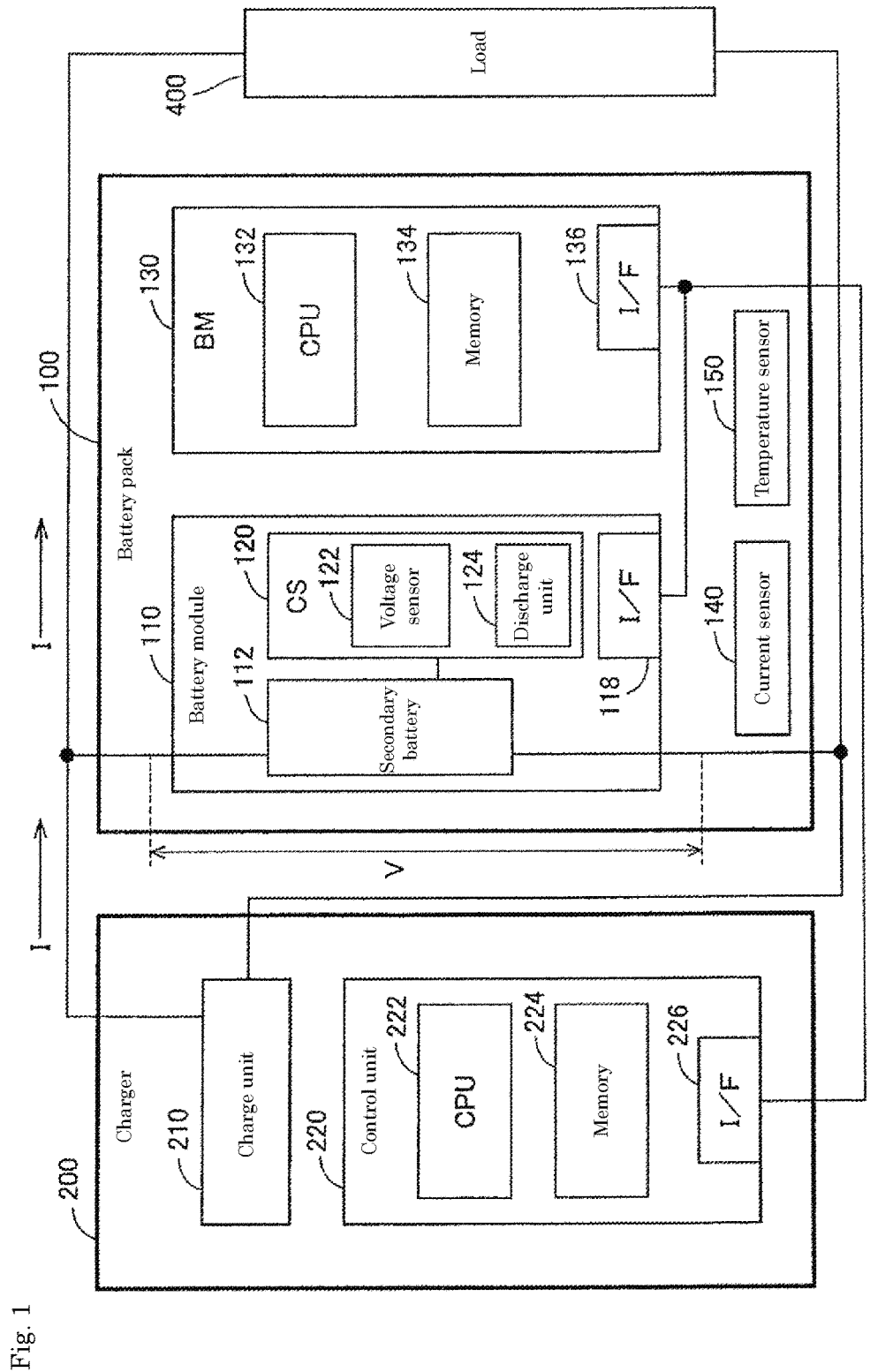
FIG. 1 is an explanatory view showing a configuration of a battery pack.

A management device for a secondary battery disclosed in this specification is a management device for a secondary battery which includes an electrode having an active material with a characteristic where a potential flat portion exists in a relationship between a capacity and a potential, wherein the management device includes a management unit which detects an occurrence of temporary degradation of the secondary battery when an SOC associated value which is associated with an SOC of the secondary battery is acquired and the SOC which corresponds to the acquired SOC associated value is equal to or less than a preset prescribed SOC or when a state value relating to a voltage of the secondary battery is acquired and a magnitude relationship between the acquired state value relating to the voltage of the secondary battery and a preset threshold value satisfies a predetermined condition. Inventors of the present invention have newly found that when a secondary battery which includes an electrode having an active material with a characteristic where a potential flat portion exists in a relationship between a capacity (residual capacity) and a potential is discharged until an SOC is brought into a relatively low state, degradation is temporarily generated. The inventors of the present invention also have newly found that a state value relating to a voltage of a secondary battery such as a voltage value of the secondary battery, for example, changes corresponding to a degree of the above-mentioned temporary degradation. According to the management device for a secondary battery of the present invention, the occurrence of the temporary degradation of the secondary battery is detected when an SOC associated value which is associated with an SOC of the secondary battery is acquired and the SOC which corresponds to the acquired SOC associated value is equal to or less than a preset prescribed SOC or when a state value relating to a voltage of the secondary battery is acquired and a magnitude relationship between the acquired state value relating to the voltage of the secondary battery and a threshold value satisfies a predetermined condition. Accordingly, it is possible to accurately grasp performances of the secondary battery.

APPLICATION EXAMPLE 2

In the management device for a secondary battery according to the above-mentioned application example 1, the management unit may be configured to determine such that after the SOC associated value which corresponds to the SOC equal to or less than the prescribed SOC is acquired, during a period where the secondary battery does not go through a state which is set in advance as a state in which the secondary battery eliminates the temporary degradation, even when the SOC associated value which corresponds to the SOC larger than the prescribed SOC is acquired, the management unit determines that the temporary degradation of the secondary battery occurs. According to this management device for a secondary battery, after the SOC associated value which corresponds to the SOC equal to or less than the prescribed SOC is acquired, during a period where the secondary battery does not go through a state which is set in advance as a state in which the secondary battery eliminates the temporary degradation, the management unit determines that the temporary degradation of the secondary battery occurs and hence, the management unit can accurately grasp performances of the secondary battery.

APPLICATION EXAMPLE 3

In the management device for a secondary battery according to the above-mentioned application example 1 or application example 2, the management unit may be configured to determine such that the lower the SOC which corresponds to the acquired SOC associated value, the larger the degree of the temporary degradation becomes. The inventors of the present invention have newly found that the smaller the SOC, the larger the degree of the temporary degradation becomes. According to this management device for a secondary battery, it is determined that the smaller the SOC which corresponds to the acquired SOC associated value, the larger the degree of the temporary degradation of the secondary battery becomes and hence, it is possible to grasp performances of the secondary battery more accurately.

APPLICATION EXAMPLE 4

In the management device for a secondary battery according to any one of the above-mentioned application example 1 to application example 3, the management unit may be configured to determine such that the lower a temperature at which the secondary battery is discharged until the SOC becomes the prescribed SOC or less, the larger the degree of the temporary degradation becomes. The inventors of the present invention have newly found that the lower a temperature at which the secondary battery is discharged until the SOC becomes the prescribed SOC or less, the larger the degree of the temporary degradation becomes. According to this management device for a secondary battery, it is determined that the lower a temperature at which the secondary battery is discharged until the SOC becomes the prescribed SOC or less, the larger the degree of the temporary degradation of the secondary battery becomes and hence, it is possible to grasp performances of the secondary battery more accurately.

APPLICATION EXAMPLE 5

In the management device for a secondary battery according to any one of the above-mentioned application example 1 to application example 4, the management unit may be configured to determine such that the longer the downtime after the secondary battery is discharged until the SOC becomes the prescribed SOC or less, the larger the degree of the temporary degradation becomes. The inventors of the present invention have newly found that the longer the downtime after the secondary battery is discharged until the SOC becomes the prescribed SOC or less, the larger the degree of the temporary degradation becomes. According to this management device for a secondary battery, it is determined that the longer the downtime after the secondary battery is discharged until the SOC becomes the prescribed SOC or less, the larger the degree of the temporary degradation of the secondary battery becomes and hence, it is possible to grasp performances of the secondary battery more accurately.

APPLICATION EXAMPLE 6

In the management device for a secondary battery according to any one of the above-mentioned application example 1 to application example 5, the management unit may be configured to determine such that the smaller the degree of degradation of the secondary battery with a lapse of time, the larger the degree of the temporary degradation becomes. The inventors of the present invention have newly found that the smaller the degree of degradation of the secondary battery with a lapse of time, the larger the degree of the temporary degradation becomes. According to this management device for a secondary battery, it is determined that the smaller the degree of degradation of the secondary battery with a lapse of time, the larger the degree of temporary degradation of the secondary battery becomes and hence, it is possible to grasp performances of the secondary battery more accurately.

APPLICATION EXAMPLE 7

In the management device for a secondary battery according to any one of the above-mentioned application example 1 to application example 6, the SOC associated value may be at least one of the SOC, a voltage of the secondary battery and a voltage drop amount per unit time of the secondary battery. According to the management device for a secondary battery, the occurrence of temporary degradation of the secondary battery can be detected by looking up the SOC associated value.

APPLICATION EXAMPLE 8

In the management device for a secondary battery according to the above-mentioned application example 1, the state value relating to a voltage of the secondary battery may be a discharge voltage associated value associated with a voltage value of the secondary battery when the secondary battery performs a constant current discharge, the threshold value may be a first voltage threshold value, and the management unit may detect the occurrence of the temporary degradation when the voltage value which corresponds to the acquired discharge voltage associated value is equal to or more than the first voltage threshold value. The inventors of the present invention have newly found that the larger the degree of temporary degradation, the larger the voltage value of the secondary battery when the secondary battery performs a constant current discharge becomes. According to the management device for a secondary battery, the occurrence of the temporary degradation of the secondary battery is detected when the voltage value which corresponds to the acquired discharge voltage associated value is equal to or more than the first voltage threshold value and hence, performances of the secondary battery can be accurately grasped without detecting whether or not an SOC of the secondary battery becomes a prescribed SOC or less.

APPLICATION EXAMPLE 9

In the management device for a secondary battery according to the above-mentioned application example 8, the management unit may be configured to determine such that the larger the voltage value which corresponds to the discharge voltage associated value, the larger the degree of temporary degradation becomes. According to this management device for a secondary battery, it is determined that the larger the voltage value which corresponds to the acquired discharge voltage associated value, the larger the degree of temporary degradation of the secondary battery becomes and hence, performances of the secondary battery can be grasped more accurately.

APPLICATION EXAMPLE 10

In the management device for a secondary battery according to the above-mentioned application example 1, the state value relating to a voltage of the secondary battery may be an OCV associated value relating to an OCV value of the secondary battery, the threshold value may be a second voltage threshold value, and the management unit may detect the occurrence of the temporary degradation when the OCV value which corresponds to the acquired OCV associated value is equal to or more than the second voltage threshold value. The inventors of the present invention have newly found that the larger the degree of temporary degradation, the larger the OCV value of the secondary battery becomes. According to the management device for a secondary battery, the occurrence of the temporary degradation of the secondary battery is detected when the OCV value which corresponds to the acquired OCV associated value is equal to or more than the second voltage threshold value and hence, performances of the secondary battery can be accurately grasped without detecting whether or not an SOC of the secondary battery becomes a prescribed SOC or less.

APPLICATION EXAMPLE 11

In the management device for a secondary battery according to the above-mentioned application example 10, the management unit may be configured to determine such that the larger the OCV value which corresponds to the OCV associated value, the larger the degree of temporary degradation becomes. According to this management device for a secondary battery, it is determined that the larger the OCV value which corresponds to the acquired OCV associated value, the larger the degree of temporary degradation of the secondary battery becomes and hence, performances of the secondary battery can be grasped more accurately.

APPLICATION EXAMPLE 12

In the management device for a secondary battery according to the above-mentioned application example 1, the state value relating to the voltage of the secondary battery may be a ratio associated value associated with a ratio of a change amount of the voltage of the secondary battery to a change amount of the SOC or the capacity when the voltage of the secondary battery reaches a prescribed voltage, the threshold value may be a ratio threshold value, and the management unit may detect the occurrence of the temporary degradation using the ratio which corresponds to the acquired ratio associated value or a magnitude relationship between an inverse number of the ratio and the ratio threshold value. The inventors of the present invention have newly found that the larger the degree of temporary degradation, the smaller a ratio of a change amount of the voltage of the secondary battery to a change amount of the SOC or the capacity when the voltage of the secondary battery reaches the prescribed voltage becomes or the larger an inverse number of the ratio becomes. According to this management device for a secondary battery, the occurrence of the temporary degradation of the secondary battery is detected based on a magnitude relationship between a ratio which corresponds to an acquired ratio associated value and a preset ratio threshold value and hence, performances of the secondary battery can be accurately grasped without detecting whether or not the SOC of the secondary battery becomes equal to or less than the prescribed SOC.

APPLICATION EXAMPLE 13

In the management device for a secondary battery according to the above-mentioned application example 12, the management unit may be configured to determine such that the smaller the ratio which corresponds to the ratio associated value of the secondary battery or the larger the inverse number of the ratio, the larger the degree of temporary degradation becomes. According to this management device for a secondary battery, it is determined that the smaller the ratio which corresponds to the acquired ratio associated value of the secondary battery or the larger the inverse number of the ratio, the larger the degree of temporary degradation of the secondary battery becomes and hence, performances of the secondary battery can be grasped more accurately.

APPLICATION EXAMPLE 14

In the management device for a secondary battery according to any one of the above-mentioned application example 1 to application example 13, the management unit may be configured to, when the management unit detects the occurrence of the temporary degradation, control the secondary battery by a degradation-time control method which differs from a reference control method used when the occurrence of the temporary degradation is not detected. According to this management device for a secondary battery, the method for controlling a secondary battery differs between the case where the occurrence of the temporary degradation is detected and the case where the occurrence of the temporary degradation is not detected and hence, the secondary battery can be controlled in response to temporary lowering of performances of the secondary battery caused by temporary degradation of the secondary battery.

APPLICATION EXAMPLE 15

In the management device for a secondary battery according to the above-mentioned application example 14, the management unit may include a memory unit which stores first correspondence information which indicates a correspondence relationship between the SOC of the secondary battery and the state value of the secondary battery in a state where the temporary degradation is not generated, and second correspondence information which indicates the correspondence relationship in a state where the temporary degradation occurs, and the management unit may be configured to control the secondary battery by looking up the first correspondence information in the reference control method, and controls the secondary battery by looking up the second correspondence information in the degradation-time control method. According to this management device for a secondary battery, the secondary battery is controlled by looking up different correspondence information between the case where the occurrence of the above-mentioned temporary degradation is detected and the case where the occurrence of the above-mentioned temporary degradation is not detected and hence, the secondary battery can be controlled in response to temporary lowering of performances of the secondary battery caused by temporary degradation of the secondary battery.

APPLICATION EXAMPLE 16

In the management device for a secondary battery according to the above-mentioned application example 15, the state value of the secondary battery may be a voltage value of the secondary battery, and the SOC of the secondary battery which corresponds to at least a prescribed voltage value range of the second correspondence information may be smaller than the SOC of the secondary battery which corresponds to the prescribed voltage value range of the first correspondence information. According to the management device for a secondary battery, the SOC of the secondary battery prescribed in the case where the occurrence of the above-mentioned temporary degradation is detected is made small compared to the SOC of the secondary battery in the case where the occurrence of the above-mentioned temporary degradation is not detected. Accordingly, the secondary battery can be controlled in response to temporary lowering of performances of the secondary battery caused by temporary degradation of the secondary battery.

APPLICATION EXAMPLE 17

In the management device for a secondary battery according to the above-mentioned application example 16, the voltage value of the secondary battery may be a voltage value when the secondary battery is discharged. The inventors of the present invention have newly found that in the above-mentioned temporary degradation, at the time of discharge, the SOC of the secondary battery which corresponds to the prescribed voltage value range when the degradation occurs is small compared to the SOC when the degradation does not occur and hence, this temporary degradation differs from other degradations (for example, the degradation with a lapse of time, the high rate degradation and the like) where the SOC when degradation occurs is large compared to the SOC when the degradation does not occur. According to this management device for a secondary battery, at the time of discharge, the SOC of the secondary battery when the occurrence of the temporary degradation is detected becomes small compared to the SOC when the occurrence of temporary degradation is not detected and hence, the secondary battery can be controlled by differentiating the temporary degradation from other degradations.

APPLICATION EXAMPLE 18

In the management device for a secondary battery according to the above-mentioned application example 16, the voltage value of the secondary battery may be an OCV value of the secondary battery. The inventors of the present invention have newly found that in the above-mentioned temporary degradation, the OCV value when the degradation occurs is small compared to the OCV value when the degradation does not occur and hence, this temporary degradation differs from other degradations where the OCV value when the degradation occurs is large compared to the OCV value when the degradation does not occur. According to this management device for a secondary battery, the OCV value when the occurrence of the temporary degradation is detected is made small compared to the OCV value when the occurrence of the temporary degradation is not detected and hence, the secondary battery can be controlled by differentiating the temporary degradation from other degradations.

APPLICATION EXAMPLE 19

In the management device for a secondary battery according to the above-mentioned application example 15, the state value of the secondary battery may be a current value when the secondary battery is charged by constant voltage charge, and the SOC of the secondary battery which corresponds to at least a prescribed current value range of the second correspondence information may be small compared to the SOC of the secondary battery which corresponds to the current value range of the first correspondence information. According to this management device for a secondary battery, at the time of performing constant voltage charge, the SOC of the secondary battery when the occurrence of the temporary degradation is detected is made small compared to the SOC when the occurrence of the temporary degradation is not detected and hence, the secondary battery can be controlled in response to temporary lowering of performances of the secondary battery caused by temporary degradation of the secondary battery.

APPLICATION EXAMPLE 20

In the management device for a secondary battery according to the above-mentioned application example 15, the state value of the secondary battery may be a chargeable electric energy value of the secondary battery, and the chargeable electric energy value of the secondary battery which corresponds to at least a prescribed SOC range of the second correspondence information may be small compared to the chargeable electric energy value of the secondary battery which corresponds to the prescribed SOC range of the first correspondence information. According to this management device for a secondary battery, the chargeable electric energy value of the secondary battery when the occurrence of the temporary degradation is detected is made small compared to the chargeable electric energy value when the occurrence of the temporary degradation is not detected and hence, the secondary battery can be controlled in response to temporary lowering of performances of the secondary battery caused by temporary degradation of the secondary battery.

APPLICATION EXAMPLE 21

In the management device for a secondary battery according to the above-mentioned application example 15, the state value of the secondary battery may be a dischargeable electric energy value of the secondary battery, and the dischargeable electric energy value of the secondary battery which corresponds to at least a prescribed SOC range of the second correspondence information may be large compared to the dischargeable electric energy value of the secondary battery which corresponds to the prescribed SOC range of the first correspondence information. According to this management device for a secondary battery, the dischargeable electric energy value of the secondary battery when the occurrence of the temporary degradation is detected is made large compared to the dischargeable electric energy value when the occurrence of the temporary degradation is not detected and hence, the secondary battery can be controlled in response to temporary lowering of performances of the secondary battery caused by temporary degradation of the secondary battery.

APPLICATION EXAMPLE 22

In the management device for a secondary battery according to any one of the above-mentioned application example 15 to application example 21, the memory unit may store a plurality of the first correspondence information and a plurality of the second correspondence information which respectively correspond to degrees of a plurality of degradations of the secondary battery with a lapse of time, and the difference in SOC which corresponds to the prescribed state value range between the first correspondence information and the second correspondence information which correspond to the degree of the same degradation with lapse of time may be decreased as the degree of the degradation with lapse of time is increased. The inventors of the present invention have newly found that the larger the degree of degradation of the secondary battery with a lapse of time, the smaller the temporary lowering of performances of the secondary battery caused by the temporary degradation becomes. According to this management device for a secondary battery, it is set such that the larger the degree of degradation of the secondary battery with the lapse of time, the smaller the difference in SOC between the first correspondence information and the second correspondence information becomes and hence, the secondary battery can be controlled by taking into account influence exerted by the degradation of the secondary battery with a lapse of time.

APPLICATION EXAMPLE 23

In the management device for a secondary battery according to any one of the above-mentioned application example 14 to application example 22, the control unit may determine the degree of the temporary degradation when the occurrence of the temporary degradation is detected, may control the secondary battery by the first degradation-time control method when the degree of the temporary degradation is at a first degree, and may control the secondary battery by the second degradation-time control method which differs from the first degradation-time control method when the degree of the temporary degradation is a second degree which differs from the first degree. According to the management device for a secondary battery, the degradation-time control method for controlling the secondary battery differs depending on the degree of the temporary degradation and hence, the secondary battery can be controlled in response to the degree of the temporary degradation.

APPLICATION EXAMPLE 24

In the management device for a secondary battery according to any one of the above-mentioned application example 14 to application example 23, the secondary battery may include a plurality of cells connected in series, the management device for a secondary battery may further include a discharge unit which individually discharges the respective cells, the management unit may detect the occurrence of the temporary degradation for the respective cells, may detect the occurrence of the temporary degradation of the secondary battery when the occurrence of the temporary degradation in at least one cell is detected, the management unit may perform equalization processing for equalizing capacities of the plurality of cells by individually discharging the respective cells by the discharge unit, and an equalization unit for the equalization processing may be switched between the reference control method and the degradation-time control method. According to this management device for a secondary battery, the equalization unit such as at least some cells which are subjected to discharge, for example, or parameters or the like which are used for deciding whether or not the respective cells are to be discharged is switched between the case where the occurrence of the temporary degradation is detected and the case where the occurrence of the temporary degradation is not detected and hence, the enlargement of the difference in capacity between the cells can be suppressed.

APPLICATION EXAMPLE 25

In the management device for a secondary battery according to the above-mentioned application example 24, the management unit may perform the equalization processing which discharges the cell which satisfies an individual discharge performing condition by the discharge unit when at least one cell satisfies the individual discharge performing condition in the reference control method, and may not perform the equalization processing even when at least one cell satisfies the individual discharge performing condition in the degradation-time control method. According to the management device for a secondary battery, when the occurrence of the temporary degradation is detected in at least one cell, none of cells including the cell where the temporary degradation occurs is discharged and hence, it is possible to suppress the enlargement of the difference in capacity between the cell where the temporary degradation occurs and the cell where the temporary degradation does not occur.

APPLICATION EXAMPLE 26

In the management device for a secondary battery according to the above-mentioned application example 24, in the reference control method, the management unit may perform the equalization processing which discharges the cell which satisfies an individual discharge performing condition by the discharge unit when at least one cell satisfies the individual discharge performing condition. In the degradation-time control method, the management unit may specify the cell where the temporary degradation occurs and may perform the equalization processing such that the cell in which the temporary degradation occurs is specified, and when at least one cell satisfies the individual discharge performing condition, at least one cell specified as the cell where the temporary degradation does not occur is discharged by the discharge unit thus equalizing capacities of the cells and the cell which is specified as the cell where the temporary degradation occurs is not discharged. According to the management device for a secondary battery, when the occurrence of the temporary degradation is detected in at least one cell, the cell where the temporary degradation occurs is not discharged and hence, it is possible to suppress the enlargement of the difference in capacity between the cell where the temporary degradation occurs and the cell where the temporary degradation does not occur. Further, the equalization processing is performed with respect to the cell where the temporary degradation does not occur and hence, a capacity between the cells where the temporary degradation does not occur can be equalized.

APPLICATION EXAMPLE 27

In the management device for a secondary battery according to any one of the above-mentioned application example 1 to application example 26, when the management unit detects the occurrence of the temporary degradation, the management unit outputs an instruction to the charging device such that the secondary battery is charged at a second charge rate which is lower than a first charge rate which is a charge rate of the secondary battery when the occurrence of the temporary degradation is not detected. According to this management device for a secondary battery, when the occurrence of the temporary degradation is detected, the secondary battery is charged at the second charge rate which is lower than the first charge rate when the occurrence of the temporary degradation is not detected and hence, the progress of temporary lowering of performances of the secondary battery caused by the temporary degradation can be suppressed.

APPLICATION EXAMPLE 28

In the management device for a secondary battery according to the above-mentioned application example 27, assuming a charge rate at which the secondary battery can be charged within one hour as the 1C charge rate, the second charge rate may be set to a 1.5C charge rate or less. According to this management device for a secondary battery, the second charge rate is set to the 1.5C charge rate or less and hence, the progress of temporary lowering of performances of the secondary battery caused by temporary degradation of the secondary battery can be suppressed compared to the case where the second charge rate is more than the 1.5C charge rate.

APPLICATION EXAMPLE 29

In the management device for a secondary battery according to the above-mentioned application example 28, the second charge rate may be set to a 0.5C charge rate or less. According to this management device for a secondary battery, the second charge rate is set to the 0.5C charge rate or less and hence, the progress of temporary lowering of performances of the secondary battery caused by temporary degradation of the secondary battery can be suppressed compared to the case where the second charge rate is more than the 0.5C charge rate.

APPLICATION EXAMPLE 30

In the management device for a secondary battery according to the above-mentioned application example 27, the second charge rate may be set to one fifth or less of the first charge rate. According to this management device for a secondary battery, the second charge rate is set to one fifth or less of the first charge rate and hence, the progress of temporary lowering of performances of the secondary battery caused by temporary degradation of the secondary battery can be suppressed compared to the case where the second charge rate is set more than one fifth of the first charge rate.

APPLICATION EXAMPLE 31

In the management device for a secondary battery according to any one of the above-mentioned application example 1 to application example 30, the management unit may be configured to, when the management unit detects the occurrence of the temporary degradation, output an instruction to a charging device such that the charging device charges the secondary battery until an SOC of the secondary battery becomes an elimination SOC which is more than the prescribed SOC or a voltage of the secondary battery becomes an elimination voltage which is more than a prescribed voltage. According to this management device for a secondary battery, when the management unit detects the occurrence of the temporary degradation, the secondary battery is charged until the SOC of the secondary battery becomes the elimination SOC or the voltage of the secondary battery becomes the elimination voltage which is more than the prescribed voltage and hence, it is possible to eliminate the temporary lowering of performances of the secondary battery caused by the temporary degradation of the secondary battery.

APPLICATION EXAMPLE 32

In the management device for a secondary battery according to the application example 31, the elimination SOC may be set to 91% or more. According to this management device for a secondary battery, the secondary battery where the temporary degradation occurs can be charged until the value of the SOC becomes 91% or more and hence, it is possible to eliminate the temporary lowering of performances of the secondary battery caused by the temporary degradation of the secondary battery.

APPLICATION EXAMPLE 33

In the management device for a secondary battery according to the application example 32, the elimination SOC may be set to 100%. According to this management device for a secondary battery, the secondary battery where the temporary degradation occurs can be fully charged and hence, it is possible to eliminate the temporary lowering of performances of the secondary battery caused by the temporary degradation of the secondary battery.

APPLICATION EXAMPLE 34

In the management device for a secondary battery according to the above-mentioned application example 32, the management unit may be configured to control the secondary battery based on a degradation degree which indicates a degree of the temporary degradation and expresses a state where the occurrence of the temporary degradation is detected as 100% and a state where the temporary degradation is eliminated as 0%, to acquire a maximum SOC which is a maximum value that the secondary battery reaches when the secondary battery is charged until the SOC of the secondary battery becomes the elimination SOC or more, and to set the degradation degree such that the larger the maximum SOC, the lower a value of the degradation degree becomes. According to this management device for a secondary battery, the larger the maximum SOC of the secondary battery, the lower the degradation degree becomes so that it is possible to detect that the temporary degradation is eliminated whereby the secondary battery can be controlled.

APPLICATION EXAMPLE 35

In the management device for a secondary battery according to the above-mentioned application example 34, the management unit may be configured to acquire a hold time during which the secondary battery is held at the maximum SOC, and to set the degradation degree such that the longer the hold time, the lower a value of the degradation degree becomes. According to this management device for a secondary battery, the longer the hold time, the lower the degradation degree becomes so that it is possible to detect that the temporary degradation is eliminated whereby the secondary battery can be controlled.

APPLICATION EXAMPLE 36

In the management device for a secondary battery according to any one of the above-mentioned application example 1 to application example 35, the active material of the positive electrode of the secondary battery may be iron phosphate lithium. Iron phosphate lithium which is used as the active material has a characteristic that a potential flat portion exists in a relationship between capacity and potential. According to this management device for a secondary battery, it is possible to detect the occurrence of temporary degradation of the secondary battery which includes the positive electrode having the active material with such a characteristic and hence, performances of the secondary battery can be properly grasped.

Hereinafter, management devices for a secondary battery according to embodiments of the present invention are described with reference to drawings. All embodiments described hereinafter are preferred specific examples of the present invention. However, numerical values, shapes, materials, constitutional elements, arrangement positions and connections modes of the constitutional elements, steps in methods, the order of steps and the like are only examples and are not intended to be used for limiting the present invention. Among the constitutional elements in the embodiments described hereinafter, the constitutional elements which are not described in independent claims which describe uppermost concepts are described as arbitrary constitutional elements. The respective views in the attached drawings are schematic views and are not necessarily strictly described in an actual scale. Further, in the description of the embodiments made hereinafter, there may be a case where the expression which is affixed with "substantially" such as "substantially equal" is used. In this case, "substantially equal" means not only "completely equal" but also "substantially equal". That is, "substantially" includes the difference of several %, for example. The same goes for other expressions which are affixed with "substantially".

A. First Embodiment:

A-1. Configuration of Battery Pack:

FIG. 1 is an explanatory view schematically showing the configuration of a battery pack 100 according to the first embodiment. The battery pack 100 is mounted on an electric vehicle (EV), for example, and supplies electricity to a load 400 of a motor which drives the EV or the like. The battery pack 100 is charged by a charger 200 installed in a charge stand, for example. The battery pack 100 is one example of an energy storage apparatus.

The battery pack 100 includes: a battery module 110; a battery manager (hereinafter referred to as "BM") 130 which manages the battery module 110; a current sensor 140; and a temperature sensor 150. The BM 130 is one example of a management device for a secondary battery.

Figure 2:
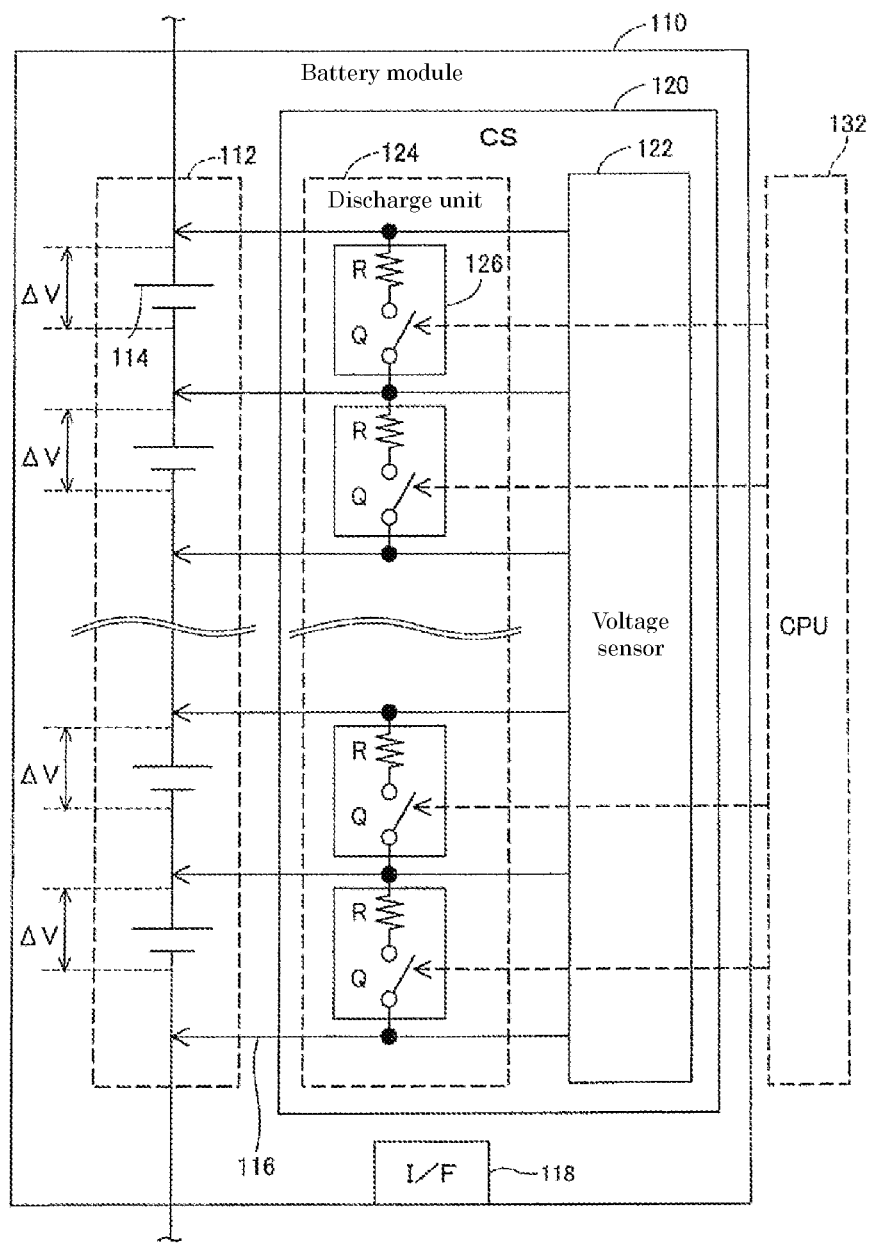
FIG. 2 is an explanatory view showing a configuration of a battery module.

FIG. 2 is an explanatory view schematically showing the configuration of the battery module 110. As shown in FIG. 1 and FIG. 2, the battery module 110 includes: a secondary battery 112; a cell sensor (hereinafter referred to as "CS") 120; and a communication interface (I/F) 118 for communication with respective parts.

The secondary battery 112 includes a plurality of cells (also referred to as "batteries") which are connected in series. Each cell 114 is a lithium ion battery which has a negative electrode where a graphite-based material is used as an active material and a positive electrode where phosphoric-acid-iron lithium (LiFePO$_4$) is used as an active material.

Figure 3:
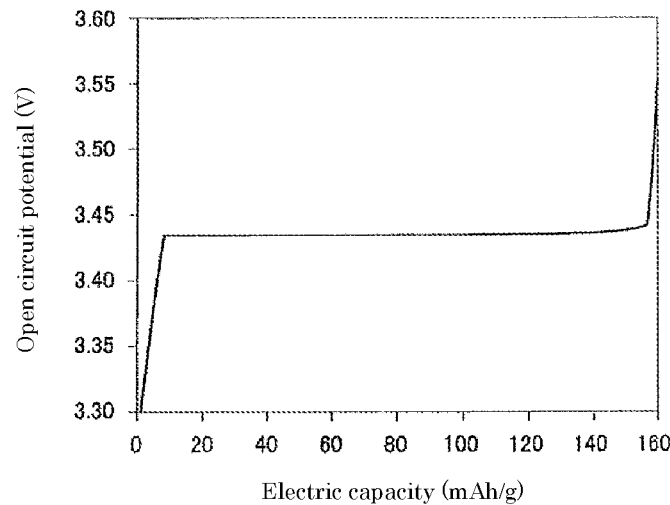
FIG. 3 is an explanatory view showing a characteristic of an active material used for forming an electrode of each cell.
Figure 4:
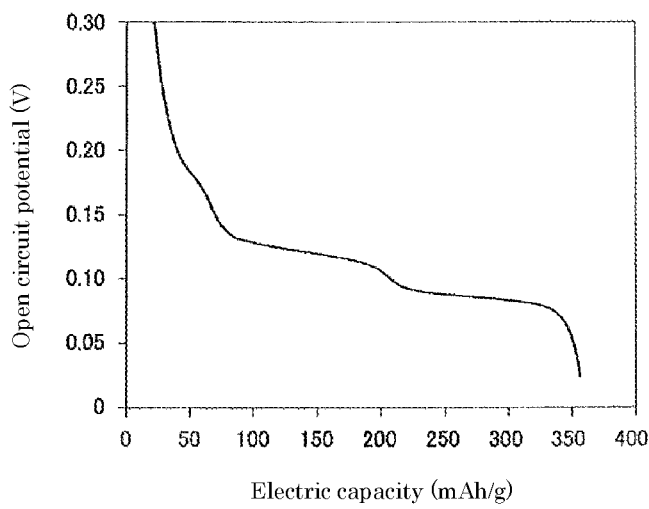
FIG. 4 is an explanatory view showing a characteristic of an active material used for forming an electrode of each cell.

FIG. 3 and FIG. 4 are explanatory views showing a characteristic of an active material used for forming electrodes of respective cells 114. In FIG. 3 and FIG. 4, a relationship between electric capacity (also referred to as residual capacity or simply capacity) per unit mass (mAh/g) and an open circuit potential (V) with respect to phosphoric-acid-iron lithium which is an active material used for forming a positive electrode and graphite which is an active material used for forming a negative electrode. As shown in FIG. 3, in the relationship between an electric capacity and an open circuit potential of an active material (phosphoric-acid-iron lithium) used for forming a positive electrode, a most region excluding a region which includes a lowest value of an electric capacity and a region which includes a highest value of an electric capacity forms a potential flat portion. The potential flat portion means a region where a ratio of an absolute value of a change amount of an open circuit potential to an absolute value of a change amount of an electric capacity (that is, an absolute value of a gradient of a curve shown in FIG. 3) becomes 0.001 or less. The potential flat portion is also referred to as "plateau region". In the regions other than the potential flat portion, that is, in the region which includes a lowest value of an electric capacity and the region which includes a highest value of an electric capacity, a ratio of an absolute value of a change amount of an open circuit potential to an absolute value of a change amount of an electric capacity is relatively increased. In the description made hereinafter, an active material having a characteristic where a potential flat portion exists in a relationship between an electric capacity and an open circuit potential is referred to as an active material having a capacity-potential characteristic where a potential flat portion exists.

On the other hand, as shown in FIG. 4, in a relationship between an electric capacity and an open circuit potential of an active material (graphite) used for forming a negative electrode, over the whole region of an electric capacity, a ratio of an absolute value of a change amount of an open circuit potential to an absolute value of a change amount of an electric capacity is relatively large and no potential flat portion exists. Particularly, in a region where an electric capacity is relatively small, a ratio of an absolute value of a change amount of an open circuit potential to an absolute value of a change amount of an electric capacity is increased.

As shown in FIG. 1 and FIG. 2, the CS 120 includes a voltage sensor 122 and a discharge unit 124. The voltage sensor 122 is connected to both terminals of each cell 114 through lines 116. The voltage sensor 122 measures a terminal voltage V of the secondary battery 112 which is a total value of terminal voltages ΔV of the respective cells 114 by measuring terminal voltages ΔV of the respective cells 114.

The discharge unit 124 includes a discharge circuit 126 each of which is disposed between a pair of lines 116 which connects the respective cells 114 of the secondary battery 112 and the voltage sensor 122. Each discharge circuit 126 is formed of a resistor R and a switch Q. Opening and closing of the switch Q of each discharge circuit 126 are controlled by a central processing unit (hereinafter referred to as "CPU") 132 of a BM 130 described later. When the switch Q of the discharge circuit 126 is brought into a closed state, an electric current flows through the line 116 and the resistor R, and the cell 114 which correspond to the discharge circuit 126 is discharged.

The current sensor 140 measures a charge current supplied to the secondary battery 112 from the charger 200 or a discharge current supplied to a load 400 from the secondary battery 112 (hereinafter collectively referred to as "charge-discharge current I"). The temperature sensor 150 is formed of a thermistor, for example, and measures a temperature of the secondary battery 112.

The BM 130 includes the CPU 132, a memory 134, and a communication interface (I/F) 136 for communication with the respective parts. The memory 134 is formed of a RAM and a ROM, for example, and stores various programs and the like. The CPU 132 controls operations of the respective parts of the battery pack 100 in accordance with a program read out from the memory 134 while looking up information transmitted from the respective sensors. For example, the CPU 132 acquires a measurement result of a terminal voltage V of the secondary battery 112 by the voltage sensor 122 of the CS 120, a measurement result of a charge-discharge current I by the current sensor 140, and a measurement result of a temperature of the secondary battery 112 by the temperature sensor 150. The CPU 132 is one example of a management unit.

The charger 200 includes a charge unit 210 and a control unit 220. The charge unit 210 includes an AC/DC converter and a DC/DC converter not shown in the drawing, and outputs electric energy for charging the battery pack 100.

The control unit 220 includes a CPU 222, a memory 224 and a communication interface (I/F) 226 for communication with respective parts. The memory 224 is formed of a RAM and a ROM, for example, and stores various programs and the like. The CPU 222 controls operations of the respective parts of the charger 200 in accordance with a program read out from the memory 224.

The battery pack 100 may be used for power source application other than an EV, electric energy storage applications and the like. For example, the battery pack 100 may be used in a peak shift application for shifting a power generation peak of photovoltaic power generation or for effectively making use of electric energy stored at night during day time. Further, the battery pack 100 may be used as a UPS (uninterruptible power system) or an emergency power source which compensates for electric energy when the supply of electricity is stopped in a region such as developing countries where electric energy infrastructure is unstable. In this case, it is considered that deep discharge described hereinafter is repeated so that deep discharge temporary degradation is liable to occur.

The BM 130 may not be mounted on the battery pack 100 but may be disposed on control equipment on a vehicle side such as an ECU (electronic control unit or engine control unit), a PCU (power control unit) and the like.

A-2. Deep Discharge Temporary Degradation:

In general, performances of a secondary battery are permanently lowered due to degradation of an active material contained in an electrode of the secondary battery, for example. Further, there may be a case where performances of a secondary battery are temporarily lowered due to some causes. In this specification, temporary lowering of performances (hereinafter referred to as "temporary degradation") means degradation which is eliminated when some restoring process is applied to the secondary battery or the secondary battery is brought into a particular state. For example, there has been known that when an operation of discharging a lithium ion battery at a high output value for a predetermined time is repeatedly performed or when an operation of charging the lithium ion battery at a high input value for a predetermined time is repeatedly performed, a phenomenon which is referred to as high rate degradation where a voltages is temporarily dropped (a phenomenon where internal resistance is increased) occurs.

Inventors of the present invention have newly found a temporary degradation phenomenon of a secondary battery which differs from high rate degradation. This temporary degradation occurs when a secondary battery which includes a positive electrode having an active material with a capacity-potential characteristic where a potential flat portion exists is discharged until the secondary battery is brought into a state where an SOC (state of charge) is brought into a relatively low state, to be more specific, into a state where the SOC becomes 40% or less. Hereinafter, discharging of the secondary battery to a state where the SOC becomes 40% or less is referred to as "deep discharge" and this temporary degradation is referred to as "deep discharge temporary degradation". The "SOC" is a rate of an electric capacity at a point of time to an electric capacity in a full charge state by percentage, and is also referred to as a charge state or a charging ratio.

Figure 5:
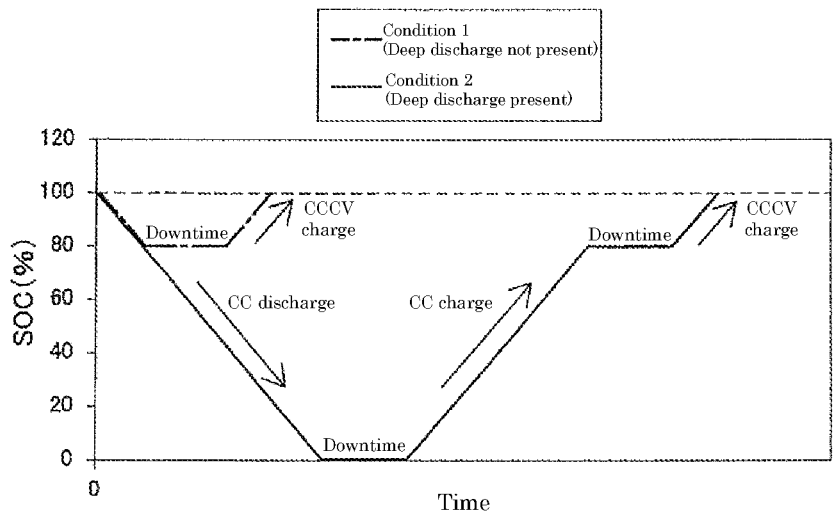
FIG. 5 is an explanatory view showing summary of deep discharge temporary degradation.
Figure 6:
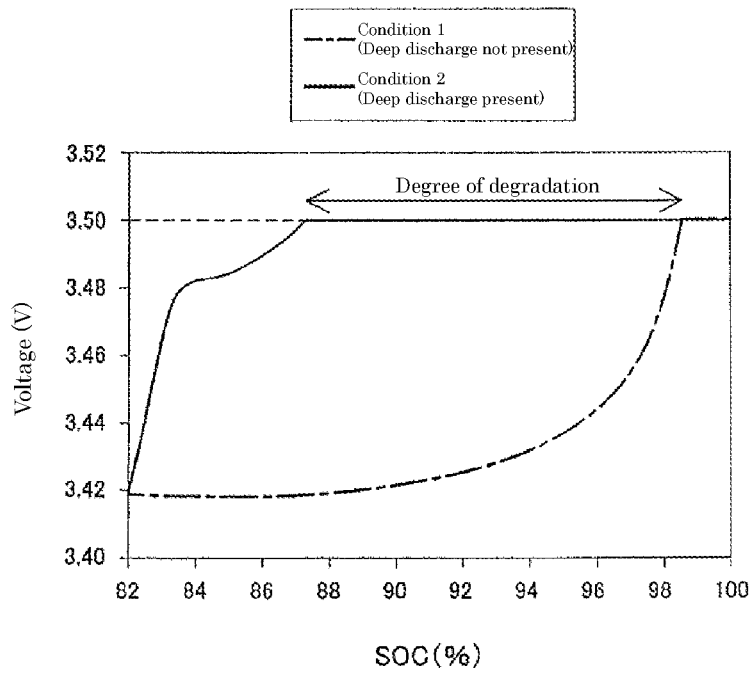
FIG. 6 is an explanatory view showing summary of deep discharge temporary degradation.

FIG. 5 and FIG. 6 are explanatory views showing the summary of deep discharge temporary degradation. The condition 1 shown in FIG. 5 is a test condition where the secondary battery 112 having an SOC of 100% is discharged to the SOC of 80% by CC discharge (constant current discharge), is held at the SOC of 80% for a while and, thereafter, is charged to SOC of 100% by CCCV charge (constant current and constant voltage charge). The condition 2 shown in FIG. 6 is a test condition where the secondary battery 112 having an SOC of 100% is discharged to the SOC of 0% by CC discharge and is held at the SOC of 0% for a while and, thereafter, is charged to SOC of 80% by CC charge (constant current charge) and is held at the SOC of 80% again for a while and, thereafter, is charged to the SOC of 100% by CCCV charge. That is, the condition 1 is the test condition where the secondary battery 112 does not experience deep discharge, and the condition 2 is the test condition where the secondary battery 112 experiences deep discharge.

As shown in FIG. 6, in the condition 2 where the secondary battery 112 experiences deep discharge, compared to the condition 1 where the secondary battery 112 does not experience deep discharge, in charging the secondary battery by CCCV charge, an SOC at which the secondary battery reaches a voltage prescribed as a voltage for shifting from CC charge to CV charge (hereinafter, referred to as "prescribed voltage" or "prescribed voltage value", 3.50 V in this embodiment) is lowered. That is, the secondary battery which experiences deep discharge reaches the prescribed voltage earlier than the secondary battery which does not experience deep discharge. When the secondary battery reaches the prescribed voltage earlier (in a low SOC state), there is a possibility that chargeable electricity is lowered or an overvoltage state occurs. In this manner, when a secondary battery which includes a positive electrode having an active material with a capacity-potential characteristic where a potential flat portion exists experiences deep discharge, temporary degradation (deep discharge temporary degradation) occurs. A lowering amount of an SOC when the secondary battery reaches a prescribed voltage due to experience of deep discharge (difference between SOCs when the secondary battery reaches a prescribed voltage under the condition 1 and the condition 2) is referred to as a degree of the deep discharge temporary degradation.

Inventors of the present invention consider that deep discharge temporary degradation occurs due to a mechanism described hereinafter.

In a secondary battery (each cell of the secondary battery), for example, variation in surface pressure distribution occurs due to variation in coating thickness of an electrode thus giving rise to the occurrence of variation in electric resistance or electric capacity on the electrode. When variation in electric resistance or electric capacity occurs on the electrode, irregularity occurs in an electrode reaction and hence, a portion having a high SOC and a portion having a low SOC are formed on the electrode.

In the case where the portion having a high SOC and the portion having a low SOC are formed on the electrode, in a secondary battery which includes an electrode having an active material with a capacity-potential characteristic where a potential flat portion does not exist as represented by lithium cobalt oxide ($LiCoO_2$), for example, a potential difference between the portion having a high SOC and the portion having a low SOC on the electrode is large and hence, variation in SOC on the electrode is naturally attenuated due to an action of local battery. On the other hand, in a secondary battery which includes an electrode having an active material with a capacity-potential characteristic where a potential flat portion exists as in the case of the secondary battery of this embodiment, there is substantially no potential difference between the portion having a high SOC and the portion having a low SOC on the electrode and hence, variation in SOC on the electrode is maintained.

Figure 7:
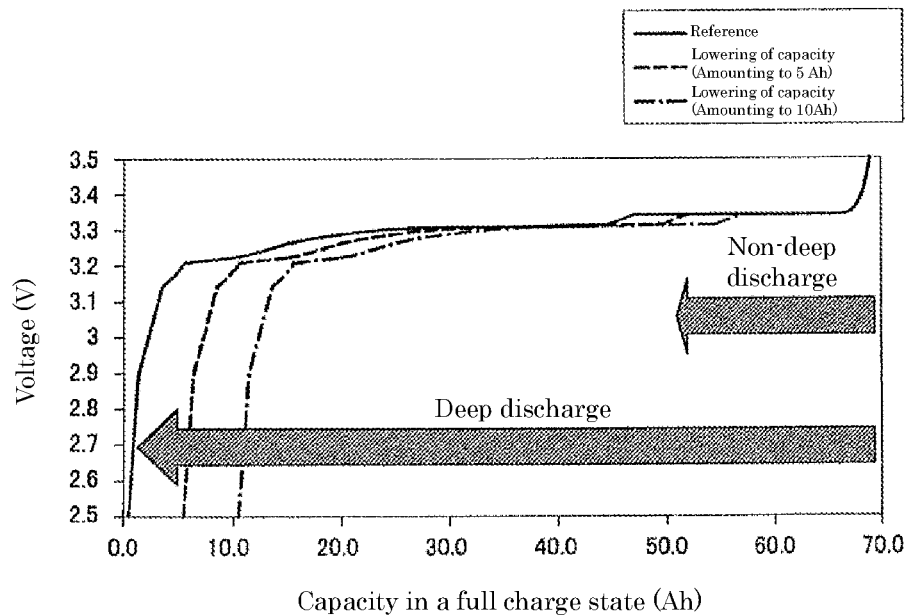
FIG. 7 is an explanatory view showing occurrence mechanism of deep discharge temporary degradation.
Figure 8:
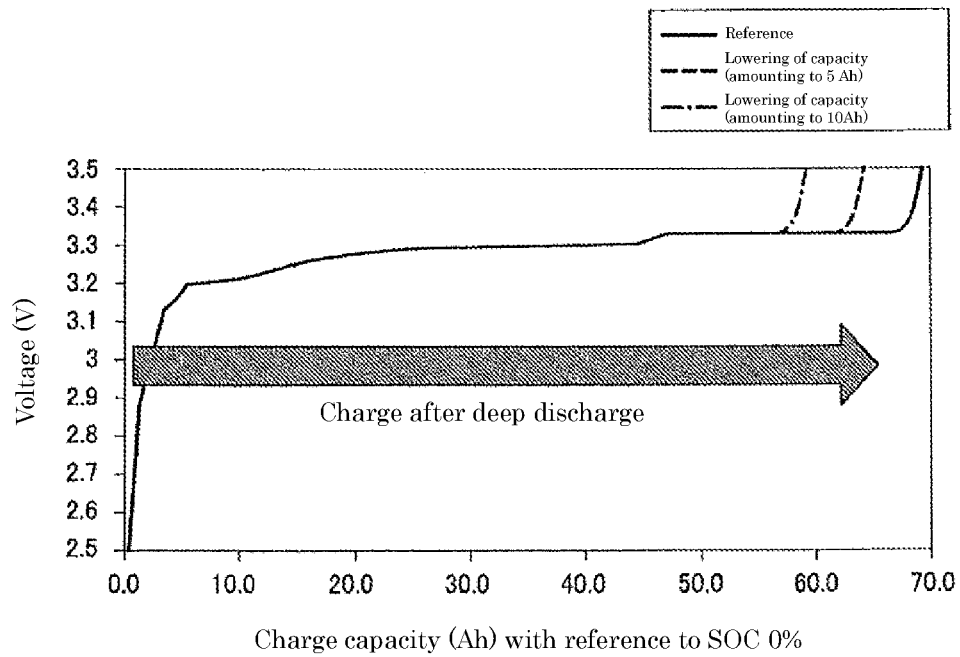
FIG. 8 is an explanatory view showing occurrence mechanism of deep discharge temporary degradation.

FIG. 7 and FIG. 8 are explanatory views showing an occurrence mechanism of deep discharge temporary degradation. FIG. 7 and FIG. 8 show a capacity-potential characteristic at three portions which differ from each other in electric capacity on the same electrode of a secondary battery. In the portion where the capacity-potential characteristic is indicated by a broken line, electric capacity is lowered by 5 Ah compared to the portion where the capacity-potential characteristic is indicated by a solid line. In the portion where the capacity-potential characteristic is indicated by a chain line, electric capacity is lowered by 10 Ah compared to the portion where the capacity-potential characteristic is indicated by the solid line. Accordingly, as shown in FIG. 7, when the secondary battery is brought into a full charge state so that capacity-potential characteristics at all portions are arranged in the vicinity of SOC of 100%, the capacity-potential characteristics at the respective portions vary in the vicinity of SOC of 0%. On the other hand, as shown in FIG. 8, when the secondary battery is brought into a completely discharge state so that capacity-potential characteristics at all portions are arranged in the vicinity of SOC of 0%, the capacity-potential characteristics at the respective portions vary in the vicinity of SOC of 100%.

As shown in FIG. 7, when the secondary battery is discharged from a full charge state to a state where an SOC is relatively high (when non deep discharge is performed), even when variation in resistance or capacity on the electrode exists due to variation in capacity-potential characteristic between the respective portions, the substantially same amount of electricity is discharged from the respective portions on the electrode. Accordingly, even when charge is performed after non deep discharge, the secondary battery reaches a prescribed voltage at substantially same timing with respect to the respective portions on the electrode.

On the other hand, when the secondary battery is discharged from a full charge state to a state where an SOC is relatively low (when the secondary battery performs deep discharge), as shown in FIG. 7, the SOC reaches near 0% in order from the portion having a small capacity on the electrode, and discharge of the respective portions is suppressed. When the discharge advances further, the SOC of the portion having a large capacity on the electrode also reaches near 0% and, finally, capacity-potential characteristics of all portions are arranged near the SOC of 0%. When the secondary battery is charged from a state where the capacity-potential characteristics of all portions are arranged at the SOC of 0% in this manner, as indicated by a chain line in FIG. 8, the secondary battery reaches a prescribed voltage earlier at the portion having small capacity on the electrode and hence, the voltage of the secondary battery reaches a prescribed voltage earlier. Accordingly, when the secondary battery experiences deep discharge, the secondary battery reaches the prescribed voltage earlier. That is, the above-mentioned deep discharge temporary degradation phenomenon occurs.

The inventors of the present invention also have newly found that, for example, when the secondary battery is charged at a voltage which exceeds a prescribed voltage, deep discharge temporary degradation is eliminated. The reason is considered as follows. As shown in FIG. 3, in a capacity-potential characteristic of phosphoric-acid-iron lithium, in a region which includes a maximum value of electric capacity, a ratio of an absolute value of a change amount of an open circuit potential to an absolute value of a change amount of electric capacity is relatively large. Accordingly, when the secondary battery is charged even in such a range, variation in SOC on the electrode is attenuated.

The above-mentioned occurrence mechanism of deep discharge temporary degradation has an aspect that the occurrence mechanism does not go beyond hypothesis. However, even if deep discharge temporary degradation occurs by a mechanism which differs from the above-mentioned mechanism, there is no difference with respect to the fact which the inventors of the present invention have newly found that deep discharge temporary degradation occurs by making a secondary battery which includes a positive electrode having an active material with a capacity-potential characteristic where a potential flat portion exists perform deep discharge.

A-3. Degree of Deep Discharge Temporary Degradation:

The inventors of the present invention have made further studies, and have found that there are at least four parameters described hereinafter as parameters which influence a degree of the deep discharge temporary degradation.

Figure 9:
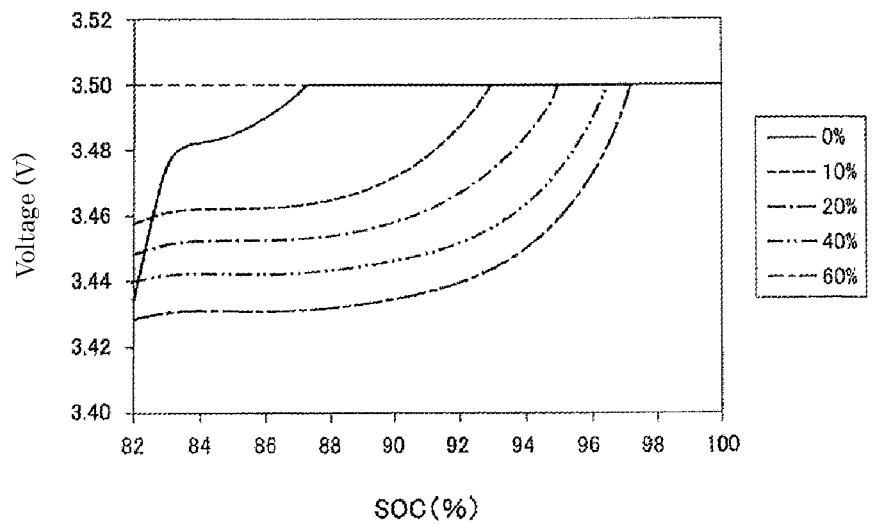
FIG. 9 is an explanatory view showing one example of a relationship between a depth of discharge and a degree of the deep discharge temporary degradation.

A-3-1. Depth of Discharge:

FIG. 9 is an explanatory view showing one example of a relationship between a depth of discharge and a degree of deep discharge temporary degradation. FIG. 9 shows a part of transition of a charge voltage from an SOC of 80% when an SOC lowest value at the time of discharge is changed within a range from 0% to 60% (that is, a depth of discharge is changed) under the condition 2 shown in FIG. 5. As shown in FIG. 9, the lower the lowest value of the SOC (the larger the depth of discharge), the earlier the secondary battery reaches a prescribed voltage (the lower the SOC when the secondary battery reaches the prescribed voltage becomes). From this result, it can be determined that the lower the lowest value of the SOC (the larger the depth of discharge), the larger a degree of the deep discharge temporary degradation becomes.

Figure 10:
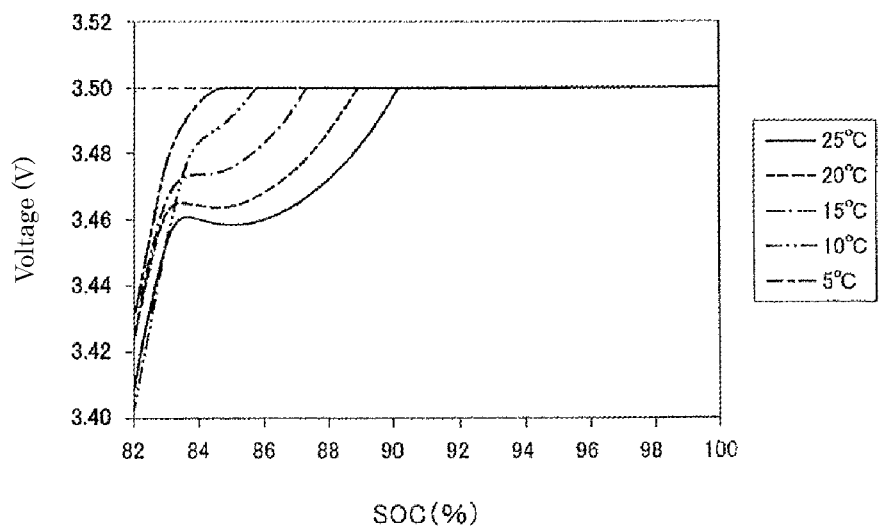
FIG. 10 is an explanatory view showing one example of a relationship between a temperature during discharge and a degree of the deep discharge temporary degradation.

A-3-2. Temperature During Deep Discharge:

FIG. 10 is an explanatory view showing one example of a relationship between a temperature during deep discharge and a degree of deep discharge temporary degradation. FIG. 10 shows portions of transition of a charge voltage from an SOC of 80% when a temperature during deep discharge is changed within a range from 5° C. to 25° C. under the condition 2 shown in FIG. 5. As shown in FIG. 10, the lower a temperature during deep discharge, the earlier the secondary battery reaches a prescribed voltage (the lower the SOC when the secondary battery reaches the prescribed voltage becomes). From this result, it can be determined that the lower a temperature during deep discharge, the larger a degree of deep discharge temporary degradation becomes.

Figure 11:
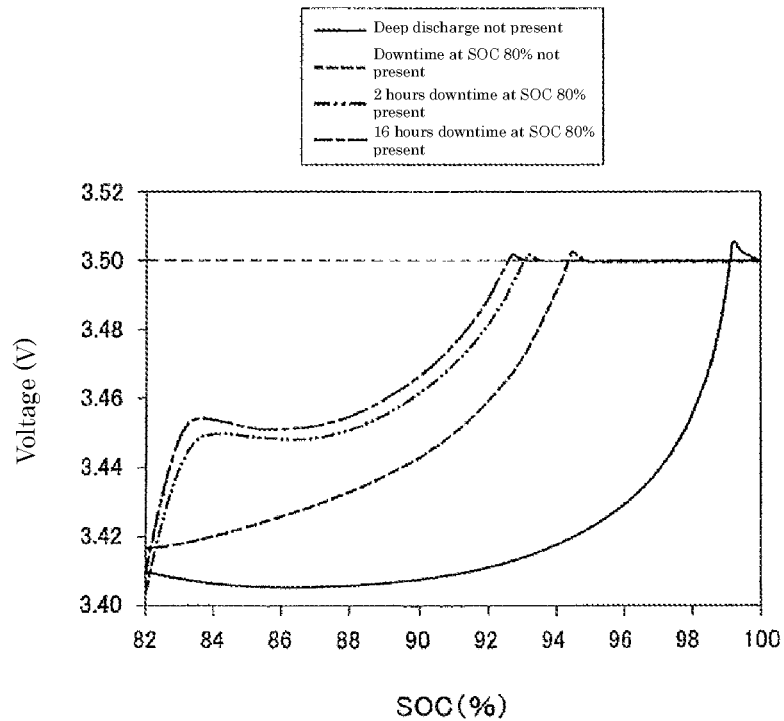
FIG. 11 is an explanatory view showing one example of a relationship between downtime after discharge and a degree of the deep discharge temporary degradation.

A-3-3. Downtime after Deep Discharge:

FIG. 11 is an explanatory view showing one example of a relationship between a downtime after deep discharge and a degree of deep discharge temporary degradation. FIG. 11 shows portions of transition of a charge voltage from an SOC of 80% when a downtime in a state where the SOC is 80% is changed within a range from 0 hour (no downtime) to 16 hours under the condition 2 shown in FIG. 5. As shown in FIG. 11, the longer the downtime after deep discharge, the earlier the secondary battery reaches the prescribed voltage (the lower the SOC when the secondary battery reaches the prescribed voltage becomes). From this result, it is understood that it can be determined that the longer the downtime after deep discharge, the larger a degree of deep discharge temporary degradation becomes.

Figure 12:
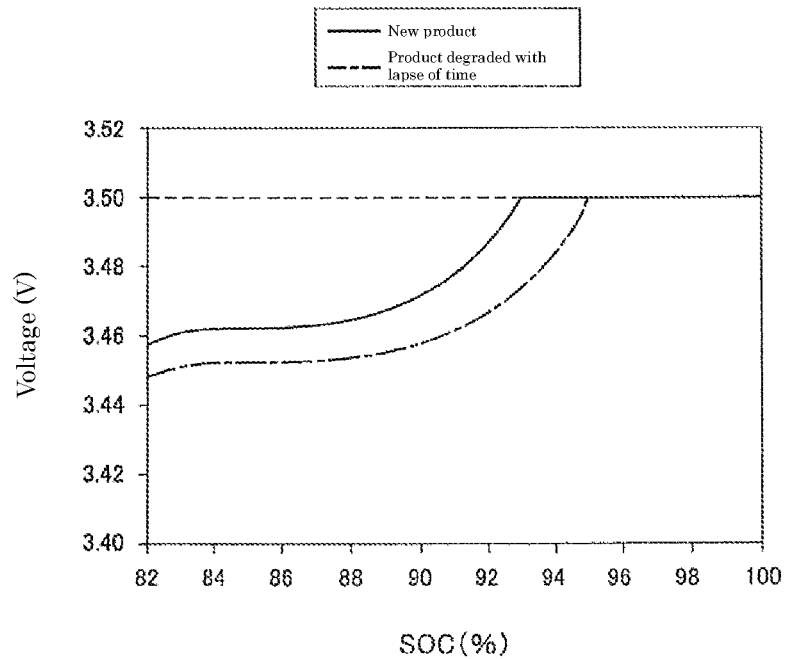
FIG. 12 is an explanatory view showing one example of a relationship between the degree of degradation with a lapse of time and a degree of the deep discharge temporary degradation.

A-3-4. Degree of Degradation with a Lapse of Time:

FIG. 12 is an explanatory view showing one example of a relationship between a degree of degradation with a lapse of time and a degree of deep discharge temporary degradation. FIG. 12 shows portions of transition of a charge voltage from an SOC of 80% when a test is performed under the condition 2 shown in FIG. 5 using a new cell and a cell which is degraded with a lapse of time. As shown in FIG. 12, the new cell reaches a prescribed voltage earlier (the lower the SOC when the cell reaches the prescribed voltage becomes) compared to the cell which is degraded with a lapse of time. From this result, it can be determined that the smaller the degree of the degradation with a lapse of time, the larger a degree of the deep discharge temporary degradation becomes. The degree of degradation of the cell with a lapse of time can be expressed using an index value relating to the degradation with a lapse of time such as internal resistance, capacity, the number of years in use, the number of charge-discharge cycles of the cell, for example.

A-3-5. Method for Determining Degree of Deep Discharge Temporary Degradation:

The inventors of the present invention have come up with a method for determining a degree of deep discharge temporary degradation using the above-mentioned four parameters. FIG. 13 is an explanatory view showing one example of method for determining a degree of the deep discharge temporary degradation. In the method shown in FIG. 13, with respect to the above-mentioned four respective parameters, a numerical value (points) indicating a degree of deep discharge temporary degradation is allocated to each parameter value, and it is determined that the larger a sum of points with respect to each parameter, the larger a degree of the deep discharge temporary degradation becomes. For example, as indicated by hatching in FIG. 13, when the cell is discharged to less than SOC of 10% (5 points), a temperature at the time of performing deep discharge falls within a range from 10° C. to 15° C. (3 points), a downtime after deep discharge is less than 2 h (1 point) and the degree of the degradation of the cell with a lapse of time is substantially intermediate (3 points), points which indicate a degree of the deep discharge temporary degradation becomes 12 points out of 20 full points.

Figure 14:
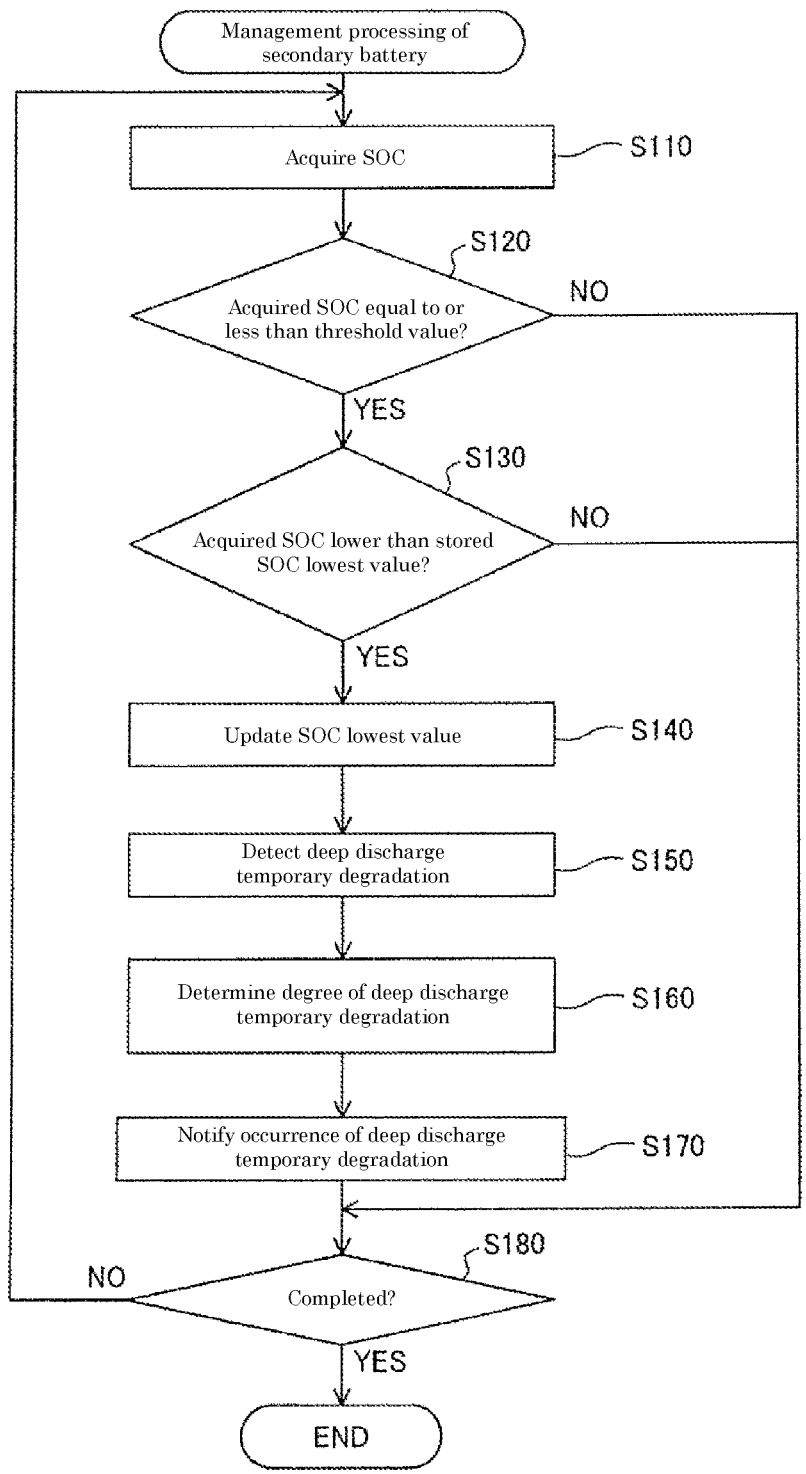
FIG. 14 is a flowchart showing the flow of management processing of the secondary battery.

A-4. Management Processing of Secondary Battery:

The BM 130 of the battery pack 100 according to this embodiment (FIG. 1) performs management processing for detecting the occurrence of deep discharge temporary degradation of the secondary battery 112. FIG. 14 is a flowchart showing the flow of management processing of the secondary battery. The management processing of the secondary battery is started at a timing that a predetermined start instruction is inputted (for example, at a timing that an ignition is brought into an ON state in a case where the battery pack 100 is mounted on an electric vehicle).

First, the CPU 132 of the BM 130 acquires a value of an SOC (S110). The value of SOC can be acquired by various known methods. For example, the value of the SOC can be acquired based on an integrated value of charge-discharge currents of the secondary battery 112 stored in the memory 134 or can be calculated from an OCV using information which shows a correspondence relationship between a preset SOC and OCV.

The CPU 132 determines whether or not the acquired value of the SOC is equal to or less than a preset threshold value (40% in this embodiment) (S120). When the CPU 132 determines that the acquired value of the SOC is more than the threshold value (S120: NO), the CPU 132 determines whether or not a completion instruction of management processing is inputted (S180). When the CPU 132 determines that the completion instruction of management processing is not inputted (S180: NO), the processing returns to processing in step S110. The threshold value is one example of a prescribed SOC.

On the other hand, when the CPU 132 determines that the acquired value of the SOC is equal to or less than the threshold value (S120: YES), the CPU 132 determines whether or not the acquired value of the SOC is lower than an SOC lowest value stored in the memory 134 (S130). When the SOC lowest value is not stored in the memory 134, the CPU 132 determines that the acquired value of the SOC is lower than the SOC lowest value.

When the CPU 132 determines that the acquired value of the SOC is lower than the SOC lowest value (S130: YES), the SOC lowest value stored in the memory 134 is updated (S140), and detects the occurrence of deep discharge temporary degradation in the secondary battery 112 (S150), and determines a degree of deep discharge temporary degradation using the method exemplified in FIG. 13 (S160). Further, the CPU 132 notifies the occurrence of deep discharge temporary degradation (S170). For example, the CPU 132 notifies that deep discharge temporary degradation occurs in the ECU of an electric vehicle. When the battery pack 100 includes a notification unit which uses a sound, a light or the like for notification, the CPU 132 makes the notification unit notify the occurrence of deep discharge temporary degradation to a manager. Then, the CPU 132 determines whether or not a completion instruction of management processing is inputted (S180). When the CPU 132 determines that the completion instruction of management processing is not inputted (S180: NO), the processing returns to processing in step S110.

When the CPU 132 determines that the value of the SOC acquired in step S110 is equal to or less than the threshold value (S120: YES), and also determines that the acquired value of the SOC is equal to or more than SOC lowest value (S130: NO), the processing returns to processing in step S180 by skipping processing ranging from step S140 to step S170. When the CPU 132 determines that the completion instruction of management processing is inputted (S180: YES), the management processing is completed.

As describe above, when the CPU 132 detects the occurrence of deep discharge temporary degradation in the secondary battery 112, CPU 132 performs notification processing. After deep discharge temporary degradation occurs, during a period where the secondary battery 112 does not go through a state which is set in advance as a state in which the secondary battery 112 eliminates deep discharge temporary degradation such as full charge of the secondary battery 112, for example, the CPU repeats notification processing at predetermined time intervals even when a value of the SOC more than a threshold value is acquired. Accordingly, when notification processing is performed, it is estimated that the CPU 132 detects the occurrence of deep discharge temporary degradation in the secondary battery 112. Further, when the CPU 132 detects the occurrence of deep discharge temporary degradation in the secondary battery 112, the CPU 132 may perform, along with the notification processing or in place of the notification processing, control processing of controlling the secondary battery 112 by a control method when deep discharge temporary degradation is detected (at least partially different from a control method performed in a usual case when deep discharge temporary degradation is not detected). In such processing, when the control processing of the secondary battery 112 which differs from the control processing performed in the usual case is performed, it is estimated that the CPU 132 detects the occurrence of deep discharge temporary degradation in the secondary battery 112. The content of the notification processing or the control processing may differ corresponding to a degree of the deep discharge temporary degradation. In such processing, in the case where the content of notification processing or the content of the control processing differs when at least one of the above-mentioned four parameters differs, it is estimated that the CPU 132 determines a degree of the deep discharge temporary degradation in the secondary battery 112.

As has been described heretofore, in this embodiment, the CPU 132 of the BM 130 acquires a value of the SOC of the secondary battery 112, and detects the occurrence of deep discharge temporary degradation in the secondary battery 112 when the acquired value of the SOC is equal to or less than the threshold value set in advance and hence, a user can accurately grasp performances of the secondary battery 112. Accordingly, for example, the CPU 132 can notify the occurrence of deep discharge temporary degradation in the secondary battery 112 and can properly control the secondary battery by taking into account the influence of deep discharge temporary degradation.

Further, the CPU 132 determines that the lower an acquired value of an SOC, the lower an acquired temperature during deep discharge, the longer a downtime after deep discharge or the smaller a degree of degradation with a lapse of time of the secondary battery 112, the larger a degree of deep discharge temporary degradation becomes and hence, performances of the secondary battery 112 can be further accurately grasped. Accordingly, for example, the CPU 132 can notify a degree of deep discharge temporary degradation which occurs in the secondary battery 112 or can accurately control the secondary battery by taking into account a degree of deep discharge temporary degradation.

Figure 15:
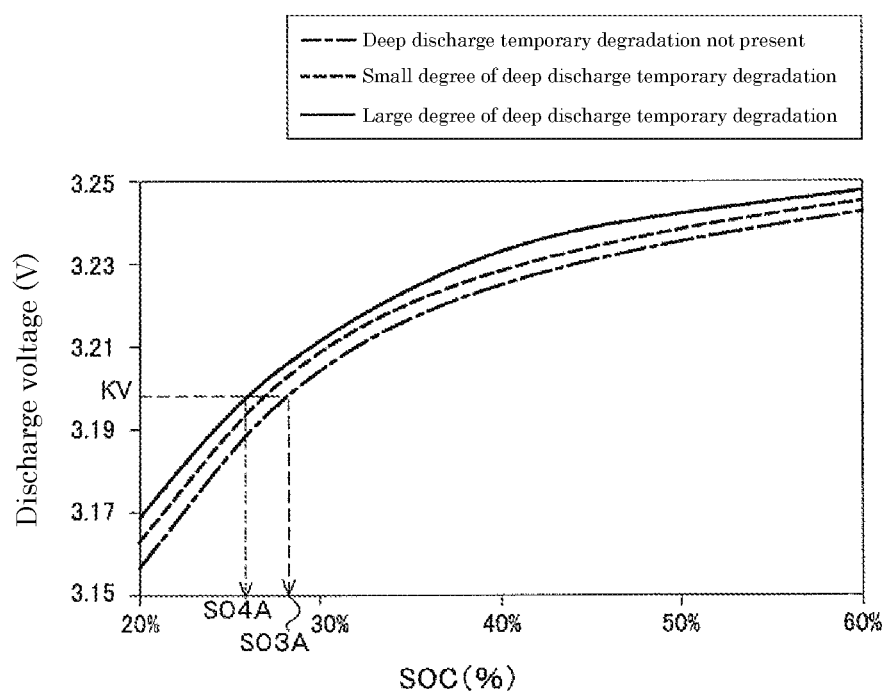
FIG. 15 is an explanatory view showing one example of a relationship between the transition of a discharge voltage and a degree of the deep discharge temporary degradation.
Figure 16:
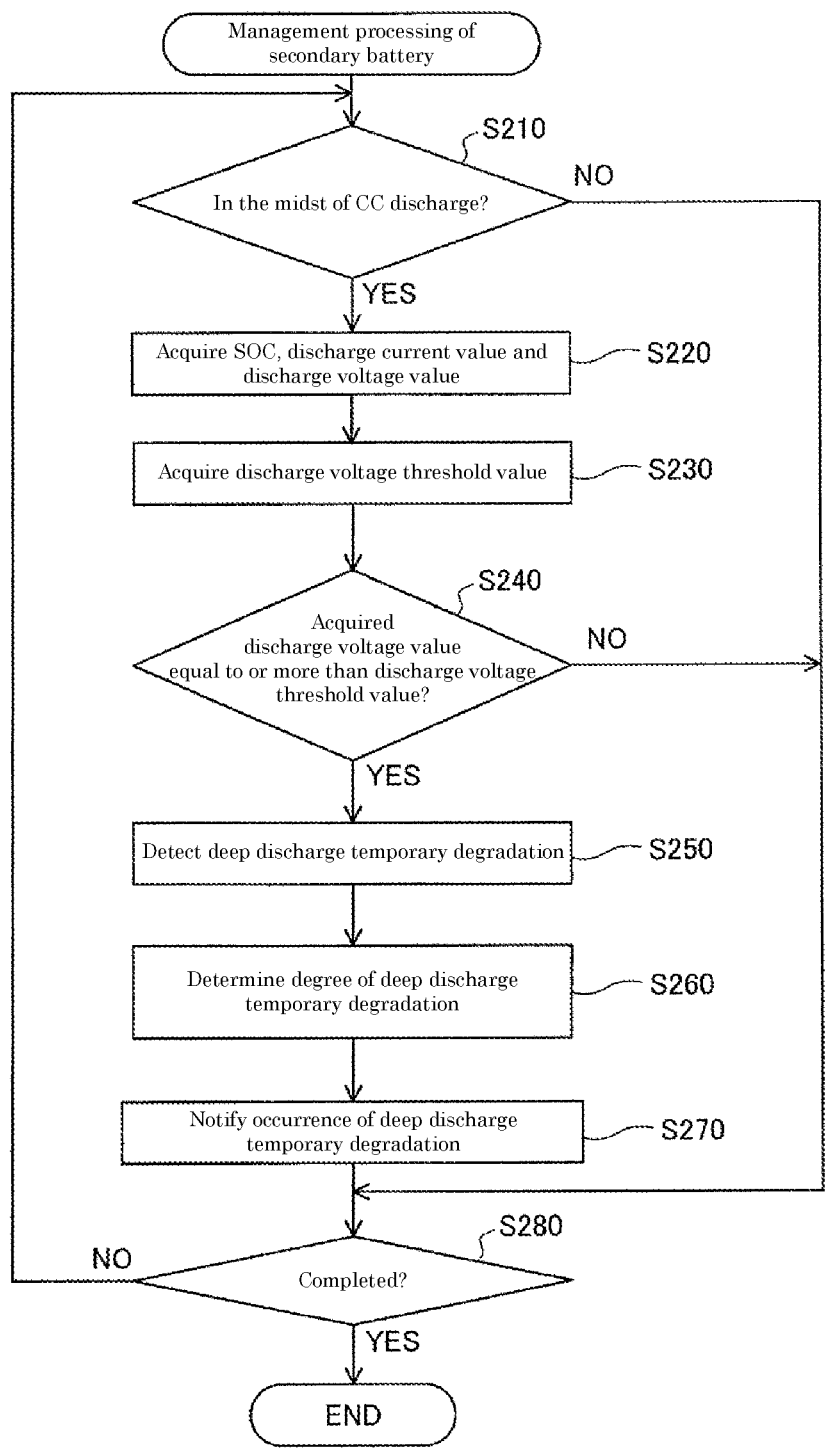
FIG. 16 is a flowchart showing the flow of management processing of the secondary battery.
Figure 17:
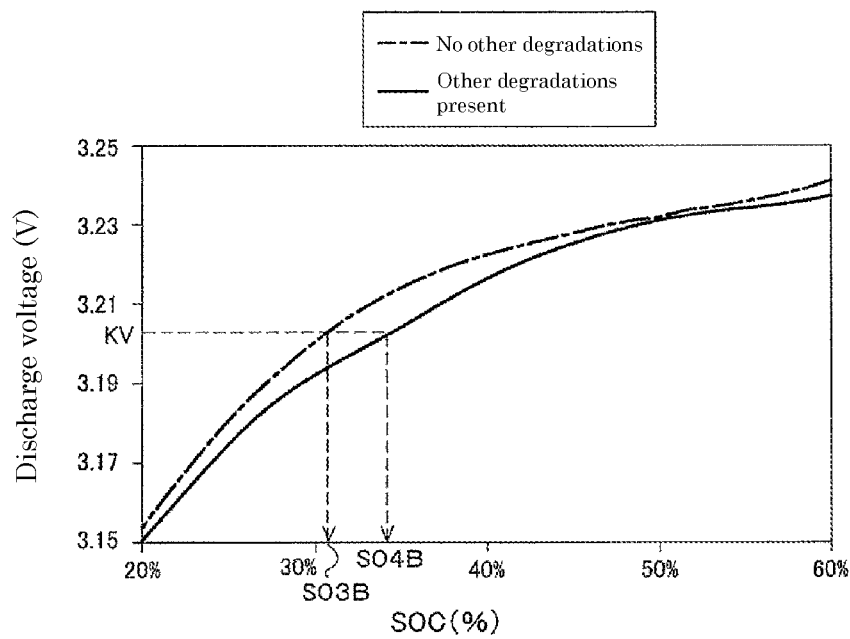
FIG. 17 is an explanatory view showing one example of a relationship between the transition of a discharge voltage and a degree of other degradation.

B. Second Embodiment:

FIG. 15 to FIG. 17 show the second embodiment. The second embodiment differs from the first embodiment with respect to a method for detecting deep discharge temporary degradation. The second embodiment is substantially identical to the first embodiment with respect to other points. Accordingly, constitutional elements of the second embodiment identical to the corresponding constitutional elements of the first embodiment are given same reference symbols and repeated description of these constitutional elements is omitted, and only the configurations of the second embodiment which differ from the corresponding configurations of the first embodiment are described.

FIG. 15 is an explanatory view showing one example of a relationship between the transition of a discharge voltage and a degree of deep discharge temporary degradation. A discharge voltage is a terminal voltage V of the secondary battery 112 when the secondary battery 112 is discharged by CC discharge. FIG. 15 shows a portion of the transition of a discharge voltage when an SOC lowest value is changed within a predetermined range (that is, a depth of discharge is changed) and, thereafter, the secondary battery 112 is discharged to the SOC of 20% from the SOC of 60% during CC discharge.

As shown in FIG. 15, the larger a degree of the deep discharge temporary degradation (in other words, the larger a depth of discharge), the larger a discharge voltage value of the secondary battery 112 becomes (that is, a discharge voltage shifts at a high level) when the secondary battery 112 is discharged by constant current discharge. From this result, the occurrence of deep discharge temporary degradation can be detected by comparing a discharge voltage value with a preset discharge voltage threshold value. Further, it is also determined that the larger a discharge voltage value, the larger a degree of deep discharge temporary degradation becomes.

FIG. 17 is an explanatory view showing one example of a relationship between the transition of a discharge voltage and a degree of degradation other than deep discharge temporary degradation such as degradation with a lapse of time or high rate degradation (hereinafter referred to as "other degradations"). As shown in FIG. 17, in other degradations, along with the increase of internal resistance in the secondary battery 112 caused by degradation, an SOC-discharge voltage characteristic when the degradation occurs shifts to a low voltage side compared to an SOC-discharge voltage characteristic when the degradation does not occur in the whole SOC region. That is, in other degradations, unlike the deep discharge temporary degradation shown in FIG. 15, the larger a degree of degradation, the lower a discharge voltage value of the secondary battery when the secondary battery is discharged by constant current discharge becomes.

In this embodiment, the BM 130 of the battery pack 100 (FIG. 1) performs management processing for detecting the occurrence of deep discharge temporary degradation of the secondary battery 112. FIG. 16 is a flowchart showing the flow of management processing of the secondary battery. The management processing of the secondary battery starts at a timing that a predetermined start instruction is inputted to the BM 130 (for example, timing that ignition is brought into an ON state when the battery pack 100 is mounted on an electric vehicle).

First, the CPU 132 of the BM 130 determines whether or not the secondary battery 112 is in the midst of CC discharge (S210). This determination can be made by various known methods. For example, the CPU 132 can determine whether or not the secondary battery 112 is in the midst of CC discharge based on a control instruction from a host computer such as an ECU not shown in the drawings or the charger 200 or a measurement result of a charge-discharge current I detected by the current sensor 140. When the CPU 132 determines that the secondary battery 112 is not in the midst of CC discharge (S210: NO), the CPU 132 determines whether or not a completion instruction of management processing is inputted (S280). When the CPU 132 determines that the completion instruction of management processing is not inputted (S280: NO), the processing returns to step S210.

On the other hand, when the CPU 132 determines that the secondary battery 112 is in the midst of CC discharge (S210: YES), the CPU 132 acquires a value of an SOC of the secondary battery 112, a current value of a charge-discharge current I (hereinafter also referred to as a discharge current value particularly), and a value of a terminal voltage V (hereinafter also referred to as a discharge voltage value) (S220). A value of the SOC can be acquired by various known methods. For example, a value of the SOC may be acquired based on an integrated value of charge-discharge currents of the secondary battery 112 stored in the memory 134, or can also be calculated from an OCV using information indicating a correspondence relationship between a preset SOC and an OCV.

The CPU 132 acquires a discharge voltage threshold value which corresponds to a value of the acquired SOC and a discharge current value (S230). The discharge voltage threshold value is a discharge voltage value of the secondary battery 112 when a degree of deep discharge temporary degradation is at a predetermined level. Hereinafter, assume that the predetermined level is a level when there is no deep discharge temporary degradation, that is, zero. The memory 134 preliminarily stores correspondence information between an SOC, a discharge current value and a discharge voltage value of the secondary battery 112. The CPU 132 acquires a discharge voltage threshold value by looking up the correspondence information. The correspondence information is information where discharge voltage values which are acquired by changing an SOC and respective discharge current values in a state where there is no deep discharge temporary degradation are made to correspond to the respective SOCs and the respective discharge current values as discharge voltage threshold values. The discharge voltage threshold value is one example of the first voltage threshold value.

The CPU 132 determines whether or not the acquired discharge voltage value is equal to or more than a preset discharge voltage threshold value (S240). When the CPU 132 determines that the acquired discharge voltage value is smaller than the discharge voltage threshold value (S240: NO), the processing advances to processing in step S280. On the other hand, when the CPU 132 determines that the acquired discharge voltage value is equal to or more than the discharge voltage threshold value (S240: YES), the CPU 132 detects the occurrence of deep discharge temporary degradation in the secondary battery 112 (S250). Further, the CPU 132 determines a degree of deep discharge temporary degradation based on a differential value between the acquired discharge voltage valve and the discharge voltage threshold value (S260). To be more specific, the CPU 132 determines that the larger a differential value, the larger a degree of deep discharge temporary degradation becomes. Further, the CPU 132 notifies the occurrence of deep discharge temporary degradation (S270). Thereafter, the CPU 132 advances to processing in step S280. A state that an acquired discharge voltage value is equal to or more than a discharge voltage threshold value is one example of predetermined conditions.

As has been described heretofore, in this embodiment, the CPU 132 of the BM 130 acquires a discharge voltage value of the secondary battery 112, and detects the occurrence of deep discharge temporary degradation in the secondary battery 112 when the acquired discharge voltage value is equal to or more than the discharge voltage threshold value set in advance and hence, a user can accurately grasp performances of the secondary battery 112. Accordingly, for example, the CPU 132 can notify the occurrence of deep discharge temporary degradation in the secondary battery 112 and properly controls the secondary battery by taking into account the influence of deep discharge temporary degradation.

Further, the CPU 132 determines that the larger an acquired discharge voltage value, the larger a degree of deep discharge temporary degradation becomes and hence, performances of the secondary battery 112 can be further accurately grasped. Accordingly, the CPU 132 can notify a degree of deep discharge temporary degradation which occurs in the secondary battery 112 or accurately controls the secondary battery 112 by taking into account a degree of deep discharge temporary degradation, for example.

Figure 18:
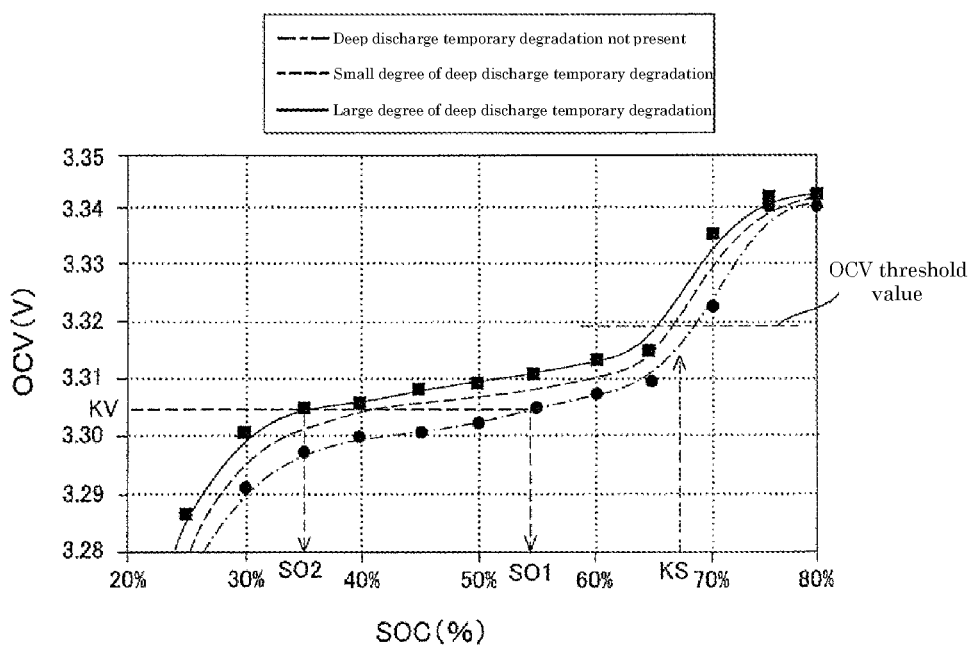
FIG. 18 is an explanatory view showing one example of a relationship between the transition of an OCV and a degree of the deep discharge temporary degradation (SOC-OCV characteristic at the time of constant voltage charge of the secondary battery).
Figure 19:
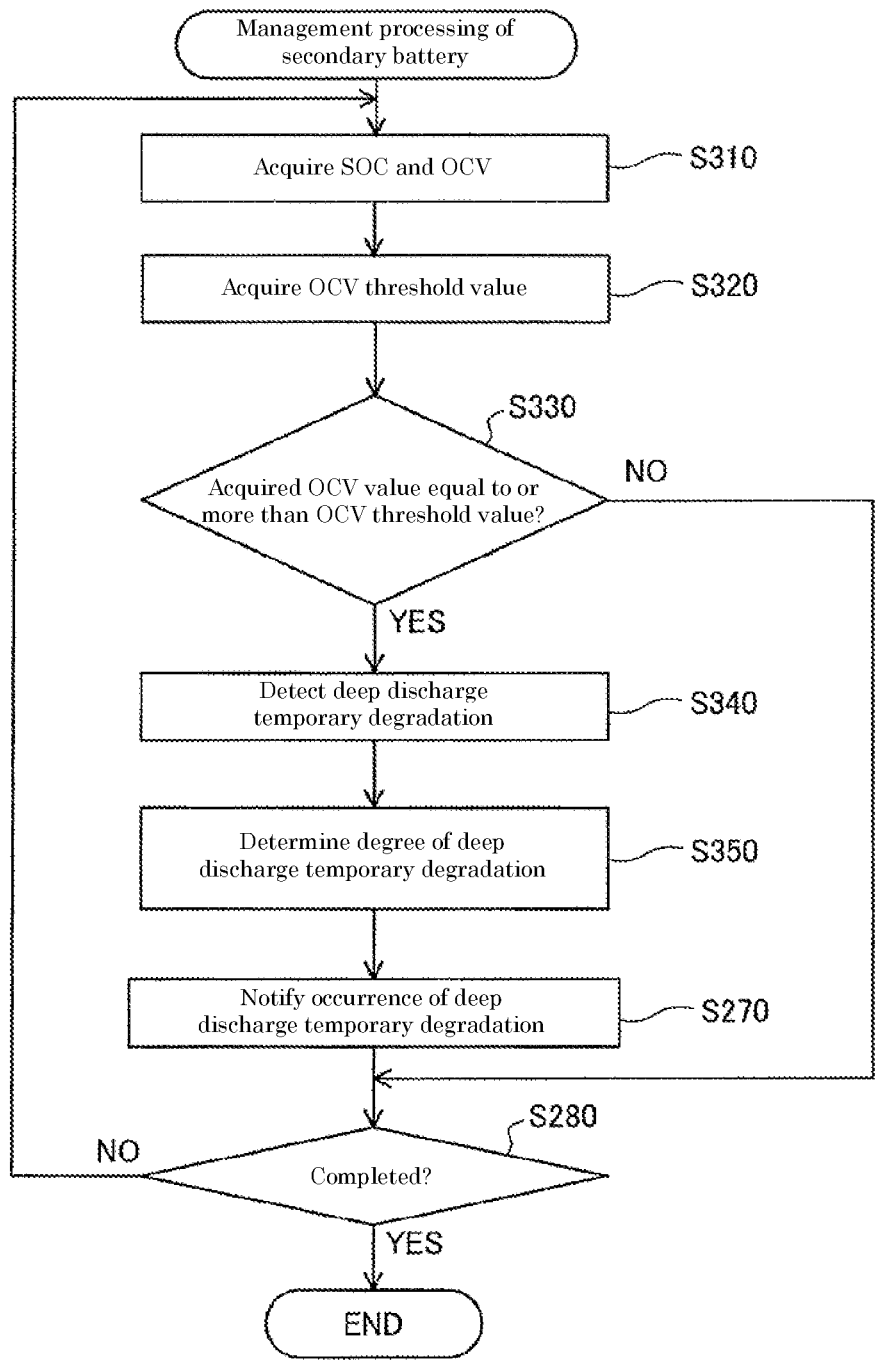
FIG. 19 is a flowchart showing the flow of management processing of the secondary battery.

C. Third Embodiment:

FIG. 18 and FIG. 19 show the third embodiment. The third embodiment differs from the first embodiment with respect to a method for detecting deep discharge temporary degradation. The third embodiment is substantially identical to the first embodiment with respect to other points. Accordingly, constitutional elements of the third embodiment identical to the corresponding constitutional elements of the first embodiment are given same reference symbols and repeated description of these constitutional elements is omitted, and only the configurations which differ from the corresponding configurations of the first embodiment are described.

FIG. 18 is an explanatory view showing one example of a relationship between the transition of an OCV (Open Circuit Voltage) and a degree of deep discharge temporary degradation. The OCV is a terminal voltage V of the secondary battery 112 when the secondary battery 112 is in a stable state. For example, the OCV is a terminal voltage V of the secondary battery 112 when a voltage change amount of the secondary battery 112 per unit time is 100 mV or less. The OCV is also referred to as an open circuit voltage. FIG. 18 shows a portion of the transition of the OCV when an SOC lowest value is changed within a predetermined range (that is, a depth of discharge is changed) under the above-mentioned conditions 1 and 2 and, thereafter, an SOC of the secondary battery 112 is changed from 20% to 80%.

As shown in FIG. 18, the larger a degree of the deep discharge temporary degradation (in other words, the larger a depth of discharge), the larger the value of an OCV of the secondary battery 112 becomes (that is, an OCV shifts at a high level). From this result, the occurrence of deep discharge temporary degradation can be detected by comparing an OCV value with a preset OCV threshold value. Further, it is also determined that the larger an OCV value, the larger a degree of deep discharge temporary degradation becomes.

In this embodiment, the BM 130 of the battery pack 100 (FIG. 1) performs management processing for detecting the occurrence of deep discharge temporary degradation of the secondary battery 112. FIG. 19 is a flowchart showing the flow of management processing of the secondary battery. The management processing of the secondary battery starts at a timing that a predetermined start instruction is inputted to the BM 130 (for example, timing that ignition is brought into an ON state when the battery pack 100 is mounted on an electric vehicle).

First, the CPU 132 of the BM 130 acquires a value of an SOC of the secondary battery 112 and a value of an OCV (S310). The value of the OCV can be acquired by various known methods. For example, the value of the OCV can be obtained based on a terminal voltage of the secondary battery 112 measured in a state where the secondary battery 112 is open-circuited and is left for a predetermined time or can be obtained in such a manner that an internal resistance of the secondary battery 112 is measured and the value of the OCV is calculated based on a result of the measurement.

The CPU 132 acquires an OCV threshold value which corresponds to the acquired value of the SOC (S320). The OCV threshold value is a value of an OCV of the secondary battery 112 when a degree of deep discharge temporary degradation is at a predetermined level. Hereinafter, assume that the predetermined level is a level when there is no deep discharge temporary degradation, that is, zero. The memory 134 preliminarily stores correspondence information between an SOC and an OCV of the secondary battery 112. The CPU 132 acquires an OCV threshold value by looking up the correspondence information. The correspondence information is information where a value of an OCV which is acquired by changing an SOC in a state where there is no deep discharge temporary degradation is made to correspond to the respective SOCs as OCV threshold values. The OCV threshold values are one example of the second voltage threshold values.

The CPU 132 determines whether or not the acquired value of the OCV is equal to or more than a preset OCV threshold value (S330). When the CPU 132 determines that the acquired value of the OCV is smaller than the OCV threshold value (S330: NO), the processing advances to processing in step S280. On the other hand, when the CPU 132 determines that the acquired value of the OCV is equal to or more than the OCV threshold value (S330: YES), the CPU 132 detects the occurrence of deep discharge temporary degradation in the secondary battery 112 (S340). Further, the CPU 132 determines a degree of deep discharge temporary degradation based on a differential value between the acquired value of the OCV and the OCV threshold value (S350). To be more specific, the CPU 132 determines that the larger a differential value, the larger a degree of deep discharge temporary degradation becomes. A state that an acquired value of the OCV is equal to or more than an OCV threshold value is one example of predetermined conditions.

As has been described heretofore, in this embodiment, the CPU 132 of the BM 130 acquires a value of an OCV of the secondary battery 112, and detects the occurrence of deep discharge temporary degradation in the secondary battery 112 when the acquired value of the OCV is equal to or more than an OCV threshold value set in advance and hence, a user can accurately grasp performances of the secondary battery 112. Accordingly, for example, the CPU 132 can notify the occurrence of deep discharge temporary degradation in the secondary battery 112 and properly control the secondary battery by taking into account the influence of deep discharge temporary degradation.

Further, the CPU 132 determines that the larger an acquired value of the OCV, the larger a degree of deep discharge temporary degradation becomes and hence, performances of the secondary battery 112 can be further accurately grasped. Accordingly, the CPU 132 can notify a degree of deep discharge temporary degradation which occurs in the secondary battery 112 or accurately control the secondary battery 112 by taking into account a degree of deep discharge temporary degradation.

Figure 20:
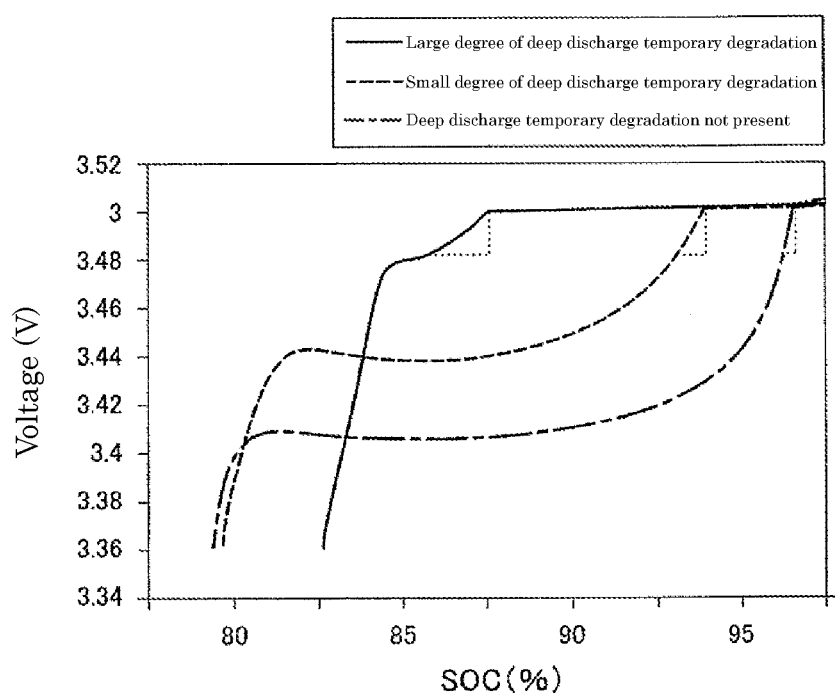
FIG. 20 is an explanatory view showing one example of a relationship between the transition of a charge voltage and a degree of the deep discharge temporary degradation.
Figure 21:
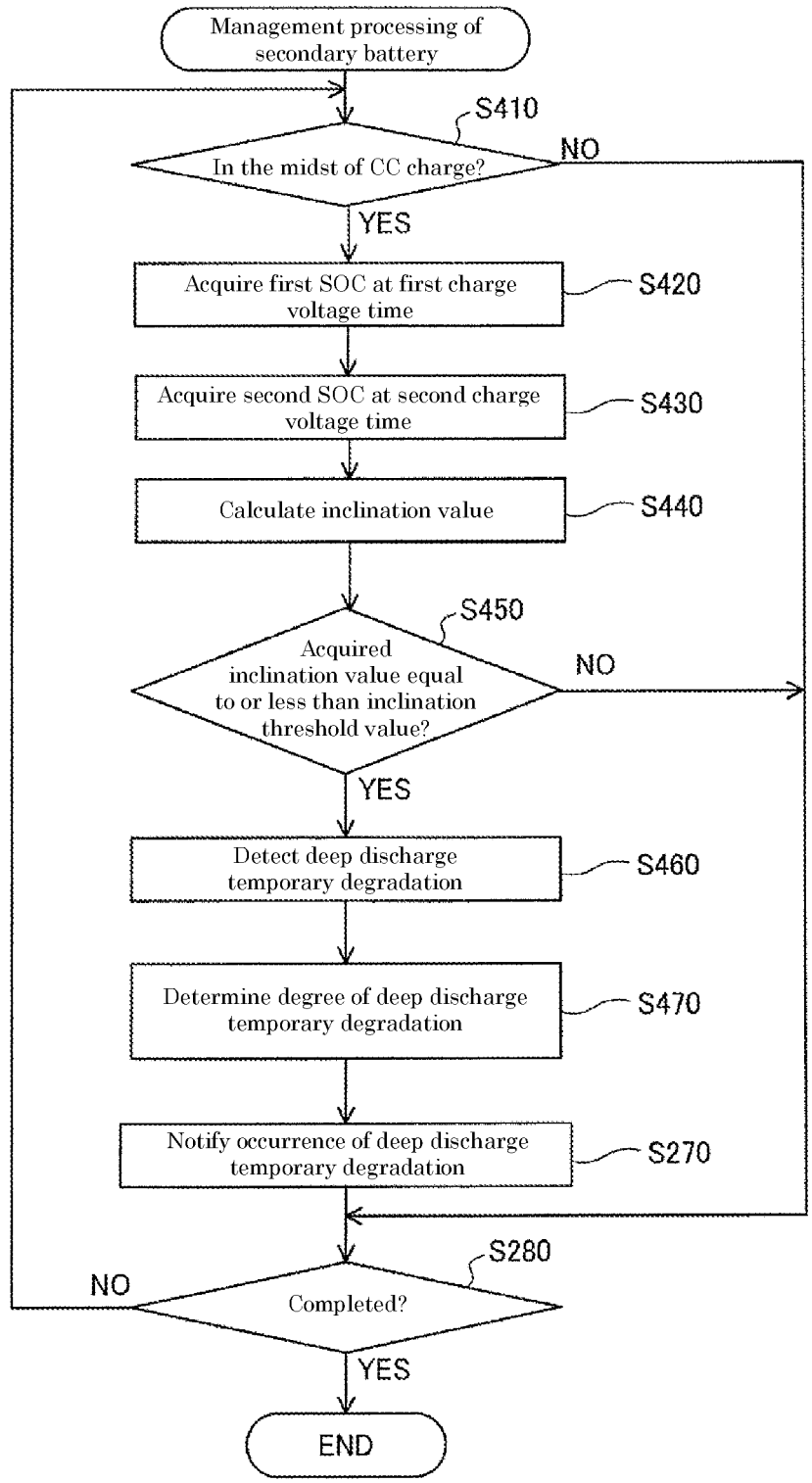
FIG. 21 is a flowchart showing the flow of management processing of the secondary battery.

D. Fourth Embodiment:

FIG. 20 and FIG. 21 show the fourth embodiment. The fourth embodiment differs from the first embodiment with respect to a method for detecting deep discharge temporary degradation. The fourth embodiment is substantially identical to the first embodiment with respect to other points. Accordingly, constitutional elements of the fourth embodiment identical to the corresponding constitutional elements of the first embodiment are given same reference symbols and repeated description of these constitutional elements is omitted, and only the configurations which differ from the corresponding configurations of the first embodiment are described.

FIG. 20 is an explanatory view showing one example of a relationship between the transition of a charge voltage and a degree of deep discharge temporary degradation. A charge voltage is a terminal voltage V of the secondary battery 112 when the secondary battery 112 is charged by CC charge. FIG. 20 shows a portion of the transition of a charge voltage when a lowest value of the SOC is changed within a predetermined range (that is, a depth of discharge is changed) under the above-mentioned conditions 1, 2 and, thereafter, the secondary battery 112 is charged to 100% from 80%.

As shown in FIG. 20, the larger a degree of the deep discharge temporary degradation (in other words, the larger a depth of discharge), the smaller a ratio of a change amount of charge voltage of the secondary battery 112 to a change amount of an SOC when a charge voltage of the secondary battery 112 reaches a prescribed voltage (hereinafter referred to as "inclination value") becomes (that is, the charge voltage steeply shifting to the prescribed voltage). In other words, the larger a degree of the deep discharge temporary degradation, the larger an inverse number of the ratio (inclination value) becomes. From this result, the occurrence of deep discharge temporary degradation can be detected by comparing an inclination value (or an inverse number of the inclination value) with a preset inclination threshold value. Further, it is also determined that the smaller the inclination value (or the larger an inverse number of an inclination value), the larger a degree of deep discharge temporary degradation becomes. In the above-mentioned processing, in place of an SOC, a capacity of the secondary battery 112 can also be used. That is, the BM 130 can detect the occurrence of temporary degradation of the secondary battery 112 using a magnitude relationship between a ratio of a change amount of a voltage of the secondary battery 112 to a change amount of SOC or a capacity at which a voltage of the secondary battery 112 reaches a prescribed voltage or an inverse number of the ratio and a threshold value.

In this embodiment, the BM 130 of the battery pack 100 (FIG. 1) performs management processing for detecting the occurrence of deep discharge temporary degradation of the secondary battery 112. FIG. 21 is a flowchart showing the flow of management processing of the secondary battery.

First, the CPU 132 of the BM 130 determines whether or not the secondary battery 112 is in the midst of CC charge (S410). This determination can be made by various known methods. For example, the CPU 132 can determine whether or not the secondary battery 112 is in the midst of CC charge based on a control instruction from a host computer such as an ECU not shown in the drawings or the charger 200 or a measurement result of a charge-discharge current I detected by the current sensor 140. When the CPU 132 determines that the secondary battery 112 is not in the midst of CC charge (S410: NO), CPU 132 advances to the processing in step S280.

On the other hand, when the CPU 132 determines that the secondary battery 112 is in the midst of CC charge (S410: YES), the CPU 132 acquires a value of a first SOC of the secondary battery 112 when a terminal voltage V of the secondary battery 112 becomes a first charge voltage value (S420). To be more specific, the CPU 132 determines whether or not the terminal voltage V of the secondary battery 112 becomes the first charge voltage value based on a measurement result of the voltage sensor 122. When the CPU 132 determines that the terminal voltage V of the secondary battery 112 becomes the first charge voltage value, the CPU 132 acquires the value of the SOC of the secondary battery 112 at this point of time, and stores the acquired value in the memory 134 as a value of the first SOC.

Next, the CPU 132 acquires a value of a second SOC of the secondary battery 112 when a terminal voltage V of the secondary battery 112 becomes a second charge voltage value (S430). To be more specific, the CPU 132 determines whether or not the terminal voltage V of the secondary battery 112 becomes the second charge voltage value based on a measurement result of the voltage sensor 122. The second charge voltage value is a value larger than the first charge voltage value and is also a value equal to or less than the prescribed voltage. Hereinafter, assume that the second charge voltage value is the prescribed voltage. When the CPU 132 determines that the terminal voltage V of the secondary battery 112 becomes the second charge voltage value, the CPU 132 acquires the value of the SOC of the secondary battery 112 at this point of time, and stores the acquired value in the memory 134 as a value of the second SOC.

The CPU 132 calculates an inclination value (=|first charge voltage value—second charge voltage value|/|value of first SOC—value of second SOC|) based on a first charge voltage value, a second charge voltage value, a value of a first SOC and a value of a second SOC (S440). The CPU 132 determines whether or not the calculated inclination value is equal to or less than a preset inclination threshold value (S450). The inclination threshold value is an inclination value when a degree of deep discharge temporary degradation is at a predetermined level. Hereinafter, the predetermined level is a level when deep discharge temporary degradation does not exist, that is, when deep discharge temporary degradation is zero.

When the CPU 132 determines that the calculated inclination value is larger than the inclination threshold value (S450: NO), the processing advances to processing in step S280. On the other hand, when the CPU 132 determines that the calculated inclination value is equal to or smaller than the inclination threshold value (S450: YES), the CPU 132 detects the occurrence of deep discharge temporary degradation in the secondary battery 112 (S460). Further, the CPU 132 determines a degree of deep discharge temporary degradation based on a differential value between the calculated inclination value and the inclination threshold value (S470). To be more specific, the CPU 132 determines that the larger a differential value, the larger a degree of deep discharge temporary degradation becomes. A state that a calculated inclination value is equal to or less than an inclination threshold value is one example of predetermined conditions.

As has been described heretofore, in this embodiment, the CPU 132 of the BM 130 acquires an inclination value of the secondary battery 112, and detects the occurrence of deep discharge temporary degradation in the secondary battery 112 when the acquired inclination value is equal to or less than an inclination threshold value set in advance and hence, a user can accurately grasp performances of the secondary battery 112. Accordingly, for example, the CPU 132 can notify the occurrence of deep discharge temporary degradation in the secondary battery 112 and can properly control the secondary battery by taking into account the influence of deep discharge temporary degradation.

Further, the CPU 132 determines that the smaller an acquired inclination value, the larger a degree of deep discharge temporary degradation becomes and hence, performances of the secondary battery 112 can be further accurately grasped. Accordingly, the CPU 132 can notify a degree of deep discharge temporary degradation which occurs in the secondary battery 112 or accurately control the secondary battery 112 by taking into account a degree of deep discharge temporary degradation.

E. Fifth Embodiment:

The fifth embodiment describes a method for controlling a secondary battery when the occurrence of deep discharge temporary degradation is detected by the method for detecting deep discharge temporary degradation according to any one of the first to fourth embodiments. As shown in FIG. 5 and FIG. 6, in the secondary battery where deep discharge temporary degradation occurs, compared to the secondary battery where deep discharge temporary degradation does not occur, a correspondence relationship between a state value indicating a state of the secondary battery such as a charge voltage or a charge current and an SOC changes and hence, the secondary battery where deep discharge temporary degradation occurs is influenced by deep discharge temporary degradation. Accordingly, it is desirable to take into account the influence of the deep discharge temporary degradation in controlling the secondary battery.

The inventors of the present invention have come up with a method of controlling a secondary battery which takes into account the influence exerted by deep discharge temporary degradation. In this method of controlling a secondary battery, first correspondence information which indicates a correspondence relationship between an SOC and a state value of a secondary battery where deep discharge temporary degradation does not occur and second correspondence information which indicates a correspondence relationship between an SOC and a state value of a secondary battery where deep discharge temporary degradation occurs are acquired in advance, the acquired first and second correspondence information are stored in the memory 134, and the secondary battery 112 is controlled using the first and second correspondence information. Hereinafter, constitutional elements of the fifth embodiment identical to the corresponding constitutional elements of the first embodiment are given same reference symbols and repeated description of these constitutional elements is omitted.

E-1. Case where State Value is OCV

Next, the specific flow of control processing is described. First, a method for controlling a secondary battery 112 when a state value is OCV is described with reference to FIG. 18 and FIG. 22. As shown in FIG. 18, in the memory 134, correspondence information on an SOC-OCV characteristic in the secondary battery where deep discharge temporary degradation does not occur (hereinafter referred to as "OCV characteristic information at a normal time") and correspondence information on an SOC-OCV characteristic in the secondary battery where deep discharge temporary degradation occurs (hereinafter referred to as "OCV characteristic information at a deep discharge degradation time") are stored in advance. In this embodiment, among two OCV characteristic information at a deep discharge degradation time shown in FIG. 18, the information having a larger degree of deep discharge temporary degradation is stored.

Figure 22:
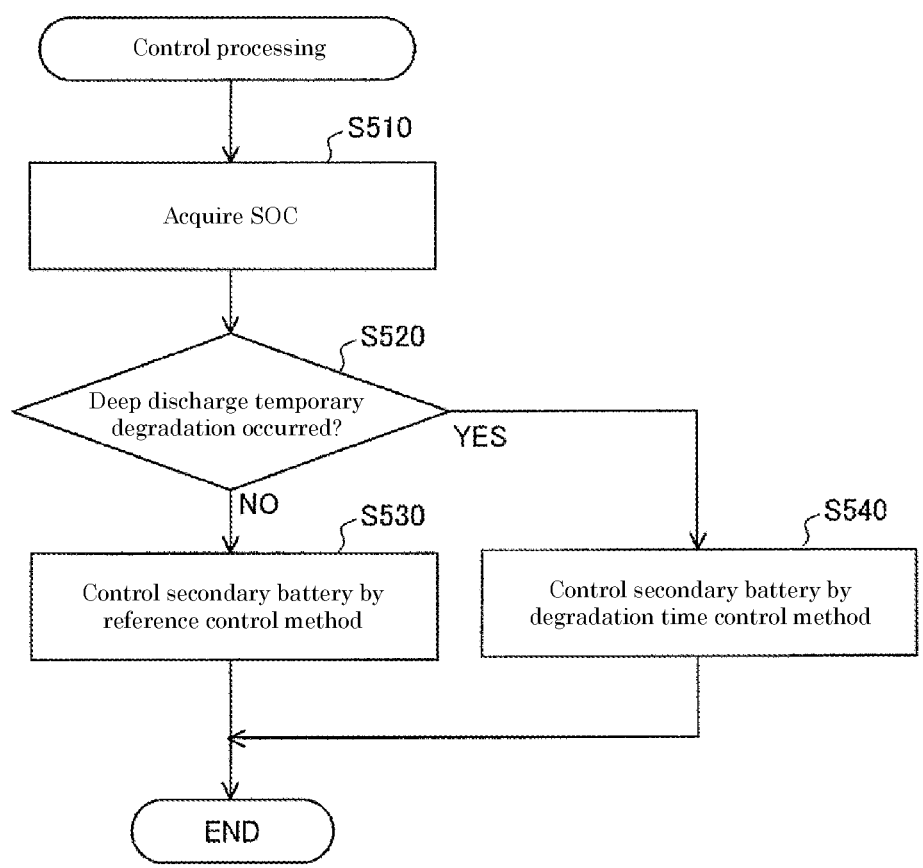
FIG. 22 is a flowchart showing the flow of control processing of the secondary battery.

The BM 130 of the battery pack 100 according to this embodiment (FIG. 1) performs control processing of the secondary battery 112. FIG. 22 is a flowchart showing the flow of control processing of the secondary battery. The control processing of the secondary battery is started at a timing that a predetermined start instruction is inputted (for example, at a timing that an ignition is brought into an ON state in a case where the battery pack 100 is mounted on an electric vehicle).

First, the CPU 132 of the BM 130 acquires a value of an SOC (S510). For example, the CPU 132 estimates a value of an OCV based on a terminal voltage V of the secondary battery 112 which is measured using the voltage sensor 122 of the CS 120, and acquire a value of the SOC by looking up the OCV characteristic information at a normal time which is initialized.

The CPU 132 determines whether or not deep discharge temporary degradation occurs in the secondary battery 112 based on the acquired value of the SOC (S520). To be more specific, the CPU 132, in the same manner as the method for detecting deep discharge temporary degradation according to the first embodiment, determines whether or not a value of the acquired SOC is equal to or less than a preset threshold value. When the value of the acquired SOC is more than the preset threshold value, the CPU 132 determines that the deep discharge temporary degradation does not occur (S520: NO). In this case, the CPU 132 controls the secondary battery 112 by a reference control method (S530). To be more specific, the CPU 132 controls the secondary battery 112 using the OCV characteristic information at a normal time. For example, when a value of the OCV of the secondary battery 112 becomes a prescribed voltage value KV, the CPU 132 estimates that a value of the SOC of the secondary battery 112 becomes SO1.

On the other hand, when the value of the acquired SOC is equal to or less than the threshold value, the CPU 132 determines that the deep discharge temporary degradation occurs (S520: YES). In this case, the CPU 132 controls the secondary battery 112 by a control method at a degradation time (S540). To be more specific, the CPU 132 controls the secondary battery 112 using the OCV characteristic information at a deep discharge degradation time. For example, when a value of the OCV of the secondary battery 112 becomes a prescribed voltage value KV, the CPU 132 estimates that a value of the SOC of the secondary battery 112 becomes SO2.

As shown in FIG. 18, the SOC-OCV characteristic at a deep discharge degradation time is, in the whole SOC region, shifted to a high OCV side with respect to the SOC-OCV characteristic at a normal time and hence, SO2 which corresponds to the prescribed voltage value KV in the OCV characteristic information at a deep discharge degradation time is small compared to SO1 which corresponds to the prescribed voltage value KV in the OCV characteristic information at a normal time. Accordingly, in the case where the SOC of the secondary battery 112 is estimated using the OCV characteristic information at a normal time even when the deep discharge temporary degradation occurs, there is a possibility that, as the estimated SOC of the secondary battery 112, a value which is larger than the actual SOC of the secondary battery 112 is estimated so that overdischarge or the like occurs, for example.

In this embodiment, when the deep discharge temporary degradation occurs, in response to temporary lowering of performances of the secondary battery 112, the SOC of the secondary battery 112 is estimated using the OCV characteristic information at a deep discharge degradation time which differs from the OCV characteristic information at a normal time where the deep discharge temporary degradation does not occur. Accordingly, compared to the case where the SOC of the secondary battery 112 is estimated using the OCV characteristic information at a normal time, the value of the SOC of the secondary battery 112 can be estimated to be small and hence, the occurrence of overdischarge or the like can be suppressed.

E-2. Case where State Value is Discharge Voltage at Minute Discharge Time

Next, a method of controlling the secondary battery 112 in a case where a state value is a discharge voltage at a minute discharge time is described with reference to FIG. 15. Minute discharge is, for example, a voltage value of the secondary battery 112 when a discharge current amount of the secondary battery 112 per unit time is 300 mA or less. In the memory 134, correspondence information on an SOC-discharge voltage characteristic in the secondary battery where deep discharge temporary degradation does not occur (hereinafter referred to as "discharge voltage characteristic information at a normal time") and correspondence information on an SOC-discharge voltage in the secondary battery where deep discharge temporary degradation occurs (hereinafter referred to as "discharge voltage characteristic information at a deep discharge degradation time") are stored in advance. In this embodiment, among two OCV characteristic information at a deep discharge degradation time shown in FIG. 15, the information having a larger degree of deep discharge temporary degradation is stored.

A method for controlling the secondary battery 112 when a state value is a discharge voltage at a minute discharge time differs from a method for controlling the secondary battery 112 when a state value is an OCV with respect to characteristic information used by the method. That is, when the CPU 132 determines that deep discharge temporary degradation does not occur, the CPU 132 controls the secondary battery 112 by the reference control method (S530 in FIG. 22). To be more specific, the CPU 132 controls the secondary battery 112 using discharge voltage characteristic information at a normal time. For example, the CPU 132, when a value of a discharge voltage of the secondary battery 112 reaches a prescribed voltage value KV, estimates that a value of an SOC of the secondary battery 112 becomes SO3A.

On the other hand, when the CPU 132 determines that deep discharge temporary degradation occurs, the CPU 132 controls the secondary battery 112 by a degradation time control method (S540 in FIG. 22). To be more specific, the CPU 132 controls the secondary battery 112 using discharge voltage characteristic information at a deep discharge degradation time. For example, the CPU 132, when a value of a discharge voltage of the secondary battery 112 reaches a prescribed voltage value KV, estimates that a value of an SOC of the secondary battery 112 becomes SO4A.

As shown in FIG. 15, the SOC-discharge voltage characteristic at a deep discharge degradation time is, in the whole SOC region, shifted to a high voltage side with respect to the SOC-discharge voltage characteristic at a normal time and hence, SO4A which corresponds to the prescribed voltage value KV in the discharge voltage characteristic information at a deep discharge degradation time is small compared to SO3A which corresponds to the prescribed voltage value KV in the discharge voltage characteristic information at a normal time. Accordingly, in the case where the SOC of the secondary battery 112 is estimated using the discharge voltage characteristic information at a normal time even when the deep discharge temporary degradation occurs, there is a possibility that, as the estimated SOC of the secondary battery 112, a value which is larger than the actual SOC of the secondary battery 112 is estimated so that overdischarge or the like occurs, for example.

In this embodiment, when deep discharge temporary degradation occurs, in response to temporary lowering of performances of the secondary battery 112, the SOC of the secondary battery 112 is estimated using the discharge voltage characteristic information at a deep discharge degradation time which differs from the discharge voltage characteristic information at a normal time where the deep discharge temporary degradation does not occur. Accordingly, compared to the case where the SOC of the secondary battery 112 is estimated using the discharge voltage characteristic information at a normal time, the value of the SOC of the secondary battery 112 can be estimated to be small and hence, the occurrence of overdischarge or the like can be suppressed.

On the other hand, as shown in FIG. 17, in other degradations, an SOC-discharge voltage characteristic when the degradation occurs is shifted to a low voltage side with respect to an SOC-discharge voltage characteristic when the degradation does not occur in the whole SOC region. Accordingly, unlike the case of deep discharge temporary degradation shown in FIG. 15, SO4B which corresponds to a prescribed voltage value KV of the SOC-discharge voltage characteristic when the degradation occurs becomes large compared to SO3B which corresponds to a prescribed voltage value KV of the SOC-discharge voltage characteristic when the degradation does not occur.

Accordingly, when the deep discharge temporary degradation occurs, in the same manner as cases where other degradations occur, when an SOC of the secondary battery 112 is estimated using an SOC-discharge voltage characteristic shifted toward a low voltage side with respect to an SOC-discharge voltage characteristic when the degradation does not occur, there is a possibility that, as the estimated SOC of the secondary battery 112, a value which is larger than the actual SOC of the secondary battery 112 is estimated so that overdischarge or the like occurs, for example. In this embodiment, when the deep discharge temporary degradation occurs, an SOC of the secondary battery 112 is estimated using an SOC-discharge voltage characteristic (a discharge voltage characteristic at a deep discharge degradation time) which is shifted toward a high voltage side with respect to an SOC-discharge voltage characteristic (a discharge voltage characteristic at a normal time) when the degradation does not occur and hence, the secondary battery 112 can be controlled while being differentiated from other degradations.

Figure 23A:
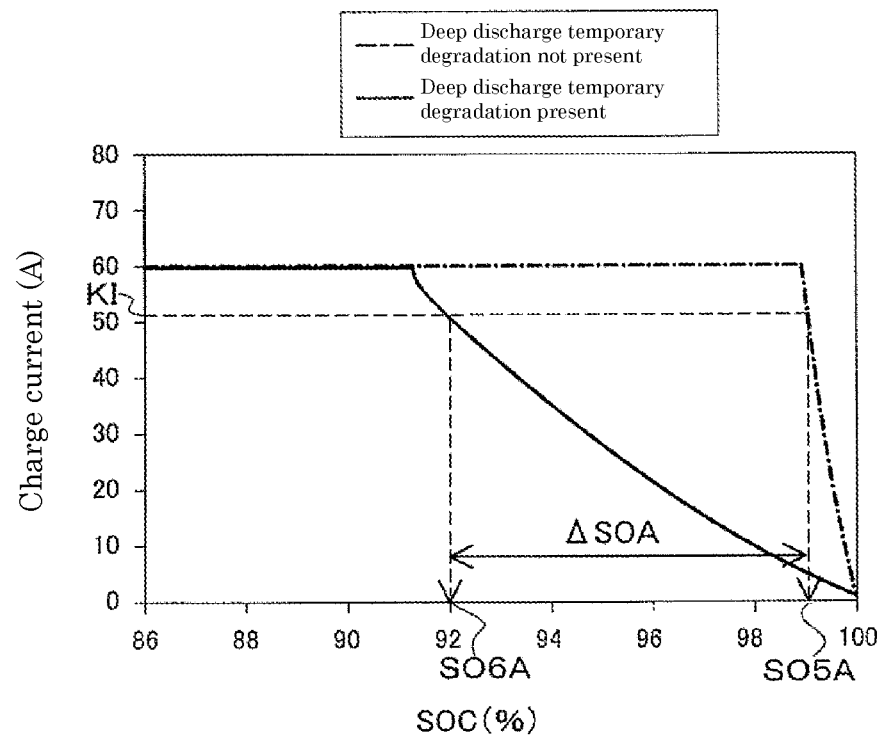
FIG. 23A is an explanatory view showing an SOC-charge current characteristic at the time of constant voltage charge of the secondary battery.

E-3. Case where State Value is Charge Current at CV Charge Time:

Next, a method of controlling the secondary battery 112 in a case where a state value is a charge current at a CV charge time is described with reference to FIG. 23A. FIG. 23A is an explanatory view showing an SOC-charge current characteristic of the secondary battery 112. In the memory 134, correspondence information on an SOC-charge current characteristic in the secondary battery where deep discharge temporary degradation does not occur (hereinafter referred to as "charge current characteristic information at a normal time") and correspondence information on an SOC-charge current in the secondary battery where deep discharge temporary degradation occurs (hereinafter referred to as "charge current characteristic information at a deep discharge degradation time") are stored in advance.

A method for controlling the secondary battery 112 when a state value is a charge current at a CV charge time differs from a method for controlling the secondary battery 112 when a state value is an OCV with respect to characteristic information used by the method. That is, when the CPU 132 determines that deep discharge temporary degradation does not occur, the CPU 132 controls the secondary battery 112 by the reference control method (S530 in FIG. 22). To be more specific, the CPU 132 controls the secondary battery 112 using charge current characteristic information at a normal time. For example, the CPU 132, when a value of a charge current of the secondary battery 112 reaches a prescribed current value KI, estimates that a value of an SOC of the secondary battery 112 becomes SO5A.

On the other hand, when the CPU 132 determines that deep discharge temporary degradation occurs, the CPU 132 controls the secondary battery 112 by a degradation time control method (S540 in FIG. 22). To be more specific, the CPU 132 controls the secondary battery 112 using charge current characteristic information at a deep discharge degradation time. For example, the CPU 132, when a value of a discharge voltage of the secondary battery 112 reaches a prescribed current value KI, estimates that a value of an SOC of the secondary battery 112 becomes SO6A.

As shown in FIG. 23A, in an SOC-charge current characteristic at a deep discharge degradation time, a discharge current droops from an SOC which is lower than an SOC in an SOC-charge current characteristic at a normal time and hence, SO6A which corresponds to the prescribed current value KI in the charge current characteristic information at a deep discharge degradation time is small compared to SO5A which corresponds to the prescribed current value KI in the charge current characteristic information at a normal time. Accordingly, in the case where the SOC of the secondary battery 112 is estimated using the charge current characteristic information at a normal time even when the deep discharge temporary degradation occurs, there is a possibility that, as the estimated SOC of the secondary battery 112, a value which is larger than the actual SOC of the secondary battery 112 is estimated so that overdischarge or the like occurs, for example.

In this embodiment, when the deep discharge temporary degradation occurs, in response to temporary lowering of performances of the secondary battery 112, the SOC of the secondary battery 112 is estimated using the charge current characteristic information at a deep discharge degradation time which differs from the charge current characteristic information at a normal time where the deep discharge temporary degradation does not occur. Accordingly, compared to the case where the SOC of the secondary battery 112 is estimated using the charge current characteristic information at a normal time, the value of the SOC of the secondary battery 112 can be estimated to be small and hence, the occurrence of overdischarge or the like can be suppressed.

Figure 23B:
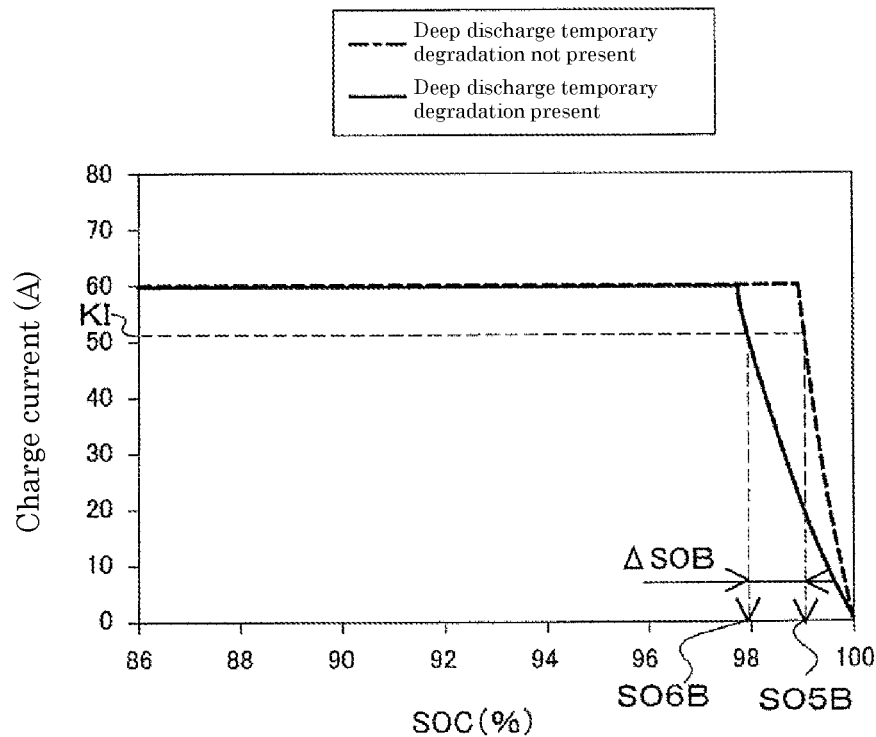
FIG. 23B is an explanatory view showing an SOC-charge current characteristic at the time of constant voltage charge of the secondary battery.

FIG. 23B is an explanatory view showing an SOC-charge current characteristic of the secondary battery 112 having a larger degree of degradation with a lapse of time than the secondary battery 112 having the characteristic shown in FIG. 23A. An SOC-charge current characteristic at a normal time in FIG. 23B is substantially equal to the SOC-charge current characteristic at a normal time in FIG. 23A. On the other hand, the SOC-charge current characteristic at a deep discharge degradation time shown in FIG. 23B is shifted toward a side of the SOC-charge current characteristic at a normal time with respect to the SOC-charge current characteristic at a deep discharge degradation time shown in FIG. 23A. Accordingly, a degree of deep discharge temporary degradation changes corresponding to a degree of degradation with a lapse of time of the secondary battery 112. The degree of degradation with a lapse of time of the secondary battery 112 can be expressed using an index value correlated with the degradation with a lapse of time such as internal resistance, capacity, the number of years in use, the number of charge-discharge cycles of the secondary battery 112, for example.

In the secondary battery 112 shown in FIG. 23A, a degree of deep discharge temporary degradation is expressed as capacity difference $\Delta SOA(=|SO5A-SO6A|)$ of a value of an SOC which corresponds to a prescribed current value KI. In the secondary battery 112 shown in FIG. 23B, a degree of deep discharge temporary degradation is expressed as capacity difference $\Delta SOB(=|SO5B-SO6B|)$ of a value of an SOC which corresponds to the prescribed current value KI. To compare the capacity difference $\Delta SOA$ and the capacity difference $\Delta SOB$ with each other, the capacity difference $\Delta SOB$ is smaller than the capacity difference $\Delta SOA$. That is, the larger a degree of degradation of the secondary battery 112 with a lapse of time, the smaller a degree of deep discharge temporary degradation becomes.

Accordingly, the memory 134 stores charge current characteristic information at a normal time and charge current characteristic information at a deep discharge degradation time which correspond to the plurality of degrees of degradation of the secondary battery 112 with a lapse of time. To be more specific, the degree of degradation of the secondary battery 112 with a lapse of time is set into a plurality of different ranges, and charge current characteristic information at a normal time and charge current characteristic information at a deep discharge degradation time which correspond to the respective ranges are stored in the memory 134. Then, the larger the degree of degradation with a lapse of time which corresponds to each range, the smaller the capacity difference ΔSO which corresponds to a prescribed current value KI of an SOC-charge current characteristic is set. With such processing, an SOC of the secondary battery 112 can be estimated by taking into account influence exerted by the degradation of the secondary battery 112 with a lapse of time.

Charge current characteristic information at a normal time and charge current characteristic information at a deep discharge degradation time which correspond to the respective ranges may be acquired in advance using secondary batteries which differ in a degree of degradation with a lapse of time or may be acquired by correcting charge current characteristic information at a normal time and a charge current characteristic information at a deep discharge degradation time which correspond to specified ranges.

Figure 24A:
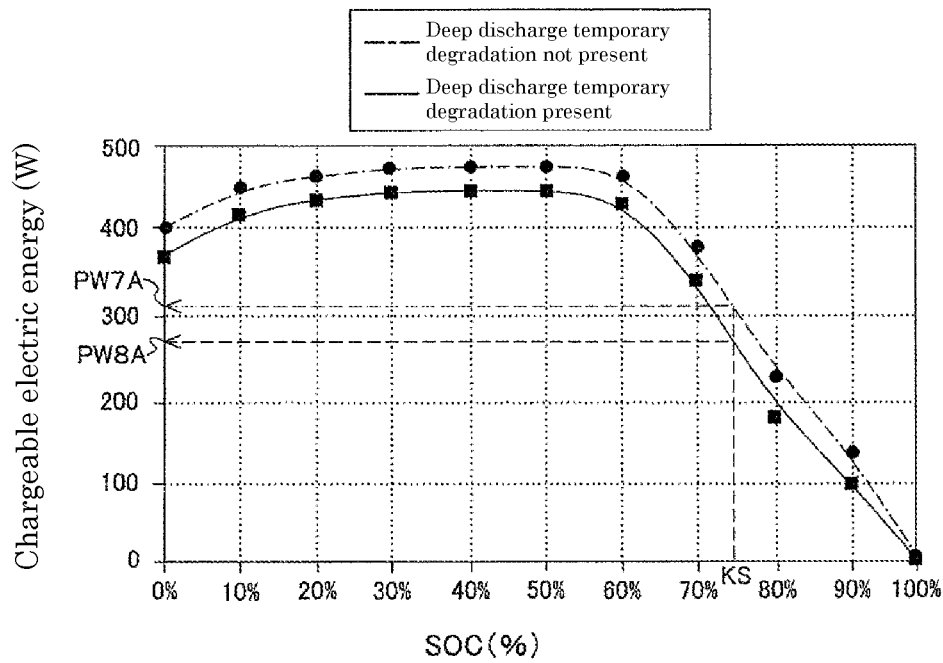
FIG. 24A is an explanatory view showing an SOC-chargeable electric energy characteristic of the secondary battery.

E-4. Case where State Value is Chargeable Electric Energy:

Next, a method of controlling the secondary battery 112 in a case where a state value is chargeable electric energy is described with reference to FIG. 24A. FIG. 24A is an explanatory view showing an SOC-chargeable electric energy characteristic of the secondary battery 112. Chargeable electric energy means electric energy which the secondary battery 112 can charge until the secondary battery 112 reaches a prescribed voltage from a present state. A chargeable map indicating an SOC-chargeable electric energy characteristic changes in response to a temperature of the secondary battery 112. FIG. 24A shows the chargeable map when the temperature of the secondary battery 112 is 25° C. In the memory 134, correspondence information on a chargeable map in the secondary battery where deep discharge temporary degradation does not occur (hereinafter referred to as "chargeable characteristic information at a normal time") and correspondence information on a chargeable map in the secondary battery where deep discharge temporary degradation occurs (hereinafter referred to as "chargeable characteristic information at a deep discharge degradation time") are stored in advance for respective temperatures.

A method for controlling the secondary battery 112 when a state value is chargeable electric energy differs from a method for controlling the secondary battery 112 when a state value is an OCV with respect to characteristic information used by the methods. That is, when the CPU 132 determines that deep discharge temporary degradation does not occur, the CPU 132 controls the secondary battery 112 by the reference control method (S530 in FIG. 22). To be more specific, the CPU 132 controls the secondary battery 112 using chargeable characteristic information at a normal time. For example, the CPU 132, when a value of an SOC of the secondary battery 112 reaches a prescribed value KS, estimates that a value of chargeable electric energy of the secondary battery 112 becomes PW7A.

On the other hand, when the CPU 132 determines that deep discharge temporary degradation occurs, the CPU 132 controls the secondary battery 112 by a degradation time control method (S540 in FIG. 22). To be more specific, the CPU 132 controls the secondary battery 112 using chargeable characteristic information at a deep discharge degradation time. For example, the CPU 132, when a value of an SOC of the secondary battery 112 reaches a prescribed value KS, estimates that a value of chargeable electric energy of the secondary battery 112 becomes PW8A.

As shown in FIG. 24A, the chargeable map at a deep discharge degradation time is, in the whole SOC region, shifted to a low electric energy side with respect to the chargeable map at a normal time and hence, PW8A which corresponds to a prescribed value KS in the chargeable characteristic information at a deep discharge degradation time is small compared to PW7A which corresponds to the prescribed value KS in the chargeable characteristic information at a normal time. Accordingly, in the case where the chargeable electric energy of the secondary battery 112 is estimated using the chargeable characteristic information at a normal time even when the deep discharge temporary degradation occurs, there is a possibility that, as the estimated chargeable electric energy of the secondary battery 112, a value which is larger than the actual chargeable electric energy of the secondary battery 112 is estimated so that overcharge or the like occurs, for example.

In this embodiment, when the deep discharge temporary degradation occurs, in response to temporary lowering of performances of the secondary battery 112, the SOC of the secondary battery 112 is estimated using the chargeable characteristic information at a deep discharge degradation time which differs from the chargeable characteristic information at a normal time where the deep discharge temporary degradation does not occur. Accordingly, compared to the case where the chargeable electric energy of the secondary battery 112 is estimated using the chargeable characteristic information at a normal time, the value of the chargeable electric energy of the secondary battery 112 can be estimated to be small and hence, the occurrence of overcharge or the like can be suppressed.

Figure 24B:
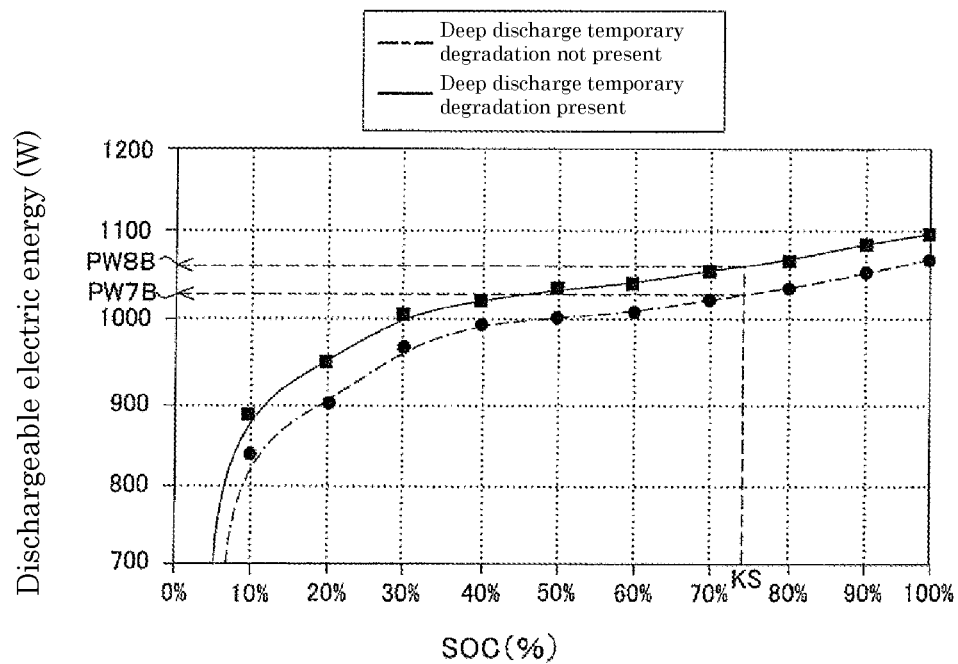
FIG. 24B is an explanatory view showing an SOC-dischargeable electric energy characteristic of the secondary battery.

E-5. Case where State Value is Dischargeable Electric Energy:

Next, a method of controlling the secondary battery 112 in a case where a state value is dischargeable electric energy is described with reference to FIG. 24B. FIG. 24B is an explanatory view showing an SOC-dischargeable electric energy characteristic of the secondary battery 112. Dischargeable electric energy means electric energy which the secondary battery 112 can discharge until the secondary battery 112 reaches a prescribed voltage from a present state. A dischargeable map indicating an SOC-dischargeable electric energy characteristic, in the same manner as the chargeable map, changes in response to a temperature of the secondary battery 112. FIG. 24B shows the dischargeable map when the temperature of the secondary battery 112 is 25° C. In the memory 134, correspondence information on a dischargeable map in the secondary battery where deep discharge temporary degradation does not occur (hereinafter referred to as "dischargeable characteristic information at a normal time") and correspondence information on a dischargeable map in the secondary battery where deep discharge temporary degradation occurs (hereinafter referred to as "dischargeable characteristic information at a deep discharge degradation time") are stored in advance for respective temperatures.

A method for controlling the secondary battery 112 when a state value is dischargeable electric energy differs from a method for controlling the secondary battery 112 when a state value is an OCV with respect to characteristic information used by the method. That is, when the CPU 132 determines that deep discharge temporary degradation does not occur, the CPU 132 controls the secondary battery 112 by the reference control method (S530 in FIG. 22). To be more specific, the CPU 132 controls the secondary battery 112 using dischargeable characteristic information at a normal time. For example, the CPU 132, when a value of an SOC of the secondary battery 112 reaches a prescribed value KS, estimates that a value of dischargeable electric energy of the secondary battery 112 becomes PW7B.

On the other hand, when the CPU 132 determines that deep discharge temporary degradation occurs, the CPU 132 controls the secondary battery 112 by a degradation time control method (S540 in FIG. 22). To be more specific, the CPU 132 controls the secondary battery 112 using dischargeable characteristic information at a deep discharge degradation time. For example, the CPU 132, when a value of an SOC of the secondary battery 112 reaches a prescribed value KS, estimates that a value of dischargeable electric energy of the secondary battery 112 becomes PW8B.

As shown in FIG. 24B, the dischargeable map at a deep discharge degradation time is, in the whole SOC region, shifted to a high electric energy side with respect to the dischargeable map at a normal time and hence, PW8B which corresponds to a prescribed value KS in the dischargeable characteristic information at a deep discharge degradation time is large compared to PW7B which corresponds to the prescribed value KS in the dischargeable characteristic information at a normal time. Accordingly, in the case where the dischargeable electric energy of the secondary battery 112 is estimated using the dischargeable characteristic information at a normal time even when the deep discharge temporary degradation occurs, there is a possibility that, as the estimated dischargeable electric energy of the secondary battery 112, a value which is smaller than the actual dischargeable electric energy of the secondary battery 112 is estimated so that overdischarge or the like occurs, for example.

In this embodiment, when the deep discharge temporary degradation occurs, in response to temporary lowering of performances of the secondary battery 112, the SOC of the secondary battery 112 is estimated using the dischargeable characteristic information at a deep discharge degradation time which differs from the dischargeable characteristic information at a normal time where deep discharge temporary degradation does not occur. Accordingly, compared to the case where the dischargeable electric energy of the secondary battery 112 is estimated using the dischargeable characteristic information at a normal time, the value of the dischargeable electric energy of the secondary battery 112 can be estimated to be large and hence, the occurrence of overdischarge or the like can be suppressed.

F. Sixth Embodiment:

FIG. 25 to FIG. 27C show the sixth embodiment. In the sixth embodiment, among methods for controlling a secondary battery when the occurrence of deep discharge temporary degradation is detected, a method for equalizing a secondary battery is described. The method for equalizing a secondary battery is a method which is performed after the completion of charging of the secondary battery by CCCV charge, and equalizes electric capacities stored in the respective cells 114 by individually discharging the respective cells 114. Hereinafter, constitutional elements of the sixth embodiment identical to the corresponding constitutional elements of the first embodiment are given same reference symbols and repeated description of these constitutional elements is omitted.

Figure 25:
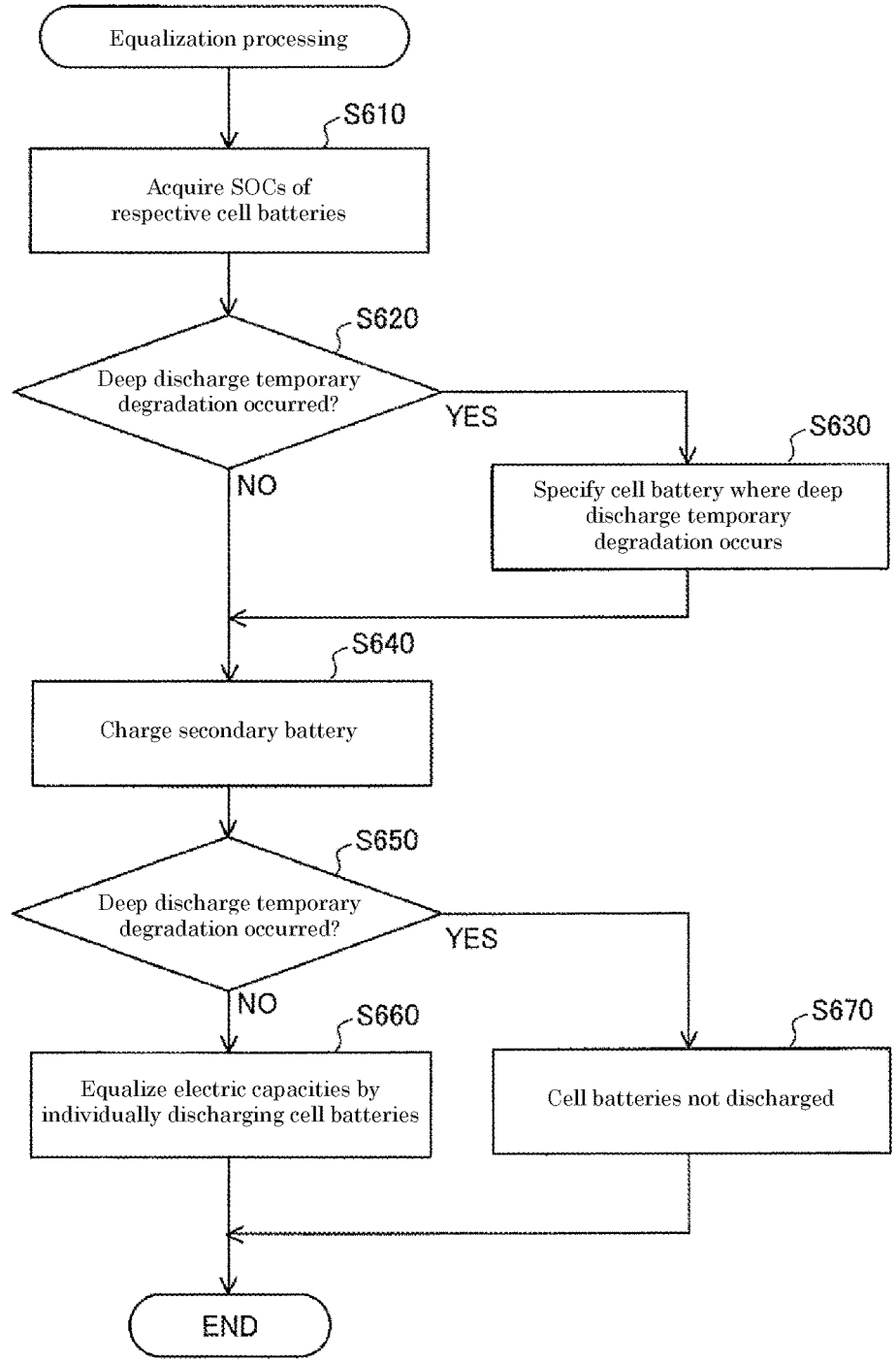
FIG. 25 is a flowchart showing equalization processing of the secondary battery.

The BM 130 of the battery pack 100 according to this embodiment (FIG. 1) performs equalization processing of the secondary battery 112. FIG. 25 is a flowchart showing the flow of equalization processing of the secondary battery. The equalization processing of the secondary battery is, for example, in the case where the battery pack 100 is mounted on an electric vehicle, started at a timing that the electric vehicle is connected to the charger 200 in a charge stand or the like.

First, the CPU 132 acquires a value of an SOC of each cell 114 (S610), and determines whether or not deep discharge temporary degradation occurs in each cell 114 (S620). To be more specific, the CPU 132, using the method for detecting deep discharge temporary degradation described in the first embodiment, determines whether or not a value of an acquired SOC of each cell 114 is equal to or less than a preset threshold value.

Figure 26A:
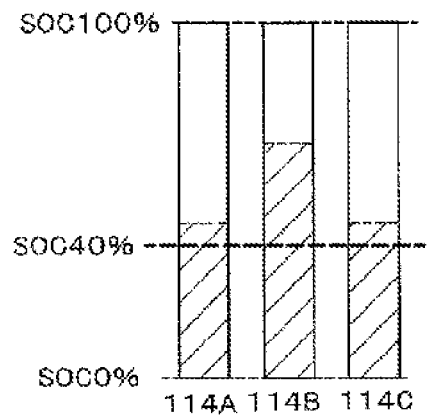
FIG. 26A is a conceptual view showing an electric capacity of each cell.

FIG. 26A to FIG. 26C and FIG. 27A to FIG. 27C are explanatory views showing electric capacities capable of storing until terminal voltages ΔV of the respective cells 114A to 114C become a charge completion voltage EV. A hatched portion indicates electric capacities actually stored in the respective cells 114A to 114C. As shown in FIG. 26A to FIG. 26C and FIG. 27A to FIG. 27C, the electric capacities which are actually stored in the respective cells 114A to 114C do not agree with each other and hence, there may be a case where the difference in electric capacity, that is, imbalance of the electric capacity occurs. As shown in FIG. 26A, when all values of SOCs of the cells 114A to 114C are larger than a threshold value, the CPU 132 determines that the deep discharge temporary degradation does not occur (S620: NO). In this case, the CPU 132 advances to processing in step S640 without specifying the cell 114 where deep discharge temporary degradation occurs.

Figure 27A:
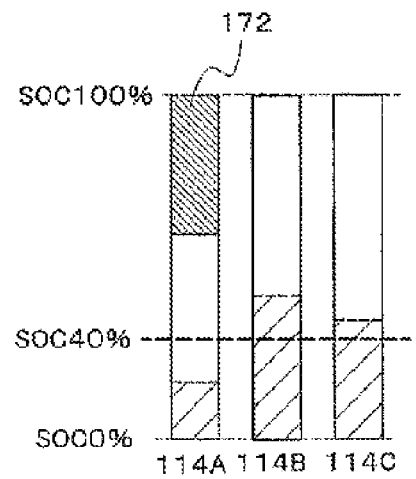
FIG. 27A is a conceptual view showing an electric capacity of each cell.

On the other hand, as shown in FIG. 27A, when at least one of the values of the SOCs of the cells 114A to 114C is equal to the threshold value, the CPU 132 determines that the deep discharge temporary degradation occurs (S620: YES), and specifies the cell 114A where deep discharge temporary degradation occurs (S630). As indicated by a hatched portion 172 in FIG. 27A, in the cell 114A where deep discharge temporary degradation occurs, due to the influence exerted by deep discharge temporary degradation, electric capacity which can be stored until a terminal voltage ΔV becomes a charge completion voltage EV is decreased.

Figure 26B:
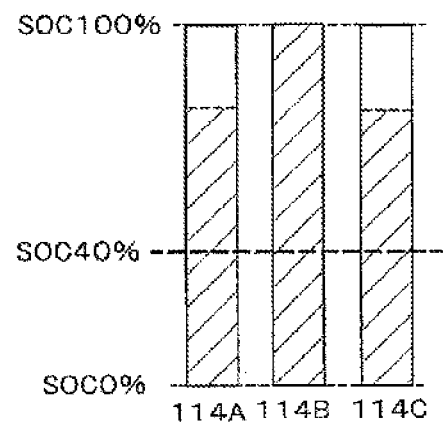
FIG. 26B is a conceptual view showing an electric capacity of each cell.
Figure 26C:
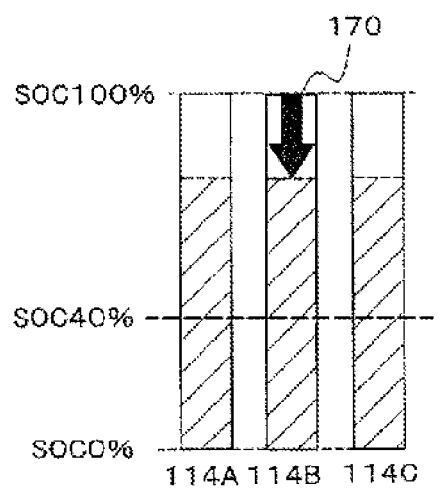
FIG. 26C is a conceptual view showing an electric capacity of each cell.
Figure 27B:
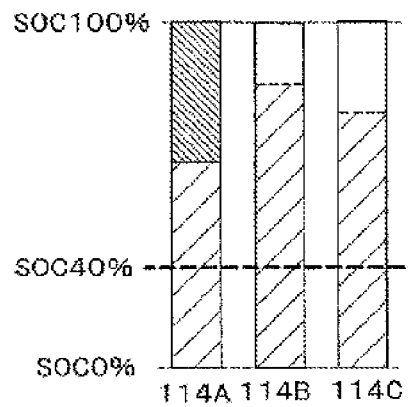
FIG. 27B is a conceptual view showing an electric capacity of each cell.

Next, the CPU 132 makes the charger 200 charge the secondary battery 112 (S640). As shown in FIG. 26B and FIG. 27B, when an individual discharge performing condition such as a condition that a terminal voltage ΔV of at least one of the cells 114A to 114C reaches a charge completion voltage EV is satisfied, charging of the secondary battery 112 is completed. In FIG. 26B, charging of the secondary battery 112 is completed when the terminal voltage ΔV of the cell 114B reaches the charge completion voltage EV. In FIG. 27B, charging of the secondary battery 112 is completed when the terminal voltage ΔV of the cell 114A reaches the charge completion voltage EV.

When charging of the secondary battery 112 is completed, the CPU 132 detects whether or not deep discharge temporary degradation occurs in the secondary battery 112 (S650). To be more specific, the CPU 132 detects whether or not the determination that deep discharge temporary degradation occurs in the secondary battery 112 is made in processing in step S650. When the determination that deep discharge temporary degradation occurs is not made (S650: NO), the CPU 132 discharges electric capacity stored in the cell 114B where a terminal voltage ΔV reaches a charge completion voltage EV as indicated by an arrow 170 in FIG. 26C using the discharge circuit 126 corresponding to the cell 114B. With such processing, electric capacities stored in the respective cells 114A to 114C are equalized (S660).

On the other hand, when the determination that deep discharge temporary degradation occurs in the secondary battery 112 is made (S650: YES), the CPU 132 does not discharge electric capacities of the respective cells 114A to 114C by the discharge unit 124 even when there exists the cell 114 which satisfies the individual discharge performing condition (S670).

Figure 27C:
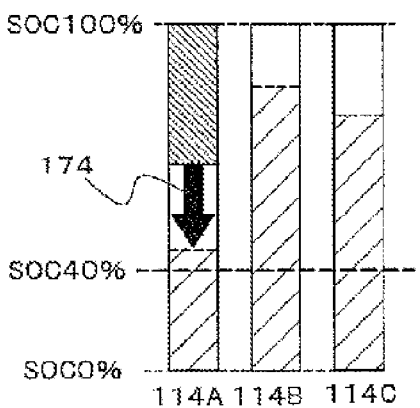
FIG. 27C is a conceptual view showing an electric capacity of each cell.

As described imaginarily in FIG. 27C, in the case where the determination that deep discharge temporary degradation occurs in the secondary battery 112 is made, when electric capacity stored in the cell 114A where a terminal voltage ΔV reaches a charge completion voltage EV is discharged as indicated by an arrow 174, electric capacity of the cell 114A where stored electric capacity is small compared to the cells 114B and 114C is further decreased. As a result, the difference between electric capacities stored in the respective cells 114A to 114C is enlarged compared to the difference between the electric capacities before the electric capacity stored in the cell 114A is discharged.

According to this embodiment, when deep discharge temporary degradation occurs, electric capacities of the respective cells 114A to 114C are not discharged by the discharge unit 124. That is, the electric capacities of the respective cells 114A to 114C are maintained in a state shown in FIG. 27B. Accordingly, the cell 114A where deep discharge temporary degradation occurs is discharged and hence, it is possible to suppress the enlargement of the difference between electric capacities stored in the respective cells 114A to 114C.

Figure 28A:
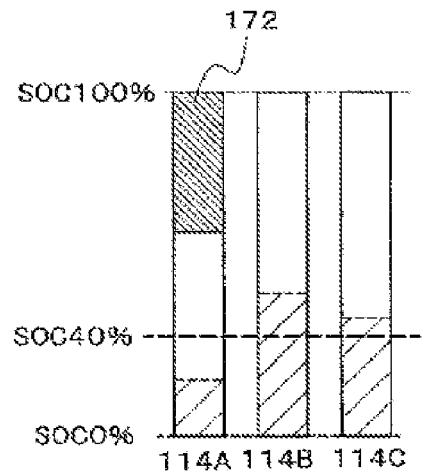
FIG. 28A is a conceptual view showing an electric capacity of each cell.
Figure 28B:
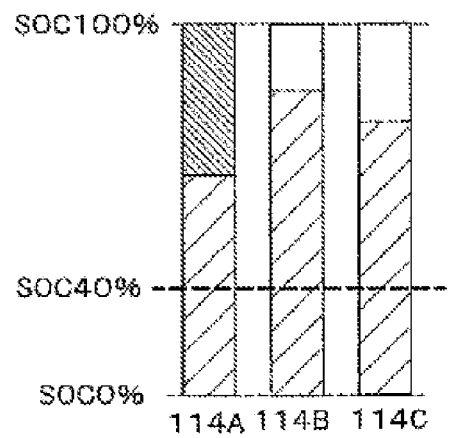
FIG. 28B is a conceptual view showing an electric capacity of each cell.
Figure 28C:
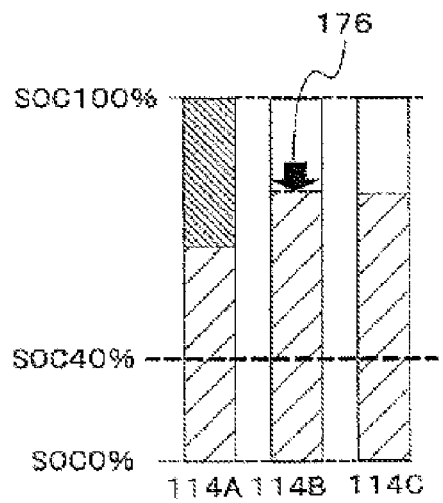
FIG. 28C is a conceptual view showing an electric capacity of each cell.

G. Seventh Embodiment:

FIG. 28A to FIG. 28C show the seventh embodiment. The seventh embodiment describes a method of equalizing a secondary battery when the occurrence of deep discharge temporary degradation is detected. The difference between this embodiment and the sixth embodiment lies in the cells 114 to which the equalization method is applied. The seventh embodiment is substantially identical to the sixth embodiment with respect to other points. Accordingly, hereinafter, constitutional elements of the seventh embodiment identical to the corresponding constitutional elements of the sixth embodiment are given same reference symbols and repeated description of these constitutional elements is omitted.

FIG. 28A to FIG. 28C are explanatory views showing electric capacities which can be stored until terminal voltages ΔV of the respective cells 114A to 114C become a charge completion voltage EV. As shown in FIG. 28C, in the equalization processing of this embodiment, when the determination that deep discharge temporary degradation occurs is made, the CPU 132 does not discharge electric capacity with respect to the cell 114A which is specified as a cell where deep discharge temporary degradation occurs. On the other hand, with respect to the cells 114B, 114C which are specified as cells where deep discharge temporary degradation does not occur, the CPU 132 discharges using the discharge circuit 126 which corresponds to the cells 114B, 114C as indicated by an arrow 176 thus equalizing electric capacities stored in the cells 114B, 114C.

As has been described heretofore, in this embodiment, when deep discharge temporary degradation occurs, discharge of the cell 114A which is specified as a cell where deep discharge temporary degradation occurs is stopped. Accordingly, it is possible to suppress a phenomenon that the cell 114A which is specified as the cell where deep discharge temporary degradation occurs is discharged so that the difference between electric capacities stored in the respective cells 114A to 114C is enlarged. Further, electric capacity can be equalized with respect to the cells 114B, 114C which are specified as cells where deep discharge temporary degradation does not occur and hence, the difference between electric capacities stored in the respective cells 114A to 114C can be decreased.

H. Eighth Embodiment:

The eighth embodiment describes a method for suppressing deep discharge temporary degradation when the occurrence of deep discharge temporary degradation is detected by the method for detecting deep discharge temporary degradation according to any one of the first to fourth embodiments. As shown in FIG. 5 and FIG. 6, in the secondary battery where deep discharge temporary degradation occurs, compared to the secondary battery where deep discharge temporary degradation does not occur, a correspondence relationship between a state value indicating a state of the secondary battery such as a charge voltage or a charge current and an SOC changes and hence, the secondary battery where deep discharge temporary degradation occurs is influenced by deep discharge temporary degradation. Accordingly, when deep discharge temporary degradation occurs, it is necessary to suppress influence exerted by deep discharge temporary degradation. For example, it is desirable to suppress temporary lowering of performances of the secondary battery.

Inventors of the present invention have come up with suppressing processing of a secondary battery for suppressing influence exerted by deep discharge temporary degradation. In this suppression processing of the secondary battery, progress of deep discharge temporary degradation is suppressed using a charge rate which means a magnitude of a charge current when the secondary battery is charged by CC charge. Hereinafter, constitutional elements of the eighth embodiment identical to the corresponding constitutional elements of the first embodiment are given same reference symbols and repeated description of these constitutional elements is omitted.

Figure 30:
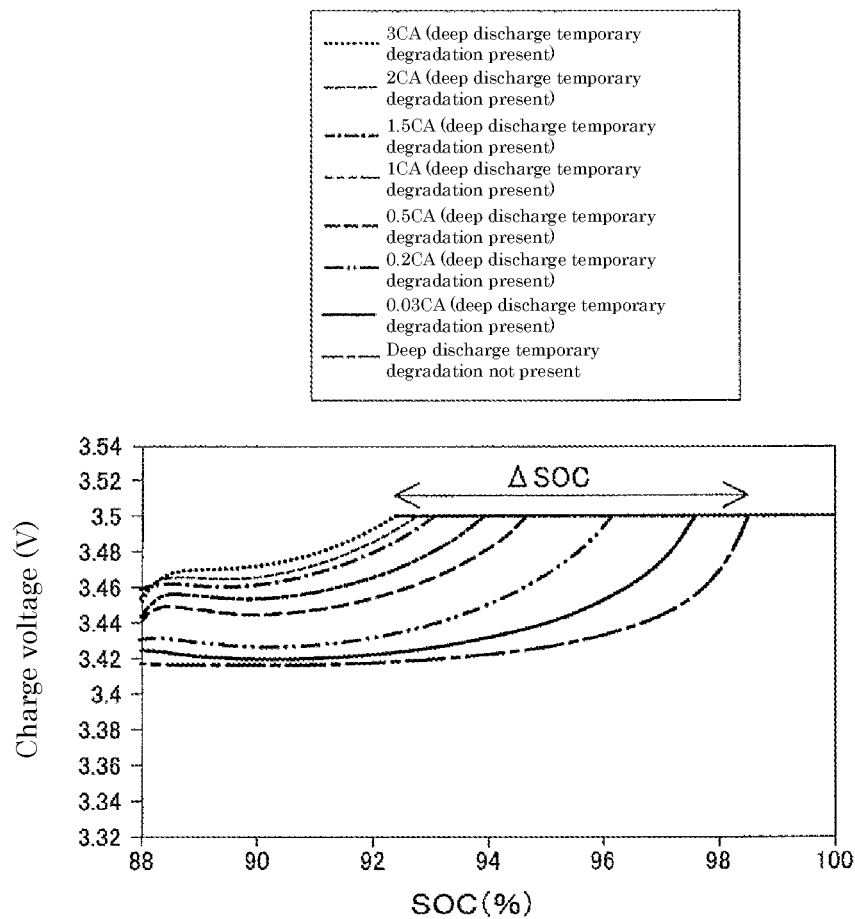
FIG. 30 is an explanatory view showing an SOC-charge voltage characteristic of the secondary battery.

FIG. 30 is an explanatory view showing an SOC-charge voltage characteristic of the secondary battery 112. FIG. 30 shows the SOC-charge voltage characteristic which the secondary battery 112 exhibits when the secondary battery 112 is charged such that the secondary battery 112 is charged to an SOC of 80% at respective charge rates of 0.03C to 3C after deep discharge temporary degradation occurs and, thereafter, the secondary battery 112 is charged by 1C. In this embodiment, "1C charge rate" means a charge rate that the secondary battery 112 is charged to a full charge state from a completely discharged state within one hour. For example, when charge capacity of the secondary battery 112 is 60 Ah, the secondary battery 112 is charged with a charge current of 60 A.

Figure 31:
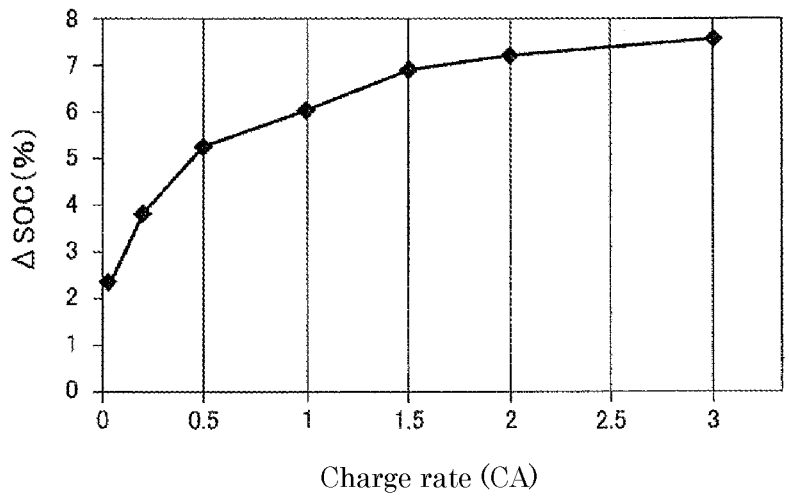
FIG. 31 is an explanatory view showing a ΔSOC-charge rate characteristic of the secondary battery.

As shown in FIG. 30, in the secondary battery 112 where deep discharge temporary degradation occurs, compared to the secondary battery 112 where deep discharge temporary degradation does not occur, an SOC at a point of time that the secondary battery 112 reaches a prescribed voltage is lowered. FIG. 31 shows a lowering amount of the SOC when the secondary battery 112 reaches a prescribed voltage (hereinafter referred to as "ΔSOC")-charge rate characteristic at a respective charge rates in FIG. 30. It is understood from FIG. 31 that the lower the charge rate, the smaller ΔSOC becomes.

Figure 29:
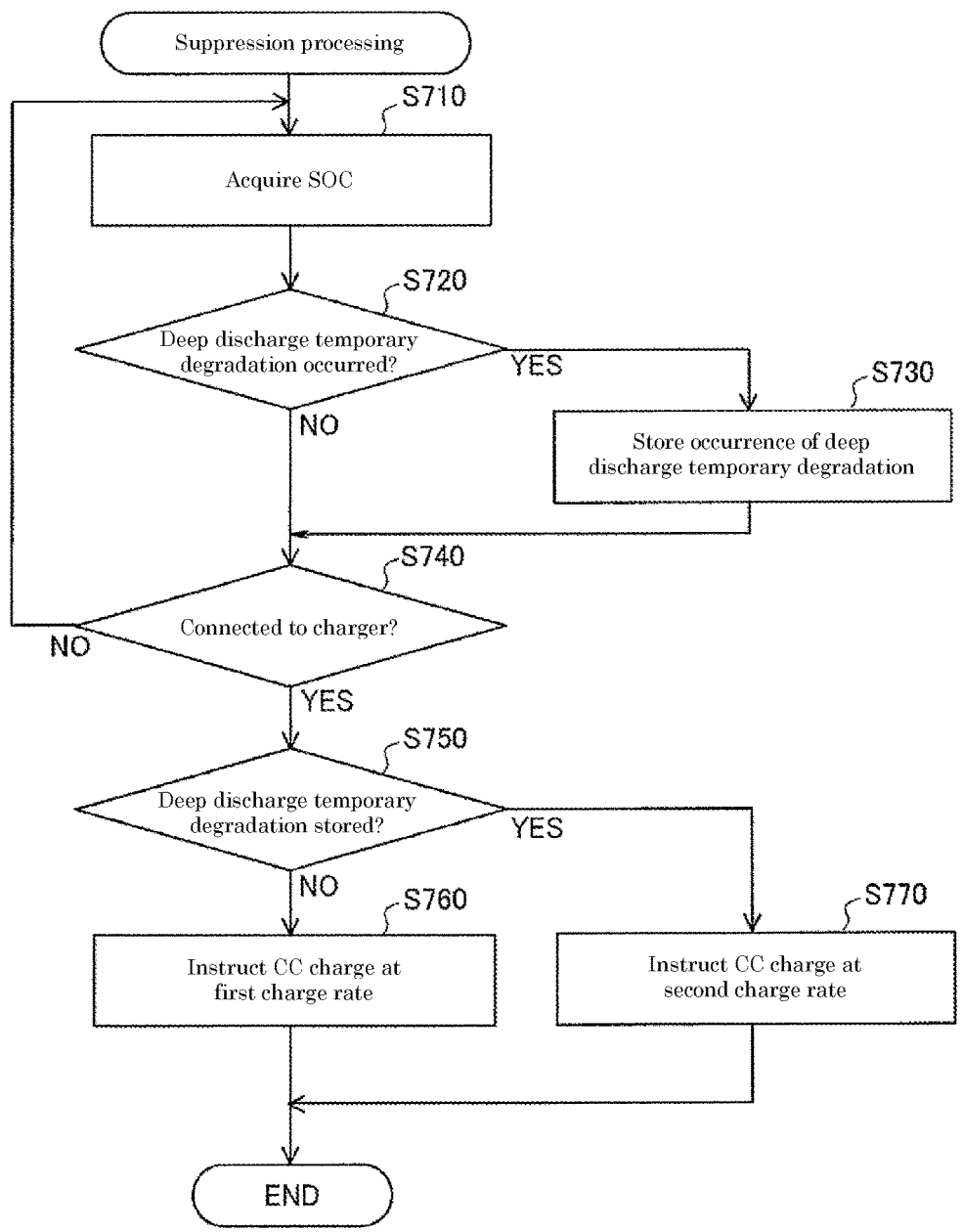
FIG. 29 is a flowchart showing the flow of suppression processing of the secondary battery.

The BM 130 of the battery pack 100 according to this embodiment (FIG. 1) performs suppression processing of the secondary battery 112. FIG. 29 is a flowchart showing the flow of suppression processing of the secondary battery 112. The suppression processing of the secondary battery 112 is started at a timing that a predetermined start instruction is inputted (for example, at a timing that an ignition is brought into an ON state in a case where the battery pack 100 is mounted on an electric vehicle).

First, the CPU 132 of the BM 130 acquires a value of an SOC (S710). The CPU 132 determines whether or not deep discharge temporary degradation occurs in the secondary battery 112 based on the acquired value of the SOC (S720). To be more specific, the CPU 132, in the same manner as the method for detecting deep discharge temporary degradation according to the first embodiment, determines whether or not a value of the acquired SOC is equal to or less than a threshold value. When the value of the acquired SOC is more than the threshold value, the CPU 132 determines that the deep discharge temporary degradation does not occur (S720: NO). In this case, the CPU 132 advances to processing in step S740 without storing the occurrence of deep discharge temporary degradation.

On the other hand, when the value of the acquired SOC is equal to or less than the threshold value, the CPU 132 determines that the deep discharge temporary degradation occurs (S720: YES), and stores the occurrence of the deep discharge temporary degradation (S730). To be more specific, in the memory 134, a deep discharge flag which indicates the occurrence of deep discharge temporary degradation is stored. When the CPU 132 determines that deep discharge temporary degradation occurs, the CPU 132 switches the deep discharge flag from an OFF state to an ON state.

The CPU 132 determines whether or not the battery pack 100 is connected to the charger 200 through the communication interface 136 (S740). When the CPU 132 determines that the battery pack 100 is not connected to the charger 200 (S740: NO), the CPU 132 returns to processing in step S710. On the other hand, when the CPU 132 determines that the battery pack 100 is connected to the charger 200 (S740: YES), the CPU 132 detects whether or not the occurrence of discharge temporary degradation is stored (S750).

To be more specific, the CPU 132 confirms a state of the deep discharge flag. When the deep discharge flag is in an OFF state, the CPU 132 detects that the occurrence of discharge temporary degradation is not stored, that is, the determination that deep discharge temporary degradation occurs is not made (S750: NO). In this case, the CPU 132 instructs the control unit 220 of the charger 200 to charge the secondary battery 112 at a preset first charge rate R1 by CC charge (S760).

The first charge rate R1 is set to a charge rate larger than a 1.5C charge rate. To be more specific, the first charge rate R1 is set to a 2C charge rate. For example, when a charge capacity of the secondary battery 112 is 60 Ah, at the 2C charge rate, the secondary battery 112 is charged to a full charge state from a completely discharged state within 30 minutes with a charge current of 120 A. Since a charge rate in constant current charge is set larger than a 1.5C charge rate, it is possible to shorten a time necessary for charging the secondary battery 112.

On the other hand, when the deep discharge flag is in an ON state, the CPU 132 detects that the occurrence of discharge temporary degradation is stored, that is, the determination that discharge temporary degradation occurs is made (S750: YES). In this case, the CPU 132 instructs the control unit 220 of the charger 200 to charge the secondary battery 112 at a preset second charge rate R2 by CC charge (S770). The second charge rate R2 is lower than the first charge rate R1, and is set to a 1.5C charge rate or less. To be described more in detail, it is preferable that the second charge rate R2 be set to a 0.5C charge rate or less. To be more specific, the second charge rate R2 is set to a 0.2C charge rate which is one tenth of the first charge rate R1. For example, when a charge capacity of the secondary battery 112 is 60 Ah, at the 0.2C charge rate, the secondary battery 112 is charged to a full charge state from a completely discharged state within 5 hours with a charge current of 12 A.

As has been explained heretofore, in this embodiment, when the secondary battery 112 is discharged until a value of an SOC becomes a threshold value or less, the secondary battery 112 is charged by CC charge at a second charge rate R2 which is lower or smaller than a first charge rate R1 used when the secondary battery 112 is not discharged to the threshold value or less. Accordingly, even when the secondary battery 112 is discharged to the threshold value or less, it is possible to suppress the progress of deep discharge temporary degradation compared to the case where the secondary battery 112 is charged at the first charge rate R1.

As shown in FIG. 31, in a ΔSOC-charge rate characteristic, an inclination in a region at a 1.5C charge rate and below the 1.5C charge rate is larger than an inclination in a region above the 1.5C charge rate. Accordingly, by setting a second charge rate R2 to a 1.5C charge rate or to a value below the 1.5C charge rate, compared to the case where the second charge rate R2 is set to a value above the 1.5C charge rate, a lowering amount of ΔSOC with respect to the decrease of the charge rate is large so that the progress of deep discharge temporary degradation can be easily suppressed.

Further, in the ΔSOC-charge rate characteristic, an inclination in a region at a 0.5C charge rate and below the 0.5C charge rate is larger than an inclination in a region larger than the 0.5C charge rate and equal to or below the 1.5C charge rate. Accordingly, by setting a second charge rate R2 to a 0.5C charge rate or to a value below the 0.5C charge rate, compared to the case where the second charge rate R2 is set to a value above the 0.5C charge rate, a lowering amount of ΔSOC with respect to the decrease of the charge rate is large so that the progress of deep discharge temporary degradation can be easily suppressed.

To compare the first charge rate R1 and the second charge rate R2 to each other, the second charge rate R2 is set to one tenth of the first charge rate R1 or is set to one fifth of the first charge rate R1 or to a value below one fifth of the first charge rate R1. Accordingly, compared to a case where the second charge rate R2 is set to a charge rate larger than one fifth of the first charge rate R1, the progress of deep discharge temporary degradation can be easily suppressed.

Figure 32:
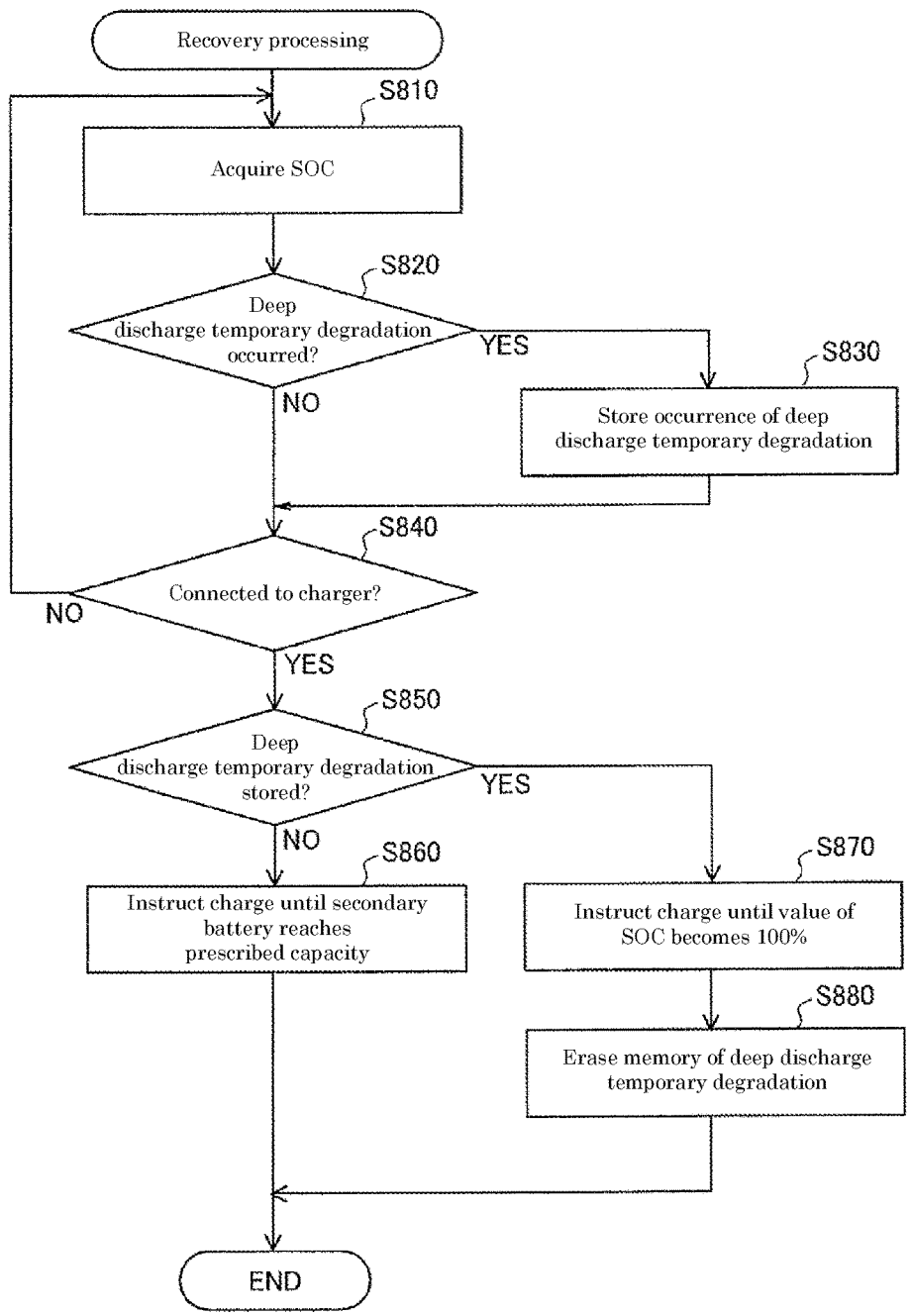
FIG. 32 is a flowchart showing the flow of recovery processing of the secondary battery.
Figure 33:
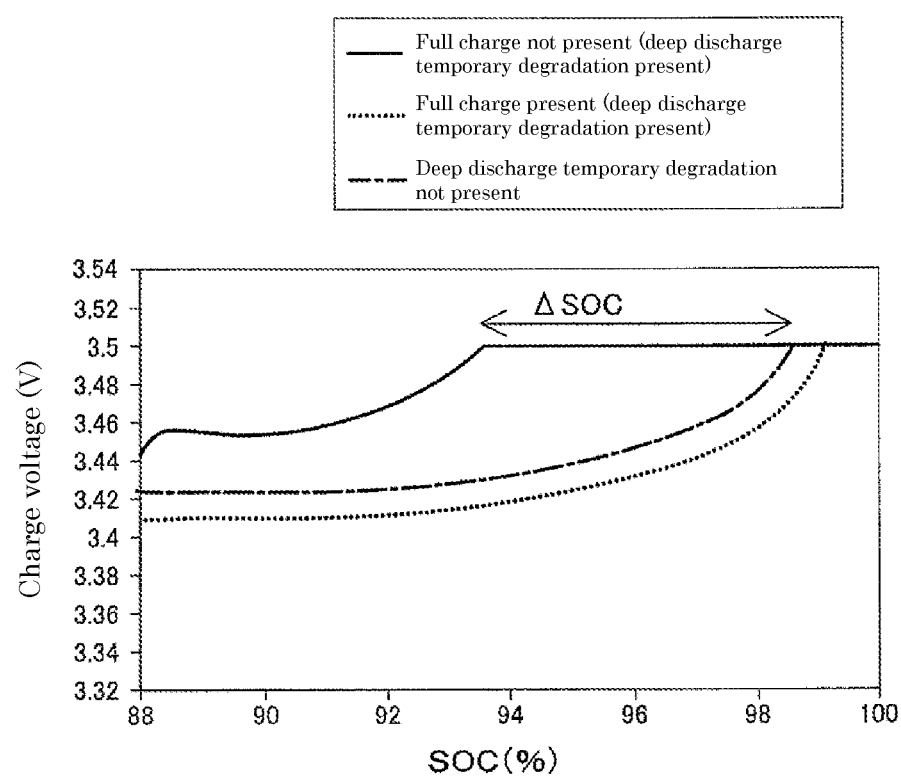
FIG. 33 is an explanatory view showing an SOC-charge voltage characteristic of the secondary battery.

I. Ninth Embodiment:

FIG. 32 and FIG. 33 show the ninth embodiment. The ninth embodiment describes a method for eliminating deep discharge temporary degradation when the occurrence of deep discharge temporary degradation is detected by the method for detecting deep discharge temporary degradation according to any one of the first to fourth embodiments. As shown in FIG. 5 and FIG. 6, in the secondary battery where deep discharge temporary degradation occurs, compared to the secondary battery where deep discharge temporary degradation does not occur, a correspondence relationship between a state value indicating a state of the secondary battery such as a charge voltage or a charge current and an SOC changes and hence, the secondary battery where deep discharge temporary degradation occurs is influenced by deep discharge temporary degradation. Accordingly, when deep discharge temporary degradation occurs, it is necessary to eliminate deep discharge temporary degradation. For example, it is desirable to eliminate temporary lowering of performances of the secondary battery.

Inventors of the present invention have come up with a method for recovering a secondary battery for eliminating deep discharge temporary degradation. In this recovery processing of the secondary battery, deep discharge temporary degradation is eliminated by charging the secondary battery to an SOC of 91% or more. Hereinafter, constitutional elements of the ninth embodiment identical to the corresponding constitutional elements of the first embodiment are given same reference symbols and repeated description of these constitutional elements is omitted.

FIG. 33 is an explanatory view showing: an SOC-charge voltage characteristic of a secondary battery 112 which does not experience a full charge after the occurrence of deep discharge temporary degradation; and an SOC-charge voltage characteristic of a secondary battery 112 which experiences a full charge after the occurrence of deep discharge temporary degradation. As shown in FIG. 33, it is understood that the SOC-charge voltage characteristic of the secondary battery 112 which does not experience a full charge exhibits ΔSOC of 5% or more and hence, the SOC-charge voltage characteristic of the secondary battery 112 which does not experience a full charge differs from the SOC-charge voltage characteristic of the secondary battery 112 where deep discharge temporary degradation does not occur.

On the other hand, the SOC-charge voltage characteristic of the secondary battery 112 which experiences a full charge exhibits ΔSOC of less than 1% and hence, the SOC-charge voltage characteristic of the secondary battery 112 which experiences a full charge substantially agree with the SOC-charge voltage characteristic of the secondary battery 112 where deep discharge temporary degradation does not occur. From this result, it is understood that the secondary battery 112 in which deep discharge temporary degradation occurs can eliminate the deep discharge temporary degradation by experiencing a full charge after the deep discharge temporary degradation occurs in the secondary battery 112.

The BM 130 of the battery pack 100 according to this embodiment (FIG. 1) performs recovery processing of the secondary battery 112. FIG. 32 is a flowchart showing the flow of recovery processing of the secondary battery 112. The recovery processing of the secondary battery 112 is started at a timing that a predetermined start instruction is inputted (for example, at a timing that an ignition is brought into an ON state in a case where the battery pack 100 is mounted on an electric vehicle).

First, the CPU 132 of the BM 130 acquires a value of an SOC (S810). The CPU 132 determines whether or not deep discharge temporary degradation occurs in the secondary battery 112 based on the acquired value of the SOC (S820). To be more specific, the CPU 132, in the same manner as the method for detecting deep discharge temporary degradation according to the first embodiment, determines whether or not a value of the acquired SOC is equal to or less than a threshold value. When the value of the acquired SOC is more than the threshold value, the CPU 132 determines that the deep discharge temporary degradation does not occur (S820: NO). In this case, the CPU 132 advances to processing in step S840 without storing the occurrence of deep discharge temporary degradation.

On the other hand, when the value of the acquired SOC is equal to or less than the threshold value, the CPU 132 determines that the deep discharge temporary degradation occurs (S820: YES), and stores the occurrence of the deep discharge temporary degradation (S830).

The CPU 132 determines whether or not the battery pack 100 is connected to the charger 200 through the communication interface 136 (S840). When the CPU 132 determines that the battery pack 100 is not connected to the charger 200 (S840: NO), the CPU returns to processing in step S810. On the other hand, when the CPU 132 determines that the battery pack 100 is connected to the charger 200 (S840: YES), the CPU 132 detects whether or not the occurrence of discharge temporary degradation is stored (S850).

When the occurrence of discharge temporary degradation is not stored in the CPU 132 (S850: NO), the CPU 132 instructs the control unit 220 of the charger 200 to charge the secondary battery 112 to a prescribed capacity set in advance, for example, until a value of an SOC of the secondary battery 112 becomes 80% (S860).

On the other hand, when the occurrence of discharge temporary degradation is stored in the CPU 132 (S850: YES), the CPU 132 instructs the control unit 220 of the charger 200 to charge the secondary battery 112 to a full charge, that is, until a value of an SOC of the secondary battery 112 becomes 100% (S870), and erases a memory that deep discharge temporary degradation occurs (S880). To be more specific, the CPU 132 switches a deep discharge flag to an OFF state from an ON state.

As has been described above, in this embodiment, when deep discharge temporary degradation occurs, the secondary battery 112 is charged to a full charge. With such processing, it is possible to eliminate the influence exerted by deep discharge temporary degradation.

J. Tenth Embodiment:

FIG. 34 to FIG. 37 show the tenth embodiment. The tenth embodiment describes a method for eliminating deep discharge temporary degradation when the occurrence of deep discharge temporary degradation is detected. The difference between this embodiment and the ninth embodiment lies in a value of an SOC which a secondary battery reaches at the completion of charge. The tenth embodiment is substantially identical to the ninth embodiment with respect to other points. Accordingly, hereinafter, constitutional elements of the tenth embodiment identical to the corresponding constitutional elements of the ninth embodiment are given same reference symbols and repeated description of these constitutional elements is omitted.

Figure 34:
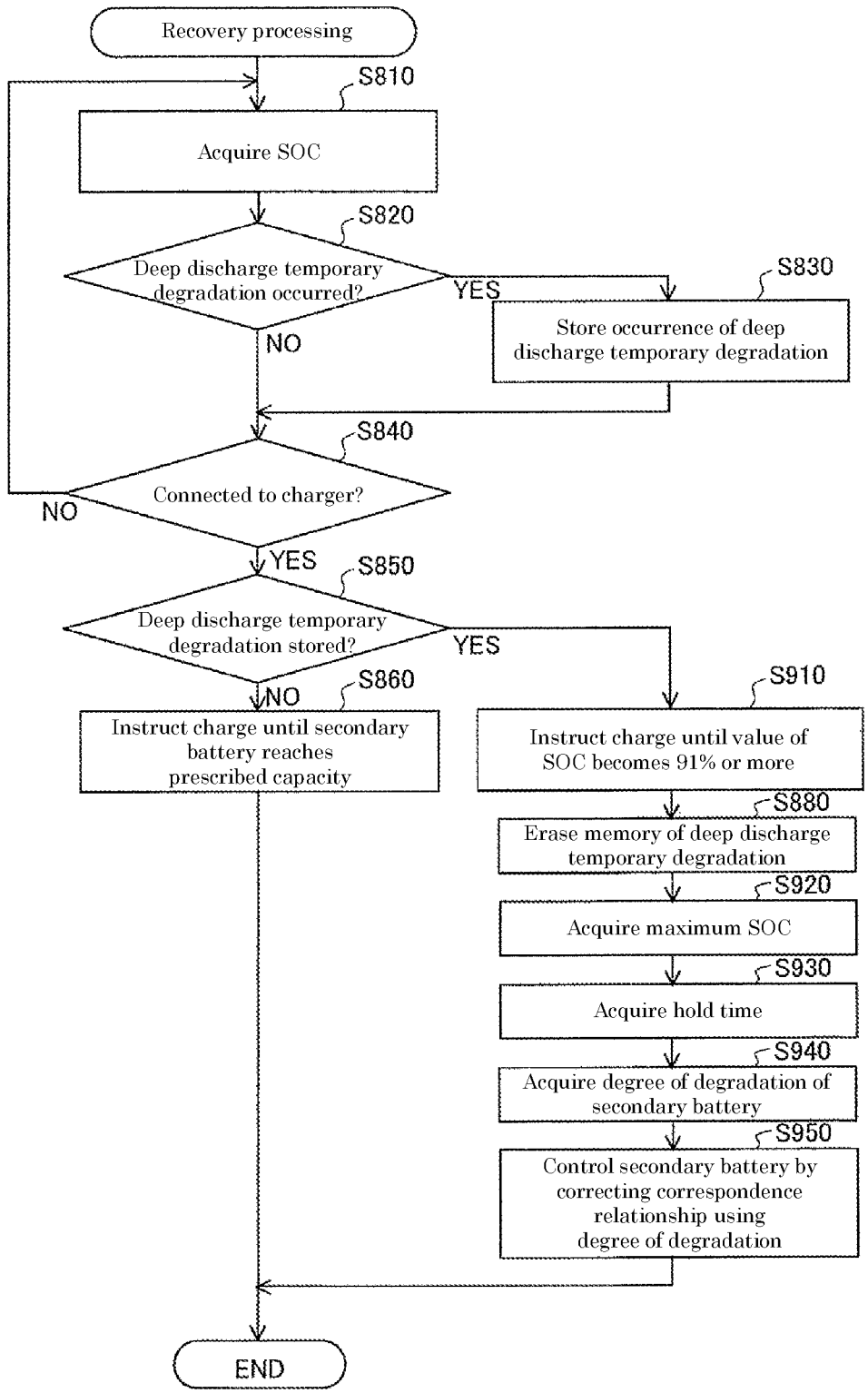
FIG. 34 is a flowchart showing recovery processing of the secondary battery.

FIG. 34 is a flowchart showing the flow of recovery processing of the secondary battery 112 of this embodiment. As shown in FIG. 34, in the recovery processing of this embodiment, when the occurrence of deep discharge temporary degradation is stored in the CPU 132 (S850: YES), the CPU 132 instructs the control unit 220 of the charger 200 to charge the secondary battery 112 until a value of an SOC of the secondary battery 112 become 91% or more (S910), and erases the memory of the occurrence of the deep discharge temporary degradation (S880). The recovery processing of this embodiment differs from the recovery processing of the ninth embodiment with respect to a point that a value of the largest SOC may be less than 100% provided that the value of the largest SOC which the secondary battery 112 reaches by charge is 91% or more.

The CPU 132 acquires a value of the largest SOC which the secondary battery 112 reaches (S920). To be more specific, the CPU 132 acquires the value of the SOC after outputting the instruction in step S910, and acquires the SOC at the time of completion of charge of the secondary battery 112. Further, the CPU 132 measures an elapsed time from a point of time that the secondary battery 112 reaches the largest SOC, and acquires a hold time during which the secondary battery 112 is held at the largest SOC (S930). The CPU 132 acquires a degradation degree based on the acquired largest SOC and the hold time (S940).

In this embodiment, the degradation degree is a parameter indicative of a degree of deep discharge temporary degradation. Degradation degree of 100% means a state where deep discharge temporary degradation occurs, that is, a state where deep discharge temporary degradation is not eliminated at all. On the other hand, degradation degree of 0% means a state where deep discharge temporary degradation is eliminated. The degradation degree of the secondary battery 112 can be expressed by using ΔSOC, for example. That is, the degradation degree can be expressed by percentage of present ΔSOC of the secondary battery 112 to ΔSOC in a state where deep discharge temporary degradation is not eliminated at all.

Figures 35, 36:
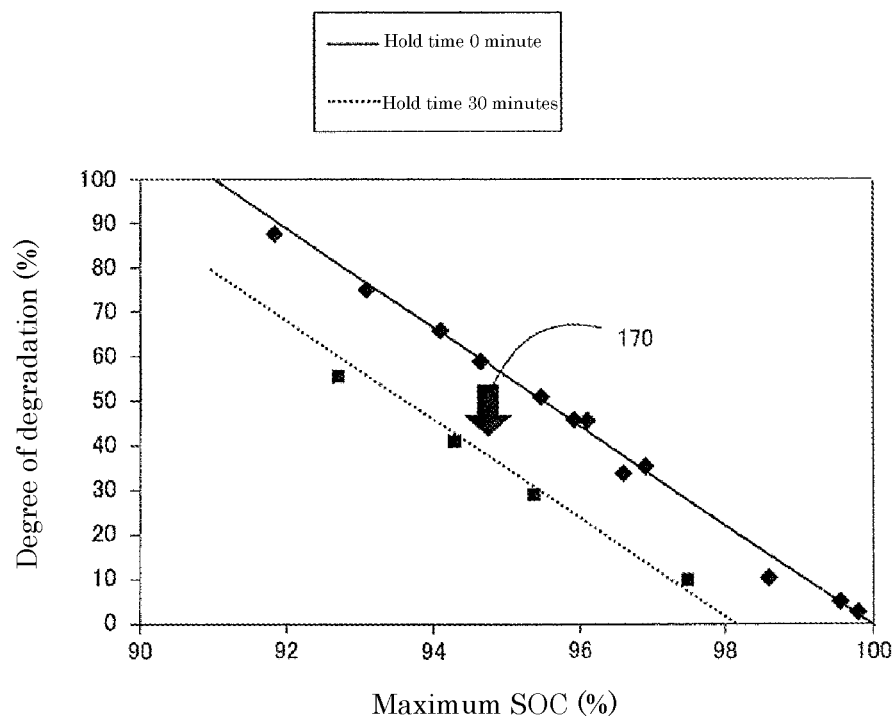
FIG. 35 is an explanatory view showing a correspondence relationship between the degree of degradation of the secondary battery and maximum SOC.
FIG. 36 is a first table showing a correspondence relationship between the degree of degradation of the secondary battery and maximum SOC.

FIG. 35 is an explanatory view showing a correspondence relationship between the degradation degree and the largest SOC of the secondary battery 112. The inventors of the present invention have evaluated the degradation degree of the secondary battery 112 by changing the largest SOC of the secondary battery 112. As a result, the inventors of the present invention have found that, as indicated by a solid line in FIG. 35, as the largest SOC of the secondary battery 112 is increased, the degradation degree of the secondary battery 112 is lowered. That is, it is found that as the largest SOC of the secondary battery 112 is increased, the influence of the deep discharge temporary degradation is eliminated. This result is stored in the memory 134 in the form of a first table which expresses a correspondence relationship between the degradation degree and the largest SOC of the secondary battery 112, as shown in FIG. 36.

Further, the inventors of the present invention evaluate the degradation degree of the secondary battery 112 by changing a hold time of the secondary battery 112 at the largest SOC. As a result, as indicated by a dotted line in FIG. 35, it is confirmed that the degradation degree of the secondary battery 112 where the hold time is 30 minutes is lowered by approximately 20% as indicated by an arrow 170 compared to the degradation degree of the secondary battery 112 where the hold time indicated by a solid line is set to zero. The inventors of the present invention also evaluate lowering amounts of the degradation degree when the hold time is set to 10 minutes, 20 minutes and 60 minutes. As a result, it is understood that the degradation degree is lowered by approximately 5% when the hold time is 10 minutes, the degradation degree is lowered by approximately 10% when the hold time is 20 minutes, and the degradation degree is lowered by approximately 30% when the hold time is 60 minutes. As a result, as shown in FIG. 37, this result is stored in the memory 134 in the form of a second table which expresses a correspondence relationship between the hold time and the lowering amount of the degradation degree of the secondary battery 112.

In the processing in S940, the CPU 132 acquires a degradation degree based on the largest SOC acquired in step S920 and the first table shown in FIG. 36. Based on the first table, the CPU 132 sets the degradation degree to a lower degree as the largest SOC is increased. The CPU 132 corrects the acquired degradation degree based on the hold time acquired in step S930 and the second table shown in FIG. 37. Based on the second table, the CPU 132 sets the degradation degree to a lower degree as the hold time is increased. With such processing, the CPU 132 acquires the degradation degree which corresponds to the acquired maximum SOC and the acquired hold time.

The CPU 132 corrects a correspondence relationship between a state value indicative of a state of the secondary battery 112 such as a charge voltage or a charge current and an SOC using the acquired degradation degree (S950), and controls the secondary battery 112. In this embodiment, an example where an SOC-charge voltage characteristic is corrected is exemplified. In the memory 134, degradation time correspondence information indicative of an SOC-charge voltage characteristic of the secondary battery 112 having a degradation degree of 100% and normal time correspondence information indicative of an SOC-charge voltage characteristic of the secondary battery 112 having a degradation degree of 0% are stored. Differential information between the degradation time correspondence information and the normal time correspondence information is calculated based on these data. Differential information means a differential value between a value of an SOC of degradation time correspondence information and a value of an SOC of normal time correspondence information at respective charge voltages, for example.

The CPU 132 calculates correction information by multiplying differential information by the degradation degree, and calculates correspondence information indicative of a present SOC-charge voltage characteristic of the secondary battery 112 based on the calculated correction information and the normal time correspondence information. The CPU 132 calculates a value of an SOC of the present SOC-charge voltage characteristic of the secondary battery 112 by subtracting a value of an SOC of correction information from a value of an SOC of the normal time correspondence information at each charge voltage, for example. The CPU 132 controls the secondary battery 112 using the calculated SOC-charge voltage characteristic.

As has been described above, in this embodiment, a degree of deep discharge temporary degradation of the secondary battery 112 is evaluated using a degradation degree, and a correspondence relationship between a state value and the SOC of the secondary battery 112 is corrected using the degradation degree. Accordingly, the secondary battery 112 can be controlled based on the degradation degree of the secondary battery 112.

Further, the degradation degree of the secondary battery 112 is lowered as the largest SOC of the secondary battery 112 is increased or as a hold time is increased. Accordingly, the secondary battery 112 can be controlled such that as the largest SOC of the secondary battery 112 is increased or as the hold time is increased, deep discharge temporary degradation is more effectively eliminated.

As has been described above, when the BM 130 detects the occurrence of temporary degradation of the secondary battery 112, the BM 130 outputs an instruction to the charger 200 such that the charger 200 charges the secondary battery 112 until an SOC of the secondary battery 112 becomes an elimination SOC larger than a prescribed SOC. In the same manner, when the BM 130 detects the occurrence of temporary degradation of the secondary battery 112, the BM 130 may output an instruction to the charger 200 such that the charger 200 charges the secondary battery 112 until a magnitude relationship between a state value relating to a voltage of the secondary battery 112 and a preset threshold value does not satisfy the above-mentioned predetermined condition, that is, until the voltage of the secondary battery 112 becomes an elimination voltage larger than a prescribed voltage. That is, when the BM 130 detects the occurrence of temporary degradation of the secondary battery 112, the BM 130 charges the secondary battery 112 until a state is brought about where the BM 130 does not detect the occurrence of temporary degradation.

K. Modifications

The technique disclosed in this specification is not limited to the above-mentioned embodiments, and can be modified in various configurations without departing from the gist of the present invention. For example, the following modifications are also conceivable. For example, in the above-mentioned embodiments, the BM 130 is configured to have one CPU 132. However, the configuration of the BM 130 is not limited to such a case, and the BM 130 may have the configuration which includes a plurality of CPUs, the configuration which includes a hardware circuit such as ASIC (Application Specific Integrated Circuit), or the configuration which includes both of the hardware circuit and the CPU.

In the above-mentioned embodiments, the battery pack 100 includes one battery module 110. However, the battery pack 100 may include a plurality of battery modules 110. Further, in the above-mentioned embodiments, the secondary battery 112 includes the plurality of cells 114 connected in series. However, the secondary battery 112 may include only one cell or may include a plurality of cells connected in parallel to each other.

In the above-mentioned embodiments, phosphoric-acid-iron lithium is used as a positive active material with a capacity-potential characteristic where a potential flat portion exists. However, as such a positive active material, other active materials (for example, $Li_3Fe_2(PO_4)_3$ and $Li_2FeSiO_4$) having substantially the same characteristic may also be used. In the above-mentioned embodiment, graphite is used as a negative active material. However, other materials may be used as a negative active material.

In the above-mentioned embodiment, 40% is used as a threshold value of an SOC for detecting deep discharge temporary degradation. However, the threshold value may be smaller than 40% or may be larger than 40%.

In the above-mentioned first embodiment, a degree of the deep discharge temporary degradation is determined using four parameters consisting of depth of discharge, a temperature at the time of deep discharge, a downtime after deep discharge and a degree of degradation with a lapse of time. However, it is not necessary to use all these four parameters, and a degree of the deep discharge temporary degradation may be determined using at least one of these four parameters. Further, a degree of the deep discharge temporary degradation may be determined using other parameters in addition to these parameters.

In the above-mentioned second to fourth embodiments, a discharge voltage value, an OCV and an inclination value of the secondary battery 112 are acquired, and the occurrence of deep discharge temporary degradation is detected by looking up the acquired discharge voltage value, OCV and inclination value. However, the occurrence of deep discharge temporary degradation may be detected by acquiring and looking up a discharge voltage correlation value correlated with a discharge voltage value, an OCV correlation value correlated with a value of an OCV and an inclination (ratio) correlation value correlated with an inclination value in place of the discharge voltage value, the OCV and the inclination value. As the discharge voltage correlation value, for example, an internal resistance value of the secondary battery 112 is named. As the OCV correlation value, for example, an internal resistance value or a discharge time of the secondary battery 112 is named. As the inclination correlation value, a value of an inverse number of the inclination value is named.

In the above-mentioned second embodiment, when a discharge current amount is an approximately fixed amount, in step S220 shown in FIG. 16, the acquisition of a discharge current amount is unnecessary. Further, in correspondence relationship information used in step S230, correspondence relationship information between a discharge voltage value and a discharge current amount is unnecessary.

In the above-mentioned sixth and seventh embodiments, the example is exemplified where equalization processing is switched in response to the occurrence of deep discharge temporary degradation. It is because electric capacities which are actually stored in the respective cells 114A to 114C are estimated based on a voltage value of the secondary battery 112 which is influenced by deep discharge temporary degradation. However, in the case where electric capacities actually stored in the respective cells 114A to 114C can be estimated by parameters which are not influenced by deep discharge temporary degradation, it is not always necessary to switch equalization processing in response to the occurrence of deep discharge temporary degradation. Further, when the occurrence of deep discharge temporary degradation is not detected, electric capacities actually stored in the respective cells 114A to 114C may be estimated based on a voltage value of the secondary battery 112 which can be easily acquired. On the other hand, when the occurrence of deep discharge temporary degradation is detected, electric capacities actually stored in the respective cells 114A to 114C may be estimated by parameters which are not influenced by deep discharge temporary degradation.

In the above-mentioned tenth embodiment, the example is exemplified where the degradation degree of the secondary battery 112 is expressed using a ΔSOC in an SOC-charge voltage characteristic. However, the present invention is not limited to such an example. As shown in FIG. 23A and FIG. 23B, it may be possible to use capacity difference ΔSO of a value of an SOC when the secondary battery 112 reaches a prescribed current value KI in an SOC-charge current characteristic.

In the above-mentioned first embodiment and fifth embodiment, it has been described that the determination can be made where a degree of the deep discharge temporary degradation is increased as the degree of degradation of the secondary battery 112 with a lapse of time is decreased based on a relationship between the degree of degradation with a lapse of time and a degree of the deep discharge temporary degradation (FIG. 12, FIG. 23A and FIG. 23B). By making use of such processing, in an opposite manner, it may be possible to estimate the degree of degradation of the secondary battery 112 with a lapse of time (an electric capacity of the secondary battery 112 reduced due to degradation with a lapse of time, for example) based on a degree of the deep discharge temporary degradation. To be more specific, deep discharge temporary degradation is made to occur in the secondary battery 112, an SOC when the secondary battery 112 is charged by CCCV charge and the secondary battery 112 reaches a prescribed voltage is measured, it is estimated that the larger the SOC, the larger the degree of degradation of the secondary battery 112 with a lapse of time becomes.

For example, a correspondence table which makes an SOC when the secondary battery 112 reaches a prescribed voltage and a degree of degradation of the secondary battery 112 with a lapse of time correspond to each other may be stored in the memory 134, and the degree of degradation of the secondary battery 112 with a lapse of time may be estimated by looking up the correspondence table. A conversion formula which calculates a degree of degradation of the secondary battery 112 with a lapse of time from an SOC when the secondary battery 112 reaches a prescribed voltage may be stored in the memory 134, and the degree of degradation of the secondary battery 112 with a lapse of time may be estimated using the conversion formula. Further, a degradation reference value which is used for determining that the secondary battery 112 is degraded with a lapse of time exceeding a prescribed range may be stored in the memory 134, an SOC when the secondary battery 112 reaches the prescribed voltage and the degradation reference value may be compared to each other, and the determination may be made whether or not the secondary battery 112 is degraded with a lapse of time exceeding a prescribed range. A degree of degradation of the secondary battery 112 with a lapse of time can also be estimated using other index values (for example, inclination of a charge current-SOC curve at the time of CV charge) in place of an SOC when the secondary battery 112 reaches the prescribed voltage.

In the above-mentioned first embodiment, the technique for detecting the occurrence of deep discharge temporary degradation based on a value of an SOC of the secondary battery 112 is described. In the above-mentioned second to fourth embodiments, the technique for detecting the occurrence of deep discharge temporary degradation based on an OCV or the like of the secondary battery 112 is described. By combining these techniques, it is possible to estimate an electric capacity which can be stored in the secondary battery 112.

Figure 38:
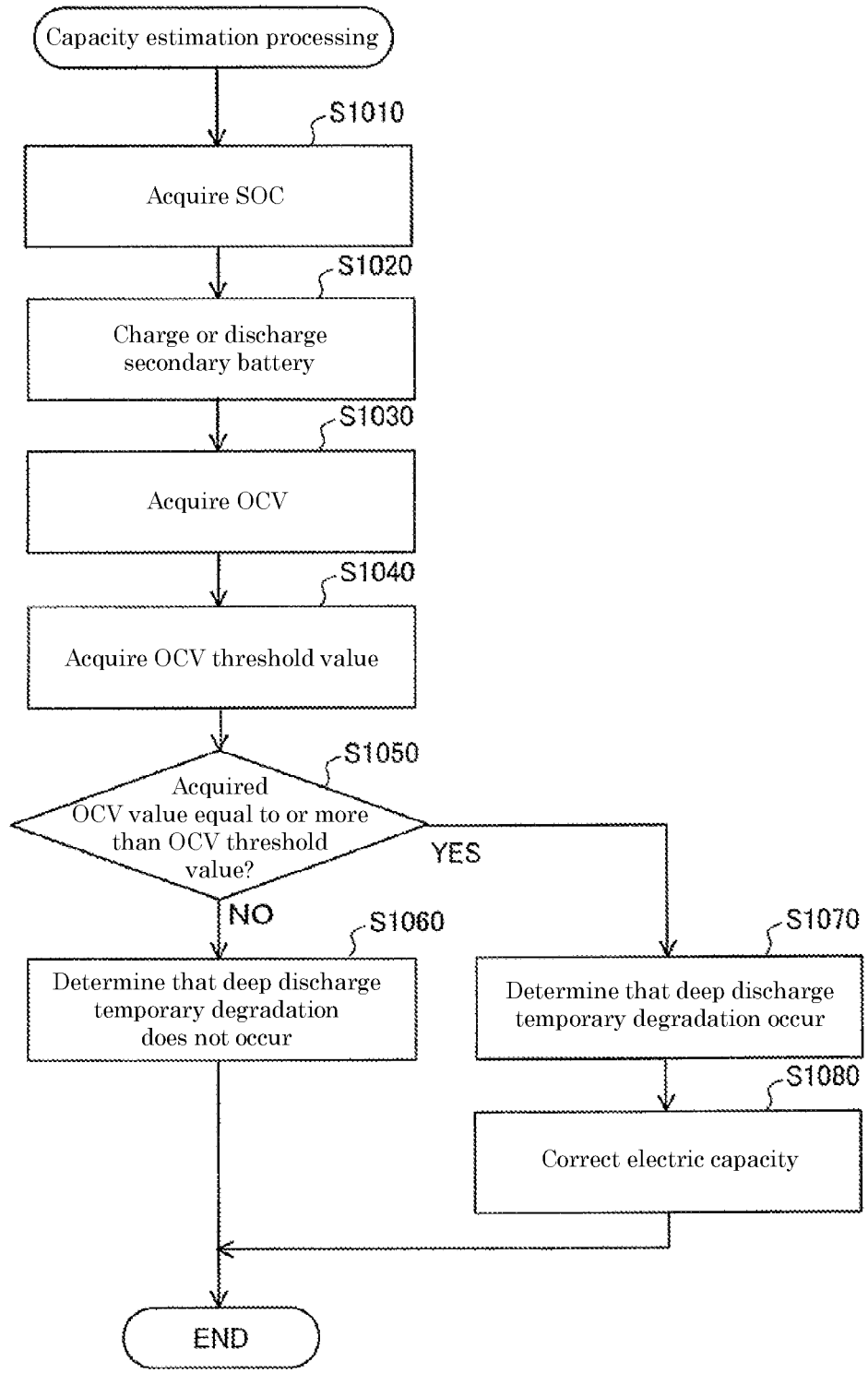
FIG. 38 is a flowchart showing the flow of capacity estimation processing of the secondary battery.

In this embodiment, the BM 130 of the battery pack 100 (FIG. 1) performs capacity estimation processing for estimating an electric capacity of the secondary battery 112. FIG. 38 is a flowchart showing the flow of capacity estimation processing of the secondary battery 112. In the control processing in the fifth embodiment, when it is determined that an SOC of the secondary battery 112 is larger than a threshold value and deep discharge temporary degradation does not occur in the secondary battery 112 (S520 in FIG. 22: NO), the capacity estimation processing of the secondary battery 112 is performed succeeding the control processing. In this embodiment, the description is made with respect to capacity estimation processing which is performed succeeding control processing for controlling the secondary battery 112 using an SOC-OCV characteristic.

First, the CPU 132 of the BM 130 acquires a value of an SOC of the secondary battery 112 (S1010). A value of an SOC acquired in estimation processing may be used as a value of an SOC of the secondary battery 112. Next, CPU 132 charges or discharges the secondary battery 112 so as to make a value of the SOC of the secondary battery 112 become a prescribed value KS (S1020), and acquires a value of an OCV when the value of the SOC of the secondary battery 112 becomes a prescribed value KS (S1030). The CPU 132 acquires an OCV threshold value which corresponds to the prescribed value KS (S1040), and determines whether or not the value of the acquired OCV is equal to or more than a preset OCV threshold value (S1050).

When the CPU 132 determines that the value of the acquired OCV is smaller than the OCV threshold value (S1050: NO), the CPU 132 determines that deep discharge temporary degradation does not occur (S1060). In this case, a result of the determination whether or not deep discharge temporary degradation occurs in the secondary battery 112 based on the SOC of the secondary battery 112 in the estimation processing, and a result of the determination whether or not deep discharge temporary degradation occurs in the secondary battery 112 based on an OCV of the secondary battery 112 in the capacity estimation processing agree with each other. Accordingly, the CPU 132 determines that an electric capacity which the secondary battery 112 can store until the secondary battery 112 becomes a charge completion voltage EV is not changed from an electric capacity estimated before estimation processing such as an initial capacity, for example, and finishes the capacity estimation processing without correcting electric capacity.

On the other hand, when the value of the acquired OCV is equal to or more than the OCV threshold value (S1040: YES), the CPU 132 determines that deep discharge temporary degradation occurs (S1070). In this case, a result of the determination whether or not deep discharge temporary degradation occurs in the secondary battery 112 based on the SOC of the secondary battery 112 in the estimation processing, and a result of the determination whether or not deep discharge temporary degradation occurs in the secondary battery 112 based on an OCV of the secondary battery 112 in the capacity estimation processing are different from each other.

In this case, the CPU 132 corrects an electric capacity of the secondary battery 112 such that a value of the SOC of the secondary battery 112 estimated in step S1010 becomes 0% (S1080). To be more specific, the CPU 132 subtracts electric capacity which corresponds to a value of an SOC of the secondary battery 112 estimated in step S1010 from the present electric capacity of the secondary battery 112. Accordingly, when an electric capacity of the secondary battery 112 is decreased due to degradation with a lapse of time or the like, the electric capacity of the secondary battery 112 can be corrected.

DESCRIPTION OF REFERENCE SIGNS 100 battery pack
110 battery module
112 secondary batter
114, 114A to 114C cell
116 line
118, 136, 226 communication interface (I/F)
120 CS (cell sensor)
122 voltage sensor
124 discharge unit
126 discharge circuit
130 BM (battery manager)
132, 222 CPU (central processing unit)
134, 224 memory
140 current sensor
150 temperature sensor
200 charger
210 charge unit
220 control unit
400 load

The invention claimed is:
1. A management device for a secondary battery which includes an electrode including an active material with a characteristic where a potential flat portion exists in a relationship between a capacity and a potential, wherein the management device comprises:

a management unit which detects an occurrence of a temporary degradation of the secondary battery when a state of charge (SOC) associated value, which is associated with an SOC of the secondary battery, is acquired and the SOC which corresponds to the acquired SOC associated value is equal to or less than a preset prescribed SOC to charge the secondary battery at a charge rate which is different from a charge rate when the occurrence of the temporary degradation is not detected, or when a state value relating to a voltage of the secondary battery is acquired and a magnitude relationship between the acquired state value relating to the voltage of the secondary battery and a preset threshold value satisfies a predetermined condition.

2. The management device for a secondary battery according to claim 1, wherein the management unit is configured to determine such that a lower the SOC which corresponds to the acquired SOC associated value, a larger a degree of the temporary degradation becomes.

3. The management device for a secondary battery according to claim 1, wherein the state value relating to the voltage of the secondary battery is a discharge voltage associated value associated with a voltage value of the secondary battery when the secondary battery performs a constant current discharge, and the threshold value is a voltage threshold value, and
wherein the management unit is configured to detect the occurrence of the temporary degradation when the voltage value which corresponds to the acquired discharge voltage associated value is equal to or more than the voltage threshold value.

4. The management device for a secondary battery according to claim 1, wherein the state value relating to the voltage of the secondary battery is a ratio associated value associated with a ratio of a change amount of the voltage of the secondary battery to a change amount of the SOC or the capacity when the voltage of the secondary battery reaches a prescribed voltage, and the threshold value is a ratio threshold value, and
wherein the management unit is configured to detect the occurrence of the temporary degradation using the ratio which corresponds to the acquired ratio associated value or a magnitude relationship between an inverse number of the ratio and the ratio threshold value.

5. The management device for a secondary battery according to claim 1, wherein the management unit is configured to, when the management unit detects the occurrence of the temporary degradation, control the secondary battery by a degradation-time control method which differs from a reference control method used when the occurrence of the temporary degradation is not detected.

6. The management device for a secondary battery according to claim 1, wherein the management unit is configured to, when the management unit detects the occurrence of the temporary degradation, output an instruction to a charging device such that the secondary battery is charged at a charge rate which is lower than the charge rate of the secondary battery when the occurrence of the temporary degradation is not detected.

7. The management device for a secondary battery according to claim 1, wherein the management unit is configured, when the management unit detects the occurrence of the temporary degradation, to output an instruction to a charging device such that the charging device charges the secondary battery until an SOC of the secondary battery becomes an elimination SOC which is more than the prescribed SOC or a voltage of the secondary battery becomes an elimination voltage which is more than a prescribed voltage.

8. The management device for a secondary battery according to claim 7, wherein the elimination SOC is set to 91% or more.

9. The management device for a secondary battery according to claim 8, wherein the elimination SOC is set to 100%.

10. The management device for a secondary battery according to claim 8, wherein the management unit is configured to control the secondary battery based on a degradation degree which indicates a degree of the temporary degradation and expresses a state where the occurrence of the temporary degradation is detected as 100% and a state where the temporary degradation is eliminated as 0%, to acquire a maximum SOC which is a maximum value that the secondary battery reaches when the secondary battery is charged until the SOC of the secondary battery becomes an elimination SOC or more, and to set the degradation degree such that a larger the maximum SOC, a lower a value of the degradation degree becomes.

11. The management device for a secondary battery according to claim 10, wherein the management unit is configured to acquire a hold time during which the secondary battery is held at the maximum SOC, and to set the degradation degree such that a longer the hold time, the lower the value of the degradation degree becomes.

12. The management device for a secondary battery according to claim 1, wherein the management unit detects the occurrence of the temporary degradation of the secondary battery when the SOC associated value is acquired and the SOC which corresponds to the acquired SOC associated value is equal to or less than the preset prescribed SOC.

13. The management device for a secondary battery according to claim 1, wherein the management unit detects the occurrence of the temporary degradation of the secondary battery when the state value relating to the voltage of the secondary battery is acquired and the magnitude relationship between the acquired state value relating to the voltage of the secondary battery and the preset threshold value satisfies the predetermined condition.

14. The management device for a secondary battery according to claim 1, wherein the temporary degradation differs from a degradation with a lapse of time, a high rate degradation, and degradations, where an open circuit voltage (OCV) value when the degradation occurs is larger than an OCV value when the degradations, do not occur.

15. The management device for a secondary battery according to claim 1, wherein the state value relating to the voltage of the secondary battery is a discharge voltage associated value associated with a voltage value of the secondary battery when the secondary battery performs a constant current discharge, and the threshold value is a voltage threshold value.

16. The management device for a secondary battery according to claim 1, wherein the management unit is configured to detect the occurrence of the temporary degradation when the voltage value, which corresponds to the acquired discharge voltage associated value, is equal to or more than the threshold value.

17. The management device for a secondary battery according to claim 1, wherein the state value relating to the voltage of the secondary battery is a ratio associated value associated with a ratio of a change amount of the voltage of the secondary battery to a change amount of the SOC or the capacity when the voltage of the secondary battery reaches a prescribed voltage, and the threshold value is a ratio threshold value.

18. The management device for a secondary battery according to claim 1, wherein, when the management unit detects the occurrence of the temporary degradation, the management unit is configured to output an instruction to a charging device such that the secondary battery is charged at the charge rate which is different from the charge rate of the secondary battery when the occurrence of the temporary degradation is not detected.

19. The management device for a secondary battery according to claim 1, wherein, when the management unit detects the occurrence of the temporary degradation, the management unit is configured to output an instruction to a charging device such that the charging device charges the secondary battery until an SOC of the secondary battery becomes an elimination SOC which is more than the prescribed SOC.

20. A method for managing a secondary battery which includes an electrode including an active material with a characteristic where a potential flat portion exists in a relationship between a capacity and a potential, wherein the method comprises:

detecting an occurrence of temporary degradation of the secondary battery when a state of charge (SOC) associated value, which is associated with an SOC of the secondary battery, is acquired and the SOC which corresponds to the acquired SOC associated value is equal to or less than a preset threshold value to charge the secondary battery at a charge rate which is different from a charge rate when the occurrence of the temporary degradation is not detected, or when a state value relating to a voltage of the secondary battery is acquired and a magnitude relationship between the acquired state value relating to the voltage of the secondary battery and a preset threshold value satisfies a predetermined condition.

* * * * *